United States Patent
Uryu et al.

(10) Patent No.: US 10,879,260 B2
(45) Date of Patent: Dec. 29, 2020

(54) BONDED ASSEMBLY OF A SUPPORT DIE AND PLURAL MEMORY DIES CONTAINING LATERALLY SHIFTED VERTICAL INTERCONNECTIONS AND METHODS FOR MAKING THE SAME

(71) Applicant: SANDISK TECHNOLOGIES LLC, Addison, TX (US)

(72) Inventors: Tatsuya Uryu, Yokkaichi (JP); Satoshi Shimizu, Yokkaichi (JP); Nobuyuki Fujimura, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 17 days.

(21) Appl. No.: 16/288,656

(22) Filed: Feb. 28, 2019

(65) Prior Publication Data
US 2020/0279861 A1 Sep. 3, 2020

(51) Int. Cl.
*H01L 29/76* (2006.01)
*H01L 27/11582* (2017.01)
(Continued)

(52) U.S. Cl.
CPC ........ *H01L 27/11582* (2013.01); *G11C 5/063* (2013.01); *G11C 16/08* (2013.01);
(Continued)

(58) Field of Classification Search
CPC ......... H01L 27/11582; H01L 27/11524; H01L 27/11529; H01L 27/11556;
(Continued)

(56) References Cited

U.S. PATENT DOCUMENTS 3,933,550 A    1/1976   Erwin
3,933,567 A    1/1976   Erwin
(Continued)

FOREIGN PATENT DOCUMENTS

CN    1218960      6/1999
EP    1398831 A2   3/2004
(Continued)

OTHER PUBLICATIONS

Notification of Transmittal of the International Search Report and Written Opinion of the International Search Authority for International Patent Application No. PCT/US2019/064185, dated Mar. 16, 2020, 14 pages.
(Continued)

*Primary Examiner* — Calvin Y Choi
(74) *Attorney, Agent, or Firm* — The Marbury Law Group PLLC

(57) ABSTRACT

A bonded assembly includes a first memory die containing a first three-dimensional memory device, a second memory die containing a second three-dimensional memory device, and a support die bonded to the first memory die and comprising a peripheral circuitry configured to control the first three-dimensional memory device and the second three-dimensional memory device. The first memory die includes multiple rows of first-die proximal bonding pads, multiple rows of first-die distal bonding pads, and a plurality of first-die laterally-shifting electrically conductive paths connecting a respective one of the first-die proximal bonding pads and a respective one of the first-die distal bonding pads that is laterally offset from the respective one of the first-die proximal bonding pads. The first memory die and the second memory die can have an identical layout, and electrical connections can be shifted through the first memory die by the offset distance.

16 Claims, 44 Drawing Sheets

(51) Int. Cl.
  *H01L 25/065* (2006.01)
  *G11C 5/06* (2006.01)
  *G11C 16/08* (2006.01)
  *H01L 27/11524* (2017.01)
  *H01L 27/11556* (2017.01)
  *H01L 27/11558* (2017.01)
  *H01L 27/1157* (2017.01)
  *H01L 27/11573* (2017.01)
  *H01L 27/11529* (2017.01)

(52) U.S. Cl.
  CPC ...... *H01L 25/0657* (2013.01); *H01L 27/1157* (2013.01); *H01L 27/11524* (2013.01); *H01L 27/11529* (2013.01); *H01L 27/11556* (2013.01); *H01L 27/11558* (2013.01); *H01L 27/11573* (2013.01); *H01L 2225/06524* (2013.01); *H01L 2225/06541* (2013.01)

(58) Field of Classification Search
  CPC .......... H01L 27/11558; H01L 27/1157; H01L 27/11573; H01L 25/0657; H01L 2225/06524; H01L 2225/06541; H01L 27/11551–11556; G11C 5/063; G11C 16/08
  USPC ........................................................ 257/314
  See application file for complete search history.

(56) References Cited

U.S. PATENT DOCUMENTS

| | | |
|---|---|---|
| 3,950,211 A | 4/1976 | Erwin |
| 4,016,050 A | 4/1977 | Lesh et al. |
| 4,039,244 A | 8/1977 | Leachy |
| 4,109,297 A | 8/1978 | Lesh et al. |
| 4,338,995 A | 7/1982 | Shelley |
| 4,387,137 A | 6/1983 | Rice |
| 4,425,380 A | 1/1984 | Nuzzi et al. |
| 4,520,881 A | 6/1985 | Phaal |
| 4,630,172 A | 12/1986 | Stenerson et al. |
| 4,872,934 A | 10/1989 | Kameda |
| 4,884,976 A | 12/1989 | Franks, Jr. |
| 5,239,746 A | 8/1993 | Goldman |
| 5,256,902 A | 10/1993 | Culver |
| 5,371,407 A | 12/1994 | Goldman |
| 5,374,564 A | 12/1994 | Bruel |
| 5,387,530 A | 2/1995 | Doyle et al. |
| 5,497,545 A | 3/1996 | Watanabe et al. |
| 5,498,850 A | 3/1996 | Das |
| 5,555,519 A | 9/1996 | Takashima et al. |
| 5,561,322 A | 10/1996 | Wilson |
| 5,575,898 A | 11/1996 | Wolf et al. |
| 5,656,858 A | 8/1997 | Kondo et al. |
| 5,659,656 A | 8/1997 | Das |
| 5,661,089 A | 8/1997 | Wilson |
| 5,661,441 A | 8/1997 | Morino et al. |
| 5,729,051 A | 3/1998 | Nakamura |
| 5,737,052 A | 4/1998 | Kimura |
| 5,747,877 A | 5/1998 | Wilson |
| 5,767,575 A | 6/1998 | Lan et al. |
| 5,834,839 A | 11/1998 | Mertol |
| 5,843,806 A | 12/1998 | Tsai |
| 5,879,568 A | 3/1999 | Urasaki et al. |
| 5,915,167 A | 6/1999 | Leedy |
| 5,917,744 A | 6/1999 | Kirihata et al. |
| 5,966,315 A | 10/1999 | Muller et al. |
| 6,034,427 A | 3/2000 | Lan et al. |
| 6,084,895 A | 7/2000 | Kouchi et al. |
| 6,117,769 A | 9/2000 | Nogami et al. |
| 6,172,306 B1 | 1/2001 | Downey |
| 6,184,577 B1 | 2/2001 | Takemura et al. |
| 6,218,731 B1 | 4/2001 | Huang et al. |
| 6,225,139 B1 | 5/2001 | Tsung-Wen |
| 6,280,641 B1 | 8/2001 | Gaku et al. |
| 6,301,779 B1 | 10/2001 | Azar |
| 6,337,463 B1 | 1/2002 | Gaku et al. |
| 6,348,737 B1 | 2/2002 | Advocate, Jr. et al. |
| 6,362,436 B1 | 3/2002 | Kimbara et al. |
| 6,426,555 B1 | 7/2002 | Hsia et al. |
| 6,442,894 B2 | 9/2002 | Weder |
| 6,479,760 B2 | 11/2002 | Kimbara et al. |
| 6,537,842 B2 | 3/2003 | Akram |
| 6,551,433 B2 | 4/2003 | Kuwako et al. |
| 6,566,752 B2 | 5/2003 | Hsia et al. |
| 6,574,918 B2 | 6/2003 | Weder |
| 6,579,332 B1 | 6/2003 | Takemura et al. |
| 6,581,816 B2 | 6/2003 | Vitali et al. |
| 6,593,645 B2 | 7/2003 | Shih et al. |
| 6,620,522 B2 | 9/2003 | Kusachi et al. |
| 6,693,031 B2 | 2/2004 | Advocate, Jr. et al. |
| 6,693,356 B2 | 2/2004 | Jiang et al. |
| 6,740,352 B2 | 5/2004 | Lee et al. |
| 6,750,422 B2 | 6/2004 | Gaku et al. |
| 6,753,830 B2 | 6/2004 | Gelbman |
| 6,829,154 B1 | 12/2004 | Kang |
| 6,881,994 B2 | 4/2005 | Lee et al. |
| 6,888,750 B2 | 5/2005 | Walker et al. |
| 6,903,027 B2 | 6/2005 | Matsuura |
| 6,929,169 B2 | 8/2005 | Kubokawa et al. |
| 6,951,812 B2 | 10/2005 | Jiang et al. |
| 6,958,548 B2 | 10/2005 | Pozder et al. |
| 7,005,350 B2 | 2/2006 | Walker et al. |
| 7,023,739 B2 | 4/2006 | Chen et al. |
| 7,067,420 B2 | 6/2006 | Choi et al. |
| 7,078,811 B2 | 7/2006 | Suga |
| 7,084,512 B2 | 8/2006 | Higashida et al. |
| 7,144,472 B2 | 12/2006 | Sato et al. |
| 7,177,191 B2 | 2/2007 | Fasoli et al. |
| 7,198,386 B2 | 4/2007 | Zampini et al. |
| 7,208,349 B2 | 4/2007 | Lee et al. |
| 7,217,631 B2 | 5/2007 | Suga |
| 7,221,588 B2 | 5/2007 | Fasoli et al. |
| 7,230,329 B2 | 6/2007 | Sawamoto et al. |
| 7,233,522 B2 | 6/2007 | Chen et al. |
| 7,256,495 B2 | 8/2007 | Lee et al. |
| 7,257,891 B2 | 8/2007 | Lee et al. |
| 7,304,249 B2 | 12/2007 | Lee et al. |
| 7,312,101 B2 | 12/2007 | Jiang et al. |
| 7,329,949 B2 | 2/2008 | Jiang et al. |
| 7,368,328 B2 | 5/2008 | Abbott et al. |
| 7,387,913 B2 | 6/2008 | Yoshimura et al. |
| 7,498,710 B2 | 3/2009 | Rao |
| 7,514,321 B2 | 4/2009 | Mokhlesi et al. |
| 7,550,847 B2 | 6/2009 | Jiang et al. |
| 7,557,439 B1 | 7/2009 | Sasaki et al. |
| 7,575,973 B2 | 8/2009 | Mokhlesi et al. |
| 7,585,419 B2 | 9/2009 | Cheng |
| 7,602,028 B2 | 10/2009 | Son et al. |
| 7,696,559 B2 | 4/2010 | Arai et al. |
| 7,733,659 B2 | 6/2010 | Snider et al. |
| 7,736,457 B2 | 6/2010 | Iwata |
| 7,745,265 B2 | 6/2010 | Mokhlesi et al. |
| 7,746,680 B2 | 6/2010 | Scheuerlein et al. |
| 7,772,657 B2 | 8/2010 | Yaganov |
| 7,808,038 B2 | 10/2010 | Mokhlesi et al. |
| 7,823,470 B2 | 11/2010 | Shigeno et al. |
| 7,848,145 B2 | 12/2010 | Mokhlesi et al. |
| 7,851,851 B2 | 12/2010 | Mokhlesi et al. |
| 7,927,499 B2 | 4/2011 | Wang |
| 8,008,710 B2 | 8/2011 | Fukuzumi |
| 8,053,829 B2 | 11/2011 | Kang et al. |
| 8,097,498 B2 | 1/2012 | Purayath et al. |
| 8,107,270 B2 | 1/2012 | Scheuerlein et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,242,593 B2 | 8/2012 | Kacker et al. |
| 8,247,260 B2 | 8/2012 | Sivaram et al. |
| 8,247,895 B2 | 8/2012 | Haensch et al. |
| 8,258,055 B2 | 9/2012 | Hwang et al. |
| 8,274,792 B2 | 9/2012 | Soffer |
| 8,349,716 B2 | 3/2013 | Alsmeier et al. |
| 8,394,716 B2 | 3/2013 | Hwang et al. |

(56) References Cited

U.S. PATENT DOCUMENTS

| | | |
|---|---|---|
| 8,445,347 B2 | 5/2013 | Alsmeier |
| 8,450,181 B2 | 5/2013 | Chen et al. |
| 8,461,641 B2 | 6/2013 | Alsmeier et al. |
| 8,482,137 B2 | 7/2013 | Yoshioka et al. |
| 8,614,126 B1 | 12/2013 | Lee et al. |
| 8,658,499 B2 | 2/2014 | Makala et al. |
| 8,741,761 B2 | 6/2014 | Lee et al. |
| 8,760,957 B2 | 6/2014 | Lee et al. |
| 8,847,302 B2 | 9/2014 | Alsmeier et al. |
| 8,878,278 B2 | 11/2014 | Alsmeier et al. |
| 8,884,357 B2 | 11/2014 | Wang et al. |
| 8,946,023 B2 | 2/2015 | Makala et al. |
| 8,987,089 B1 | 3/2015 | Pachamuthu et al. |
| 8,993,061 B2 | 3/2015 | Jones et al. |
| 9,005,710 B2 | 4/2015 | Jones et al. |
| 9,023,719 B2 | 5/2015 | Pachamuthu et al. |
| 9,142,261 B2 | 9/2015 | D'Abreu et al. |
| 9,144,157 B2 | 9/2015 | Iida |
| 9,167,228 B2 | 10/2015 | Monari et al. |
| 9,224,747 B2 | 12/2015 | Mizutani et al. |
| 9,230,973 B2 | 1/2016 | Pachamuthu et al. |
| 9,230,987 B2 | 1/2016 | Pachamuthu et al. |
| 9,236,392 B1 | 1/2016 | Izumi et al. |
| 9,257,414 B2 | 2/2016 | Chen et al. |
| 9,305,934 B1 | 4/2016 | Ding et al. |
| 9,412,749 B1 | 8/2016 | Shimabukuro et al. |
| 9,419,058 B1 | 8/2016 | Takaki et al. |
| 9,449,982 B2 | 9/2016 | Lu et al. |
| 9,449,983 B2 | 9/2016 | Yada et al. |
| 9,449,987 B1 | 9/2016 | Miyata et al. |
| 9,455,263 B2 | 9/2016 | Zhang et al. |
| 9,460,931 B2 | 10/2016 | Pachamuthu et al. |
| 9,478,487 B2 | 10/2016 | Yang et al. |
| 9,484,314 B2 | 11/2016 | Shimoda et al. |
| 9,502,471 B1 | 11/2016 | Lu et al. |
| 9,530,790 B1 | 12/2016 | Lu et al. |
| 9,543,318 B1 | 1/2017 | Lu et al. |
| 9,559,117 B2 | 1/2017 | Pachamuthu et al. |
| 9,576,850 B2 | 2/2017 | Ishizaka et al. |
| 9,589,981 B2 | 3/2017 | Nishikawa et al. |
| 9,620,512 B1 | 4/2017 | Nishikawa et al. |
| 9,627,403 B2 | 4/2017 | Liu et al. |
| 9,633,742 B2 | 4/2017 | Desai et al. |
| 9,646,981 B2 | 5/2017 | Nishikawa et al. |
| RE46,435 E | 6/2017 | Scheuerlein et al. |
| 9,681,069 B2 | 6/2017 | El-Ghoroury et al. |
| 9,689,863 B2 | 6/2017 | Yu et al. |
| 9,721,855 B2 | 8/2017 | Kuczynski et al. |
| 9,721,868 B2 | 8/2017 | Lin et al. |
| 9,728,032 B2 | 8/2017 | Kelly et al. |
| 9,748,174 B1 | 8/2017 | Amano |
| 9,754,963 B1 | 9/2017 | Kawamura et al. |
| 9,780,143 B2 | 10/2017 | Bandic et al. |
| 9,786,681 B1 | 10/2017 | Ariyoshi |
| 9,787,914 B2 | 10/2017 | Sengupta et al. |
| 9,799,670 B2 | 10/2017 | Nishikawa et al. |
| 9,823,209 B2 | 11/2017 | Yu et al. |
| 9,831,266 B2 | 11/2017 | Kai et al. |
| 9,844,142 B2 | 12/2017 | Cho et al. |
| 9,847,255 B2 | 12/2017 | Lin et al. |
| 9,853,038 B1 | 12/2017 | Cui |
| 9,853,043 B2 | 12/2017 | Lu et al. |
| 9,876,031 B1 | 1/2018 | Shimizu et al. |
| 9,914,274 B2 | 3/2018 | Jones et al. |
| 9,917,100 B2 | 3/2018 | Zhang et al. |
| 9,935,050 B2 | 4/2018 | Dunga et al. |
| 9,985,098 B2 | 5/2018 | Matsumoto et al. |
| 10,008,570 B2 | 6/2018 | Yu et al. |
| 10,011,098 B2 | 7/2018 | Yu et al. |
| 10,020,363 B2 | 7/2018 | Ogawa et al. |
| 10,115,681 B1 | 10/2018 | Ariyoshi |
| 10,161,927 B2 | 12/2018 | Yu et al. |
| 10,199,434 B1 | 2/2019 | Lee et al. |
| 2001/0006257 A1 | 7/2001 | Shih et al. |
| 2001/0020935 A1 | 9/2001 | Gelbman |
| 2001/0039757 A1 | 11/2001 | Weder |
| 2001/0042781 A1 | 11/2001 | Vitali et al. |
| 2001/0045060 A1 | 11/2001 | Weder |
| 2001/0055838 A1 | 12/2001 | Walker et al. |
| 2002/0003307 A1 | 1/2002 | Suga |
| 2002/0005249 A1 | 1/2002 | Kuwako et al. |
| 2002/0006696 A1 | 1/2002 | Akram |
| 2002/0011026 A1 | 1/2002 | Weder |
| 2002/0035890 A1 | 3/2002 | Kusachi et al. |
| 2002/0039644 A1 | 4/2002 | Kimbara et al. |
| 2002/0056890 A1 | 5/2002 | Advocate, Jr. et al. |
| 2002/0090833 A1 | 7/2002 | Matsuura et al. |
| 2002/0113044 A1 | 8/2002 | Gaku et al. |
| 2002/0149115 A1 | 10/2002 | Hsia et al. |
| 2002/0182891 A1 | 12/2002 | Matsuura |
| 2003/0027437 A1 | 2/2003 | Worz |
| 2003/0058118 A1 | 3/2003 | Wilson |
| 2003/0068859 A1 | 4/2003 | Leung et al. |
| 2003/0081389 A1 | 5/2003 | Nair et al. |
| 2003/0094697 A1 | 5/2003 | Higashida et al. |
| 2003/0107092 A1 | 6/2003 | Chevallier |
| 2003/0134450 A1 | 7/2003 | Lee |
| 2003/0178715 A1 | 9/2003 | Sturcken et al. |
| 2003/0186543 A1 | 10/2003 | Jiang et al. |
| 2003/0219979 A1 | 11/2003 | Choi et al. |
| 2003/0232472 A1 | 12/2003 | Wu |
| 2004/0062858 A1 | 4/2004 | Sato et al. |
| 2004/0065718 A1 | 4/2004 | Kubokawa et al. |
| 2004/0084771 A1 | 5/2004 | Bolken et al. |
| 2004/0132282 A1 | 7/2004 | Jiang et al. |
| 2004/0182819 A1 | 9/2004 | Gaku et al. |
| 2004/0200726 A1 | 10/2004 | Lee et al. |
| 2004/0214373 A1 | 10/2004 | Jiang et al. |
| 2004/0217093 A1 | 11/2004 | Arai et al. |
| 2004/0219713 A1 | 11/2004 | Lee |
| 2004/0222534 A1 | 11/2004 | Sawamoto et al. |
| 2004/0247236 A1 | 12/2004 | Yoshimura et al. |
| 2005/0078436 A1 | 4/2005 | Sturcken et al. |
| 2005/0082526 A1 | 4/2005 | Bedell et al. |
| 2005/0083698 A1 | 4/2005 | Zampini et al. |
| 2005/0104193 A1 | 5/2005 | Pozder et al. |
| 2005/0127143 A1 | 6/2005 | Kubokawa et al. |
| 2005/0170626 A1 | 8/2005 | Suga |
| 2005/0280112 A1 | 12/2005 | Abbott |
| 2006/0003531 A1 | 1/2006 | Chang et al. |
| 2006/0030150 A1 | 2/2006 | Jiang et al. |
| 2006/0076323 A1 | 4/2006 | Arai et al. |
| 2006/0097363 A1 | 5/2006 | Abbott et al. |
| 2006/0113653 A1 | 6/2006 | Xiaoqi et al. |
| 2006/0131262 A1 | 6/2006 | Pan et al. |
| 2006/0145350 A1 | 7/2006 | Gross |
| 2006/0186514 A1 | 8/2006 | Shim et al. |
| 2006/0220245 A1 | 10/2006 | Ho et al. |
| 2006/0258076 A1 | 11/2006 | Mizushima et al. |
| 2006/0286485 A1 | 12/2006 | Cheng |
| 2007/0007641 A1 | 1/2007 | Lee et al. |
| 2007/0040261 A1 | 2/2007 | Hetzel et al. |
| 2007/0045828 A1 | 3/2007 | Kwon et al. |
| 2007/0062682 A1 | 3/2007 | Sagi et al. |
| 2007/0069390 A1 | 3/2007 | Chen et al. |
| 2007/0090524 A1 | 4/2007 | Abbott |
| 2007/0117317 A1 | 5/2007 | Ikeda et al. |
| 2007/0132085 A1 | 6/2007 | Shibata et al. |
| 2007/0176275 A1 | 8/2007 | Singleton et al. |
| 2007/0193679 A1 | 8/2007 | Iwata |
| 2007/0194455 A1 | 8/2007 | Ikeda et al. |
| 2007/0210338 A1 | 9/2007 | Orlowski |
| 2007/0214875 A1 | 9/2007 | Shigeno et al. |
| 2007/0228846 A1 | 10/2007 | Rao |
| 2007/0245836 A1 | 10/2007 | Vaganov |
| 2007/0252201 A1 | 11/2007 | Kito et al. |
| 2007/0267723 A1 | 11/2007 | Bernstein et al. |
| 2007/0269932 A1 | 11/2007 | Abbott et al. |
| 2007/0281439 A1 | 12/2007 | Bedell et al. |
| 2008/0041822 A1 | 2/2008 | Wang |
| 2008/0049949 A1 | 2/2008 | Snider et al. |
| 2008/0067583 A1 | 3/2008 | Kidoh et al. |
| 2008/0074852 A1 | 3/2008 | Lee |
| 2008/0087932 A1 | 4/2008 | Son et al. |

(56) References Cited

U.S. PATENT DOCUMENTS

| | | |
|---|---|---|
| 2008/0099917 A1 | 5/2008 | Jiang et al. |
| 2008/0132006 A1 | 6/2008 | Jiang et al. |
| 2008/0150155 A1 | 6/2008 | Periaman et al. |
| 2008/0165565 A1 | 7/2008 | Gunter et al. |
| 2008/0169496 A1 | 7/2008 | Keller et al. |
| 2008/0216685 A1 | 9/2008 | Omoto |
| 2008/0253085 A1 | 10/2008 | Soffer |
| 2008/0280416 A1 | 11/2008 | Bedell et al. |
| 2008/0315421 A1 | 12/2008 | Periaman et al. |
| 2009/0039492 A1 | 2/2009 | Kang et al. |
| 2009/0108469 A1 | 4/2009 | Kang et al. |
| 2009/0189290 A1 | 7/2009 | Kacker et al. |
| 2009/0206431 A1 | 8/2009 | Bolken et al. |
| 2009/0230449 A1 | 9/2009 | Sakaguchi et al. |
| 2009/0236753 A1 | 9/2009 | Moon et al. |
| 2009/0242967 A1 | 10/2009 | Katsumata et al. |
| 2009/0303690 A1 | 12/2009 | Lee et al. |
| 2010/0001933 A1 | 1/2010 | Coker et al. |
| 2010/0009488 A1 | 1/2010 | Sivaram et al. |
| 2010/0044778 A1 | 2/2010 | Seol |
| 2010/0059811 A1 | 3/2010 | Sekine et al. |
| 2010/0109133 A1 | 5/2010 | Ito et al. |
| 2010/0112769 A1 | 5/2010 | Son et al. |
| 2010/0117143 A1 | 5/2010 | Lee et al. |
| 2010/0120214 A1 | 5/2010 | Park et al. |
| 2010/0127361 A1 | 5/2010 | Kuan et al. |
| 2010/0155810 A1 | 6/2010 | Kim et al. |
| 2010/0155818 A1 | 6/2010 | Cho |
| 2010/0167467 A1 | 7/2010 | Aoi |
| 2010/0171162 A1 | 7/2010 | Katsumata et al. |
| 2010/0173453 A1* | 7/2010 | Leedy ............ H01L 23/5226 438/109 |
| 2010/0181610 A1 | 7/2010 | Kim et al. |
| 2010/0207195 A1 | 8/2010 | Fukuzumi et al. |
| 2010/0213458 A1 | 8/2010 | Prall |
| 2010/0240174 A1 | 9/2010 | Yu et al. |
| 2010/0283145 A1 | 11/2010 | Chang et al. |
| 2010/0289133 A1 | 11/2010 | Chao et al. |
| 2010/0320528 A1 | 12/2010 | Jeong et al. |
| 2010/0327419 A1 | 12/2010 | Muthukumar et al. |
| 2011/0024910 A1 | 2/2011 | Mostafazadeh et al. |
| 2011/0037161 A1 | 2/2011 | Andry et al. |
| 2011/0049687 A1 | 3/2011 | Kuan et al. |
| 2011/0065270 A1 | 3/2011 | Shim |
| 2011/0076819 A1 | 3/2011 | Kim et al. |
| 2011/0133606 A1 | 6/2011 | Yoshida et al. |
| 2011/0151667 A1 | 6/2011 | Hwang et al. |
| 2011/0169067 A1 | 7/2011 | Ernst et al. |
| 2011/0170266 A1 | 7/2011 | Haensch et al. |
| 2011/0180916 A1 | 7/2011 | Han |
| 2011/0260781 A1 | 10/2011 | Takeuchi et al. |
| 2011/0266606 A1 | 11/2011 | Park et al. |
| 2011/0271523 A1 | 11/2011 | Mantz |
| 2011/0281138 A1 | 11/2011 | Yoshioka et al. |
| 2011/0287612 A1 | 11/2011 | Lee et al. |
| 2011/0298126 A1 | 12/2011 | Tsai et al. |
| 2011/0312174 A1 | 12/2011 | Lee et al. |
| 2011/0316072 A1 | 12/2011 | Lee |
| 2011/0316159 A1 | 12/2011 | Kang et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0003800 A1 | 1/2012 | Lee et al. |
| 2012/0007230 A1 | 1/2012 | Hwang et al. |
| 2012/0012920 A1 | 1/2012 | Shin et al. |
| 2012/0032250 A1 | 2/2012 | Son et al. |
| 2012/0052674 A1 | 3/2012 | Lee et al. |
| 2012/0068242 A1 | 3/2012 | Shin et al. |
| 2012/0074367 A1 | 3/2012 | Costa et al. |
| 2012/0119287 A1 | 5/2012 | Park et al. |
| 2012/0133381 A1 | 5/2012 | Bruland et al. |
| 2012/0140562 A1 | 6/2012 | Choe et al. |
| 2012/0153376 A1 | 6/2012 | Alsmeier et al. |
| 2012/0153468 A1 | 6/2012 | Lee |
| 2012/0168220 A1 | 7/2012 | Lee et al. |
| 2012/0168858 A1 | 7/2012 | Hong |
| 2012/0193790 A1 | 8/2012 | Andry et al. |
| 2012/0204073 A1 | 8/2012 | Whetsel |
| 2012/0208347 A1 | 8/2012 | Hwang et al. |
| 2012/0228767 A1 | 9/2012 | Lee et al. |
| 2012/0256247 A1 | 10/2012 | Alsmeier et al. |
| 2012/0261638 A1 | 10/2012 | Sills et al. |
| 2012/0276719 A1 | 11/2012 | Han et al. |
| 2013/0015578 A1 | 1/2013 | Thacker et al. |
| 2013/0056816 A1 | 3/2013 | Iwase et al. |
| 2013/0075895 A1 | 3/2013 | Miura et al. |
| 2013/0118782 A1 | 5/2013 | Cho et al. |
| 2013/0122659 A1 | 5/2013 | Wu et al. |
| 2013/0127054 A1 | 5/2013 | Muthukumar et al. |
| 2013/0147041 A1 | 6/2013 | Chan et al. |
| 2013/0154074 A1 | 6/2013 | Oh |
| 2013/0161702 A1 | 6/2013 | Chen |
| 2013/0168674 A1 | 7/2013 | Franzon et al. |
| 2013/0170171 A1 | 7/2013 | Wicker et al. |
| 2013/0176401 A1 | 7/2013 | Monari et al. |
| 2013/0183660 A1 | 7/2013 | Yu et al. |
| 2013/0213701 A1 | 8/2013 | Iida |
| 2013/0234320 A1 | 9/2013 | Lu et al. |
| 2013/0236882 A1 | 9/2013 | Yu et al. |
| 2013/0248974 A1 | 9/2013 | Alsmeier et al. |
| 2013/0257481 A1 | 10/2013 | Metsis |
| 2013/0258772 A1 | 10/2013 | Lee et al. |
| 2013/0264631 A1 | 10/2013 | Alsmeier et al. |
| 2013/0294184 A1 | 11/2013 | Yang et al. |
| 2013/0313627 A1 | 11/2013 | Lee et al. |
| 2013/0313717 A1 | 11/2013 | Holmes et al. |
| 2013/0316329 A1 | 11/2013 | Yu et al. |
| 2013/0321581 A1 | 12/2013 | El-Ghoroury et al. |
| 2013/0322174 A1 | 12/2013 | Li et al. |
| 2013/0323885 A1 | 12/2013 | Chun |
| 2014/0013174 A1 | 1/2014 | Whetsel |
| 2014/0017852 A1 | 1/2014 | Kwon et al. |
| 2014/0020191 A1 | 1/2014 | Jones et al. |
| 2014/0020192 A1 | 1/2014 | Jones et al. |
| 2014/0061748 A1 | 3/2014 | Lee |
| 2014/0061849 A1 | 3/2014 | Tanzawa |
| 2014/0063990 A1 | 3/2014 | Ku et al. |
| 2014/0073884 A1 | 3/2014 | Yu et al. |
| 2014/0092576 A1 | 4/2014 | Lucero et al. |
| 2014/0124475 A1 | 5/2014 | Lee |
| 2014/0181427 A1 | 6/2014 | Jayasena et al. |
| 2014/0181483 A1 | 6/2014 | O'Connor et al. |
| 2014/0199815 A1 | 7/2014 | Hwang et al. |
| 2014/0218996 A1 | 8/2014 | D'Abreu et al. |
| 2014/0252657 A1* | 9/2014 | Liu ................ H01L 24/81 257/782 |
| 2014/0264533 A1 | 9/2014 | Simsek-Ege et al. |
| 2014/0264542 A1 | 9/2014 | Simsek-Ege et al. |
| 2014/0264545 A1 | 9/2014 | Takahashi et al. |
| 2014/0273354 A1 | 9/2014 | Ramaswami et al. |
| 2014/0273373 A1 | 9/2014 | Makala et al. |
| 2014/0332956 A1 | 11/2014 | Zheng et al. |
| 2014/0335656 A1 | 11/2014 | Oh |
| 2014/0377947 A1 | 12/2014 | Ishizaka et al. |
| 2015/0003158 A1 | 1/2015 | Aritome |
| 2015/0046612 A1 | 2/2015 | Gupta |
| 2015/0078080 A1 | 3/2015 | Lee |
| 2015/0091131 A1 | 4/2015 | Lamorey et al. |
| 2015/0108204 A1 | 4/2015 | Zheng et al. |
| 2015/0061099 A1 | 5/2015 | Mu et al. |
| 2015/0130046 A1 | 5/2015 | Lin et al. |
| 2015/0153411 A1 | 6/2015 | Whetsel |
| 2015/0155256 A1 | 6/2015 | Lin et al. |
| 2015/0179617 A1 | 6/2015 | Lin et al. |
| 2015/0193299 A1 | 7/2015 | Hyun et al. |
| 2015/0221614 A1 | 8/2015 | Sutardja |
| 2015/0236038 A1 | 8/2015 | Pachamuthu et al. |
| 2015/0243630 A1 | 8/2015 | Jann et al. |
| 2015/0246496 A1 | 9/2015 | Jones et al. |
| 2015/0264813 A1 | 9/2015 | Zhou et al. |
| 2015/0279828 A1 | 10/2015 | Koopmans et al. |
| 2015/0294955 A1 | 10/2015 | Chen et al. |
| 2015/0360935 A1 | 12/2015 | Gabmaier |
| 2015/0369798 A1 | 12/2015 | Yu et al. |

(56) References Cited

U.S. PATENT DOCUMENTS

| | | | |
|---|---|---|---|
| 2015/0372000 A1 | 12/2015 | Jee et al. | |
| 2015/0372217 A1 | 12/2015 | Schoelkopf, III et al. | |
| 2016/0005686 A1 | 1/2016 | Yu et al. | |
| 2016/0012903 A1 | 1/2016 | Desai et al. | |
| 2016/0043026 A1 | 2/2016 | Yang et al. | |
| 2016/0049421 A1 | 2/2016 | Zhang et al. | |
| 2016/0055922 A1 | 2/2016 | Yang et al. | |
| 2016/0064320 A1 | 3/2016 | Li et al. | |
| 2016/0099228 A1* | 4/2016 | Franca-Neto | H01L 24/29 257/737 |
| 2016/0136877 A1 | 5/2016 | Rogers et al. | |
| 2016/0141270 A1 | 5/2016 | Koopmans et al. | |
| 2016/0172324 A1 | 6/2016 | Kuczynski et al. | |
| 2016/0191823 A1 | 6/2016 | El-Ghoroury et al. | |
| 2016/0197063 A1 | 7/2016 | Lin et al. | |
| 2016/0320142 A1 | 11/2016 | Ho et al. | |
| 2016/0341794 A1 | 11/2016 | Whetsel | |
| 2017/0023748 A1 | 1/2017 | Lucero et al. | |
| 2017/0062519 A1 | 3/2017 | Bandic et al. | |
| 2017/0070685 A1 | 3/2017 | Sengupta et al. | |
| 2017/0098639 A1 | 4/2017 | Jann et al. | |
| 2017/0154878 A1 | 6/2017 | Kim et al. | |
| 2017/0186731 A1 | 6/2017 | Koike | |
| 2017/0200671 A1 | 7/2017 | Tsai et al. | |
| 2017/0236746 A1 | 8/2017 | Yu et al. | |
| 2017/0236835 A1 | 8/2017 | Nakamura et al. | |
| 2017/0236896 A1 | 8/2017 | Lu et al. | |
| 2017/0243858 A1 | 8/2017 | Chou et al. | |
| 2017/0287926 A1 | 10/2017 | Ariyoshi | |
| 2017/0294377 A1 | 10/2017 | Dunga et al. | |
| 2017/0309339 A1* | 10/2017 | Hsiung | G11C 16/10 |
| 2017/0315172 A1 | 11/2017 | Whetsel | |
| 2017/0316713 A1 | 11/2017 | Hyman | |
| 2017/0373079 A1 | 12/2017 | Sharangpani et al. | |
| 2017/0373197 A1 | 12/2017 | Sharangpani et al. | |
| 2018/0005709 A1 | 1/2018 | Yang et al. | |
| 2018/0040593 A1 | 2/2018 | Zhou et al. | |
| 2018/0122904 A1 | 5/2018 | Matsumoto et al. | |
| 2018/0122905 A1 | 5/2018 | Ogawa et al. | |
| 2018/0122906 A1 | 5/2018 | Yu et al. | |
| 2018/0151497 A1 | 5/2018 | Makala et al. | |
| 2018/0158873 A1 | 6/2018 | Sano et al. | |
| 2018/0259501 A1 | 9/2018 | Yu | |
| 2018/0277497 A1 | 9/2018 | Matsuo | |
| 2018/0331118 A1 | 11/2018 | Amano | |
| 2018/0342455 A1 | 11/2018 | Nosho et al. | |
| 2018/0366486 A1 | 12/2018 | Hada et al. | |
| 2018/0374866 A1 | 12/2018 | Makala et al. | |
| 2019/0006381 A1 | 1/2019 | Nakatsuji et al. | |
| 2019/0043836 A1 | 2/2019 | Fastow et al. | |

FOREIGN PATENT DOCUMENTS

| | | |
|---|---|---|
| JP | 2016-004860 A | 1/2016 |
| JP | 2016-157832 A | 9/2016 |
| JP | 2017-130660 A | 7/2017 |
| WO | WO2002/015277 A2 | 2/2002 |
| WO | WO2008/118433 A1 | 10/2008 |
| WO | WO2009/085078 A1 | 7/2009 |
| WO | WO2012/003301 A2 | 1/2012 |
| WO | WO2015/012664 A1 | 8/2015 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Kimura, "3D Cells Make Terabit NAND Flash Possible," Nikkei Electronics Asia, Sep. 17, 2009, 6pgs.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Li, W. et al., "Sacrificial Polymers for Nanofluidic Channels in Biological Applications", Nanotechnology 14 (2003) 578-583.
International Search Report & Written Opinion, PCT/US2011/042566, dated Jan. 17, 2012.
Invitation to Pay Additional Fees & Partial International Search Report, PCT/US2011/042566, dated Sep. 28, 2011.
International Search Report, PCT/US2013/035567, dated Sep. 30, 2013, 6pgs.
International Search Report, PCT/US2016/036656, dated Nov. 10, 2016, 17pgs.
Invitation to Pay Additional Fees and Partial Search Report, PCT/US2016/036656, dated Sep. 16, 2016, 7pgs.
Notice of Allowance, U.S. Appl. No. 14/995,017, dated May 20, 2016, 14pgs.
Invitation to Pay Additional Fees, PCT/US2013/024638, dated Apr. 24, 2013.
International Search Report and Written Opinion, PCT/US2014/020290, dated Jun. 25, 2014, 10pgs.
International Search Report and Written Opinion, PCT/US2014/023276, dated Jun. 30, 2014, 13pgs.
Invitation to Pay Additional Fees and Partial Search Report, PCT/US2015/015155, dated May 25, 2015, 8pgs.
Ohmi, T. et al., "Science-based New Silicon Technologies Exhibiting Super High Performance due to Radical-reaction-based Semiconductor Manufacturing", Journal of the Korean Physical Society, vol. 59, No. 2, Aug. 2011, pp. 391-401.
Chang, L. et al., "CMOS Circuit Performance Enhancement by Surface Orientation Optimization", IEEE Transactions on Electron Devices, vol. 51, No. 10, Oct. 2004. (Abstract Only).
Yang, M. et al., "Performance Dependence of CMOS on Silicon Substrate Orientation for Ultrathin Oxynitride and HfO2 Gate Dielectrics", IEEE Electron Device Letters, vol. 24, No. 5, May 2003.
Hopcroft, M. A. et al., "What is the Young's Modulus of Silicon?", IEEE Journal of Microelectromechanical Systems, vol. 19, Issue 2, pp. 229-238, 2010.
Saito, S. et al., "Origin of Drivability Enhancement in Scaled pMOSFETs with 45° Rotated <100> channels", 2006 Symposium on VLSI Technology. Jun. 2006. (Abstract Only) Available at https://ieeexplore.ieee.org/document/1705261, visited Jan. 7, 2019.
Ariyoshi, J. et al., "Compact Three-Dimensional Memory Device Having a Seal Ring and Methods of Manufacturing the Same," U.S. Appl. No. 15/928,337, filed Mar. 22, 2018.
Mushiga, M. et al., "Three-Dimensional Memory Device Containing Bonded Chip Assembly With Through-Substrate via Structures and Method of Making the Same," U.S. Appl. No. 15/928,407, filed Mar. 22, 2018.
USPTO Non-Final Office Action for U.S. Appl. No. 15/928,407, dated Dec. 17, 2018, 14 pages.
U.S. Appl. No. 15/873,101, filed Jan. 17, 2018, SanDisk Technologies LLC.
U.S. Appl. No. 15/892,648, filed Feb. 9, 2018, SanDisk Technologies LLC.

(56) References Cited

OTHER PUBLICATIONS

U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/950,505, filed Apr. 11, 2018, SanDisk Technologies LLC.
U.S. Appl. No. 15/950,616, filed Apr. 11, 2018, SanDisk Technologies LLC.
U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/213,180, filed Dec. 7, 2018, SanDisk Technologies LLC.
U.S. Appl. No. 16/213,382, filed Dec. 7, 2018, SanDisk Technologies LLC.
U.S. Appl. No. 16/231,752, filed Dec. 24, 2018, SanDisk Technologies LLC.
U.S. Appl. No. 16/241,171, filed Jan. 7, 2019, SanDisk Technologies LLC.
U.S. Appl. No. 16/241,221, filed Jan. 7, 2019, SanDisk Technologies LLC.
U.S. Appl. No. 16/242,216, filed Jan. 8, 2019, SanDisk Technologies LLC.
U.S. Appl. No. 16/243,469, filed Jan. 9, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/251,782, filed Jan. 18, 2019, SanDisk Technologies LLC.
U.S. Appl. No. 16/251,954, filed Jan. 18, 2019, SanDisk Technologies LLC.
U.S. Appl. No. 16/255,413, filed Jan. 23, 2019, SanDisk Technologies LLC.
U.S. Appl. No. 16/261,869, filed Jan. 30, 2019, SanDisk Technologies LLC.
U.S. Appl. No. 16/263,058, filed Jan. 31, 2019, SanDisk Technologies LLC.
U.S. Appl. No. 16/263,086, filed Jan. 31, 2019, SanDisk Technologies LLC.

* cited by examiner

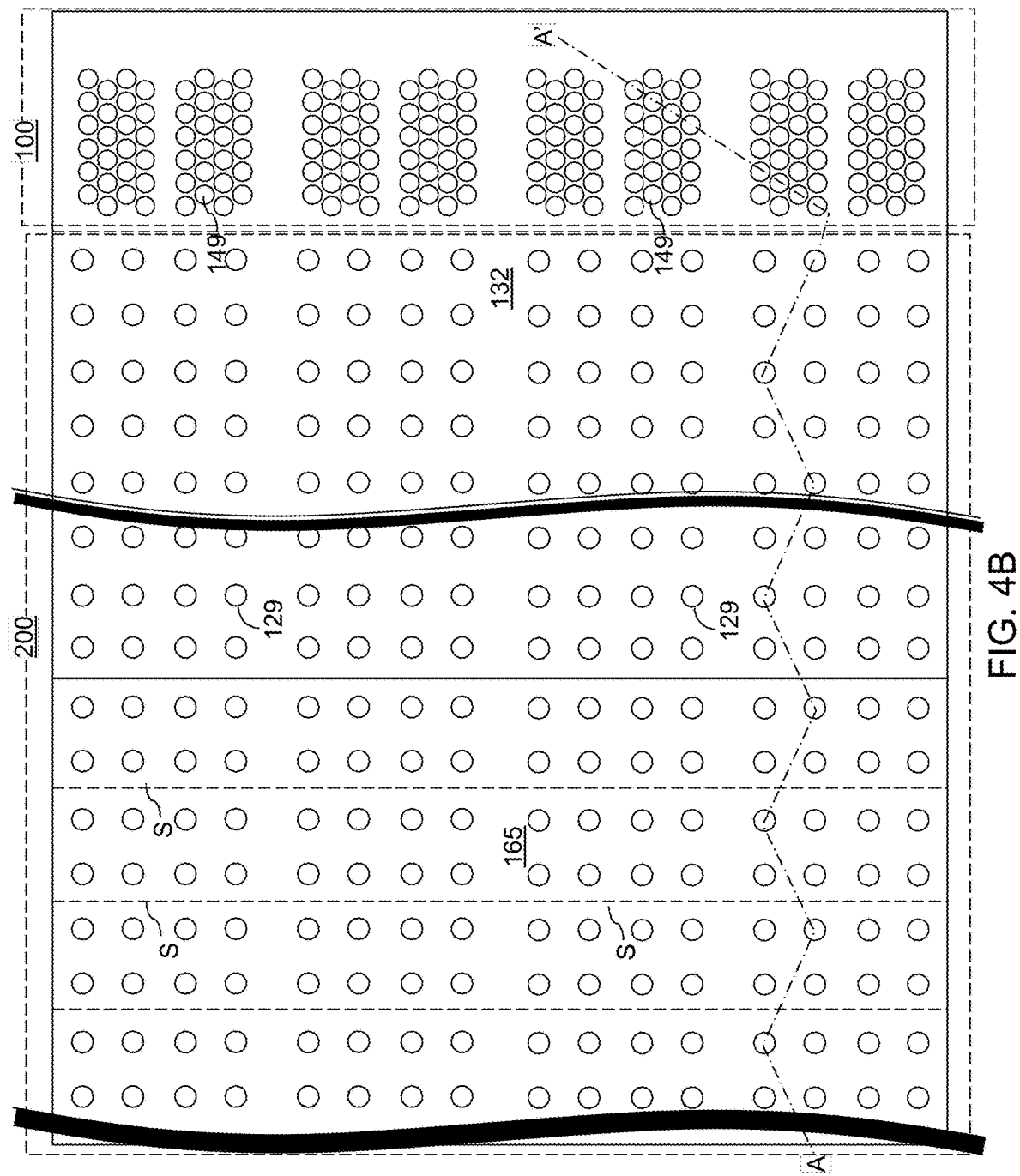

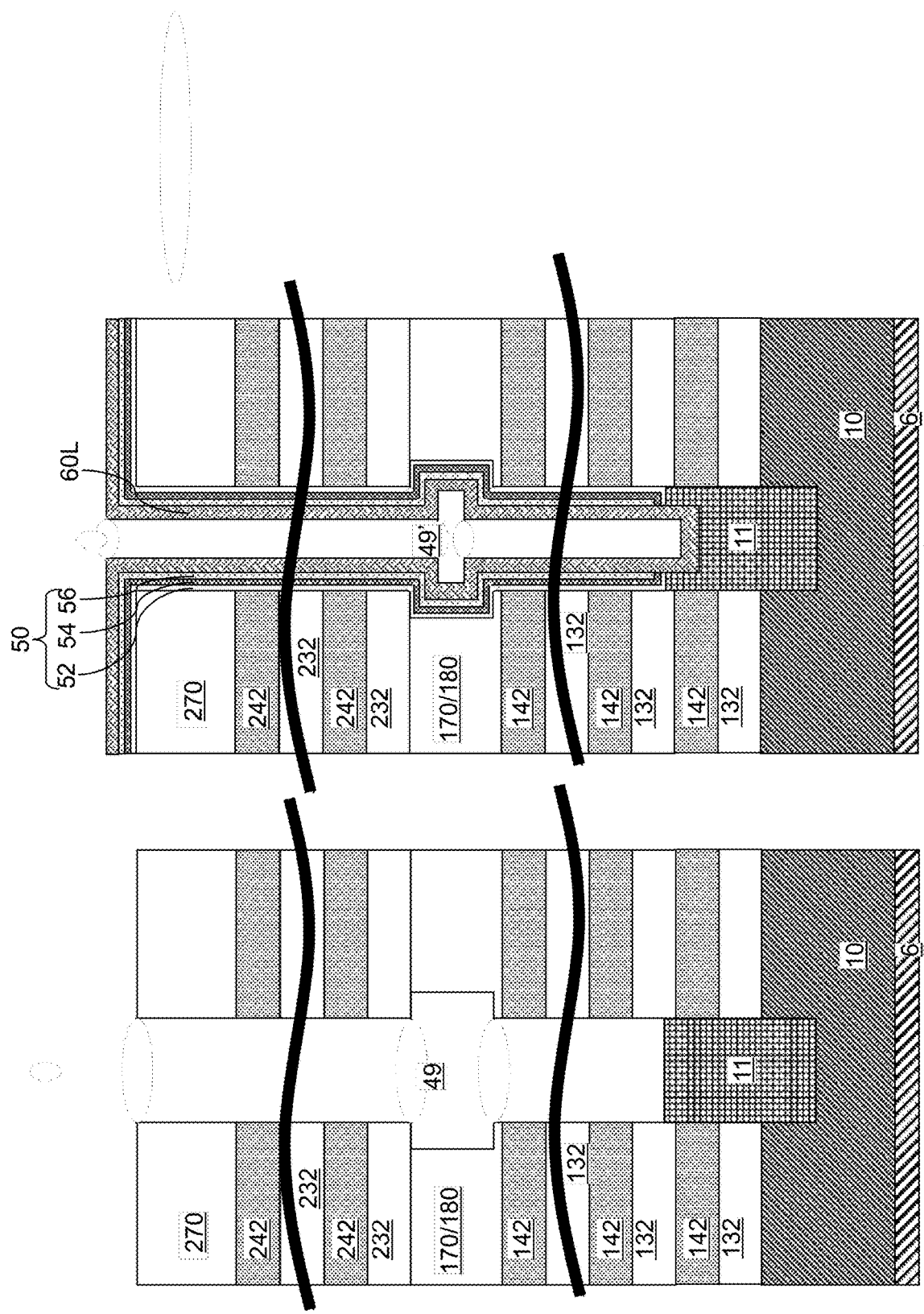

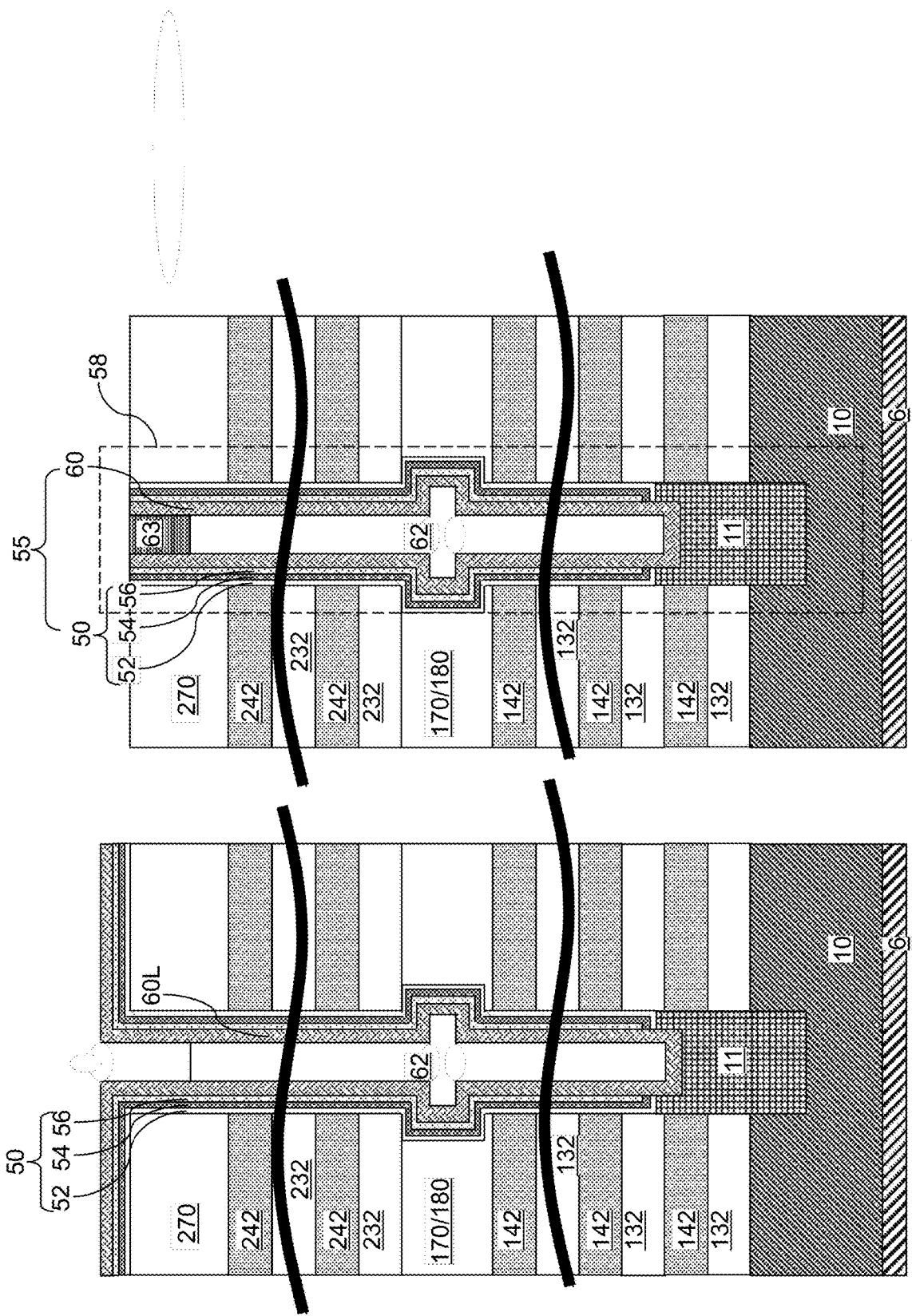

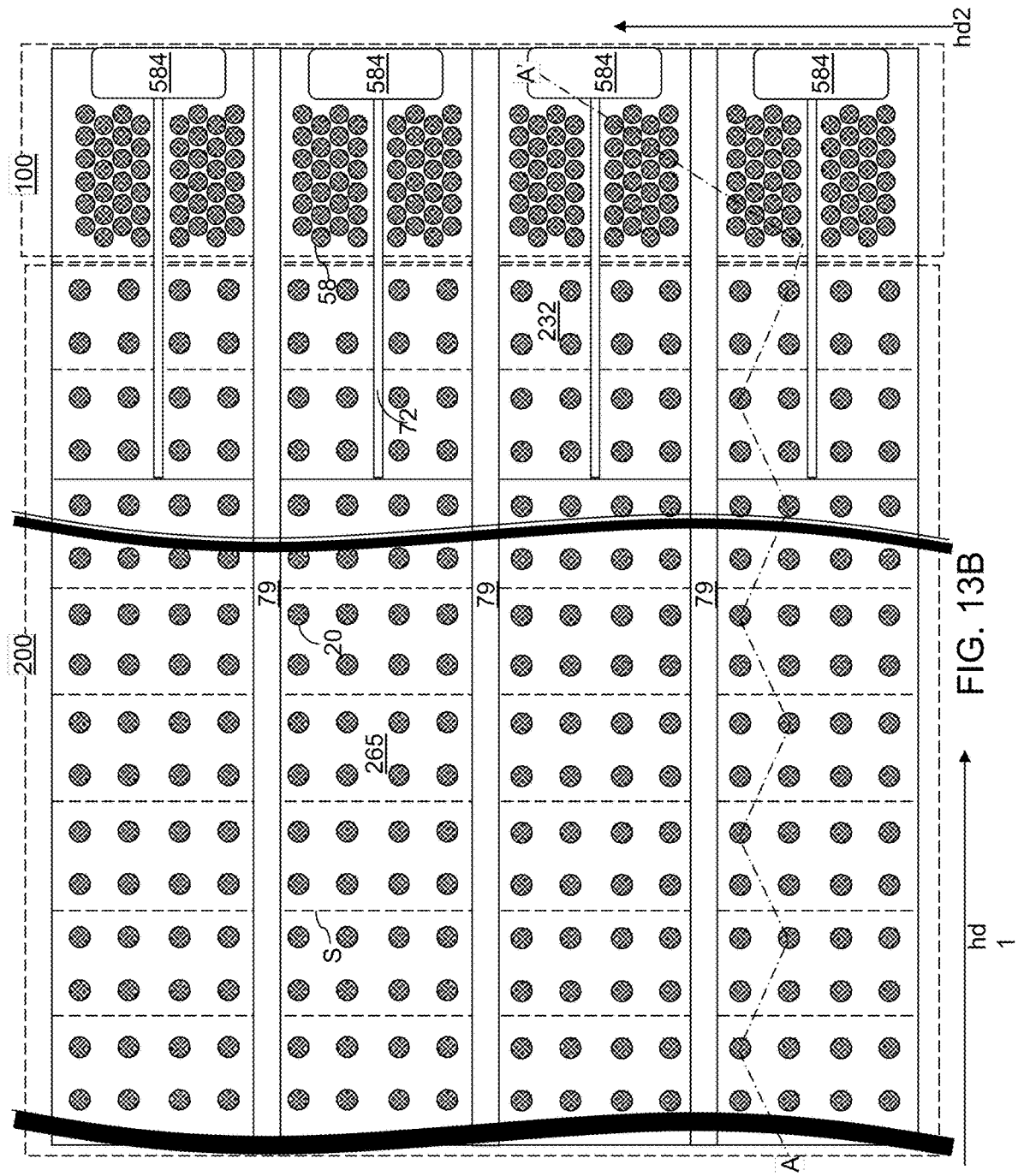

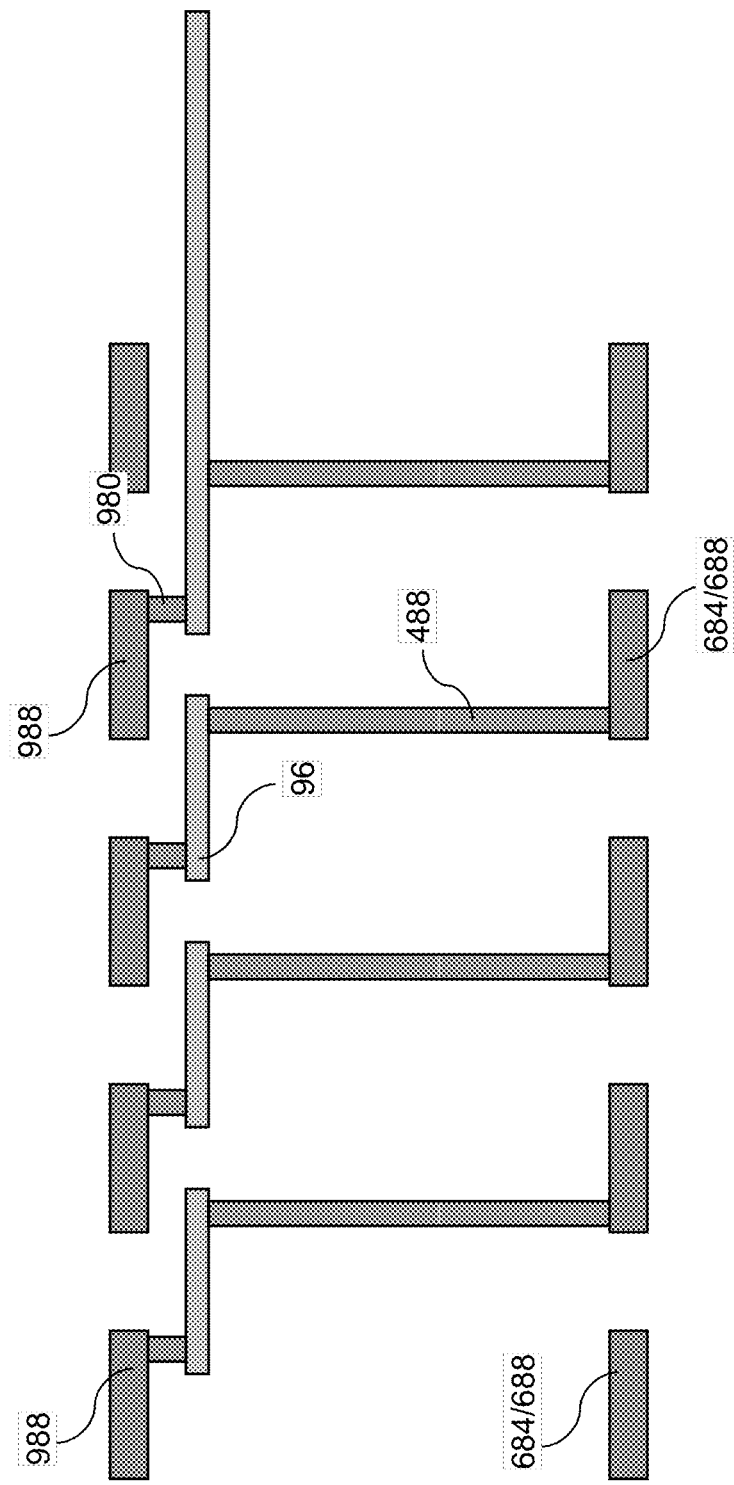

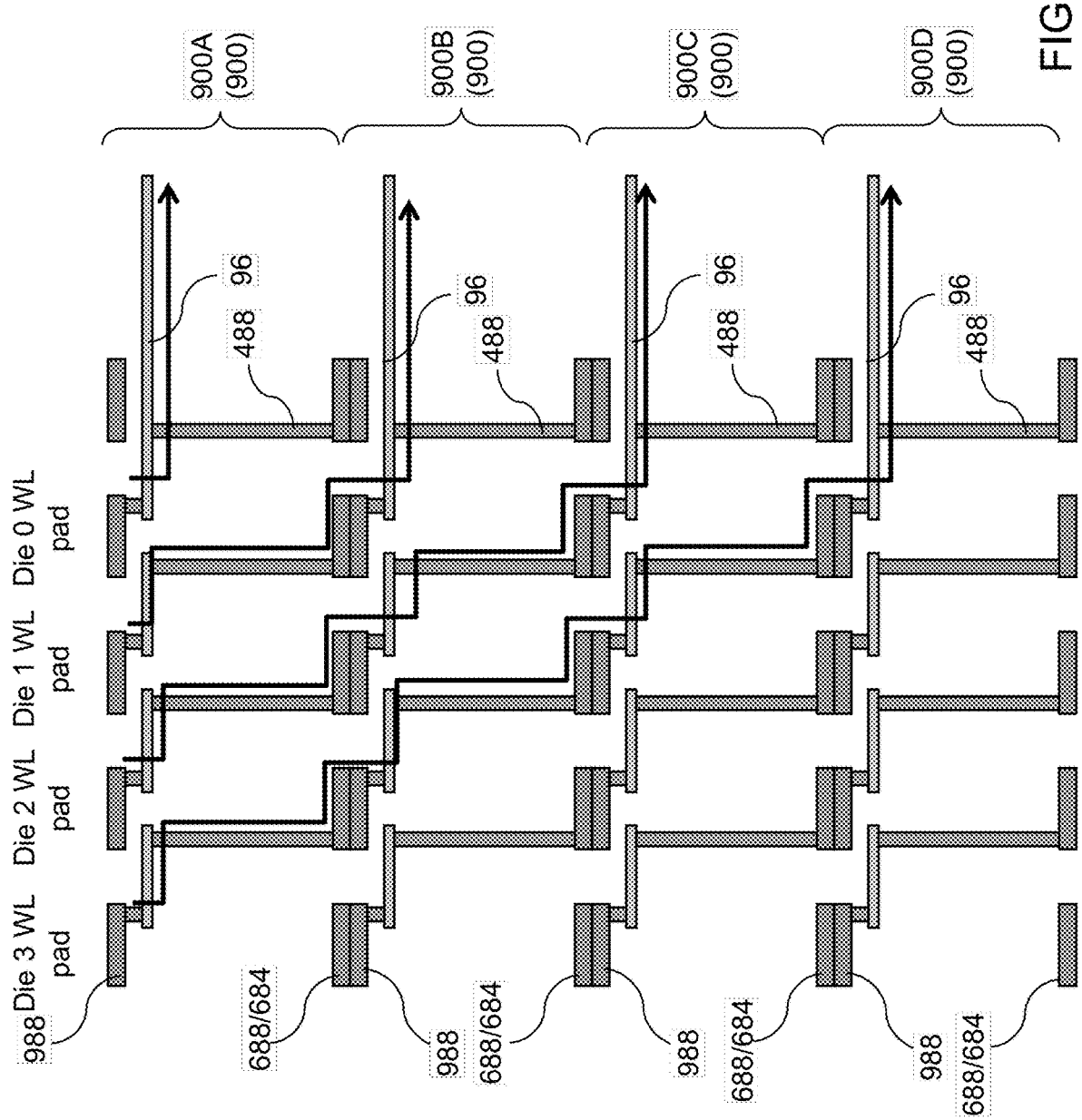

BONDED ASSEMBLY OF A SUPPORT DIE AND PLURAL MEMORY DIES CONTAINING LATERALLY SHIFTED VERTICAL INTERCONNECTIONS AND METHODS FOR MAKING THE SAME

FIELD

The present disclosure relates generally to the field of semiconductor devices, and in particular, to a method for stacking semiconductor dies using vertical interconnection provided by through-dielectric via structures and bonded assemblies formed by the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a bonded assembly is provided, which comprises: a first memory die comprising a first three-dimensional memory device; a second memory die comprising a second three-dimensional memory device; and a support die bonded to the first memory die and comprising a peripheral circuitry configured to control the first three-dimensional memory device and the second three-dimensional memory device and comprising multiple rows of support-die bonding pads, wherein the first memory die comprises: multiple rows of first-die proximal bonding pads extending along a first direction and spaced apart along a second direction and bonded to the support die at a first bonding interface plane; multiple rows of first-die distal bonding pads extending along the first direction and spaced apart along the second direction and bonded to the second memory die at a second bonding interface plane; and a plurality of first-die laterally-shifting electrically conductive paths connecting a respective one of the first-die proximal bonding pads and a respective one of the first-die distal bonding pads that is laterally offset from the respective one of the first-die proximal bonding pads along the second direction.

According to another embodiment of the present disclosure, a method of forming a bonded assembly is provided, which comprises: providing a first memory die comprising a first three-dimensional memory device that includes a first-die alternating stack of first-die insulating layers and first-die electrically conductive layers and first-die memory stack structures extending through the first-die alternating stack; providing a second memory die comprising a second three-dimensional memory device that includes a second-die alternating stack of second-die insulating layers and second-die electrically conductive layers and second-die memory stack structures extending through the second-die alternating stack; bonding a support die bonded to the first memory die, wherein the support die comprises a peripheral circuitry configured to control the first-die memory stack structures and the second-die memory stack structures and multiple rows of support-die bonding pads, wherein the first memory die comprises: multiple rows of first-die proximal bonding pads extending along a first direction and spaced apart along a second direction and bonded to the support die at a first bonding interface plane; multiple rows of first-die distal bonding pads extending along the first direction and spaced apart along the second direction and bonded to the second memory die at a second bonding interface plane; and a plurality of first-die laterally-shifting electrically conductive paths connecting a respective one of the first-die proximal bonding pads and a respective one of the first-die distal bonding pads that is laterally offset from the respective one of the first-die proximal bonding pads along the second direction.

BRIEF DESCRIPTION OF THE DRAWINGS

FIG. 4B is a horizontal cross-sectional view of the first exemplary structure of FIG. 4A. The hinged vertical plane A-A' corresponds to the plane of the vertical cross-sectional view of FIG. 4A.

FIGS. 9A-9D illustrate sequential vertical cross-sectional views of a memory opening during formation of a memory opening fill structure according to an embodiment of the present disclosure.

FIG. 13B is a horizontal cross-sectional of the first exemplary structure along the horizontal plane B-B' of FIG. 13A. The hinged vertical plane A-A' corresponds to the plane of the vertical cross-sectional view of FIG. 13A.

FIG. 26 is a schematic vertical cross-sectional view of metal interconnect structures in a memory die that provides lateral shifting of electrical connections between interconnect-side bonding pads and array-side bonding pads.

FIG. 27 is a schematic vertical cross-sectional view of metal interconnect structures in multiple memory dies that are configured to provide independent word line control for the multiple memory dies.

DETAILED DESCRIPTION

Figure 1:
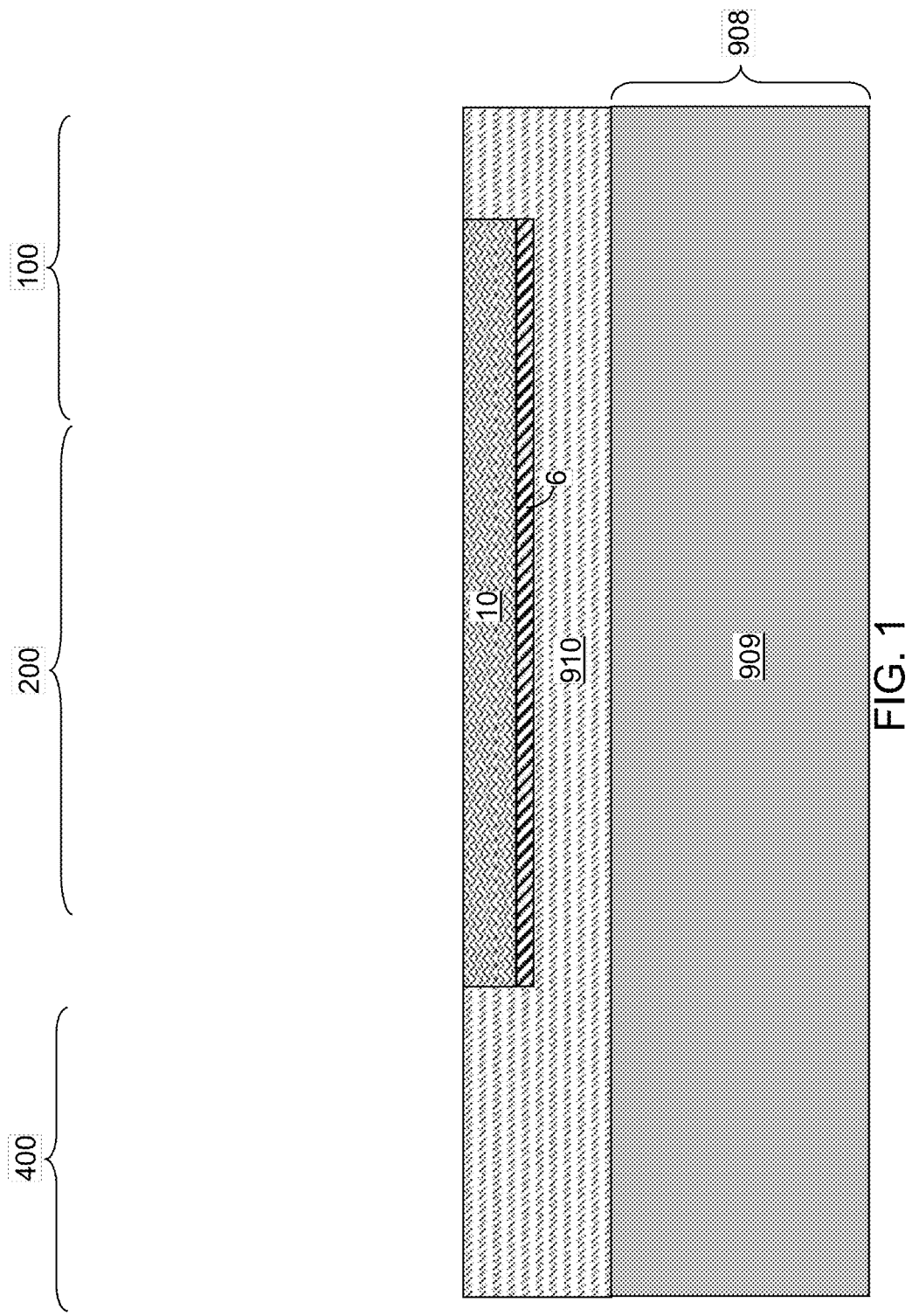
FIG. 1 is a vertical cross-sectional view of a first exemplary structure after formation of an array-side dielectric material layer and a doped semiconductor layer on a semiconductor substrate according to an embodiment of the present disclosure.

As discussed above, the embodiments of the present disclosure provide a method for stacking semiconductor dies using vertical interconnection provided by laterally offset (e.g., laterally shifted) through-dielectric via structures and bonded assemblies formed by the same, the various embodiments of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure including an in-process memory die is illustrated. As used herein, a memory die may be a semiconductor die including an array of memory elements. As such, an in-process memory may be is a structure that is subsequently modified to form a memory die.

The first exemplary structure may include a carrier substrate 908, which includes a carrier substrate layer 909. The carrier substrate 908 may comprise a commercially available semiconductor wafer such as a single crystalline silicon wafer. An array-side dielectric material layer 910 may be formed over the carrier substrate layer 909. The array-side dielectric material layer 910 may include a dielectric material such as silicon oxide. The maximum thickness of the array-side dielectric material layer 910 may be in a range from 200 nm to 3,000 nm, although lesser and greater thicknesses may also be used.

An optional metallic plate layer 6 and a source semiconductor layer 10 may be formed in the array-side dielectric material layer 910. The optional metallic plate layer 6, if present, provides a high conductivity conduction path for electrical current that flows into, along, and/or out of, the source semiconductor layer 10. The optional metallic plate layer 6 may include a conductive material such as a metal or a heavily doped semiconductor material. The optional metallic plate layer 6, for example, may include a tungsten layer having a thickness in a range from 3 nm to 100 nm, although lesser and greater thicknesses may also be used. A metal nitride layer (not shown) may be provided as a diffusion barrier layer on top of the metallic plate layer 6. The metallic plate layer 6 may function as a component of a source line in a completed die. The thickness of the metallic plate layer 6 may be in a range from 20 nm to 200 nm, although lesser and greater thicknesses may also be used.

The source semiconductor layer 10 may be a doped semiconductor layer having a doping of the opposite conductivity type of the conductivity type of vertical semiconductor channels to be subsequently formed. For example, if vertical semiconductor channels to be subsequently formed have a doping of a first conductivity type, the source semiconductor layer 10 may have a doping of a second conductivity type that is the opposite of the first conductivity type. For example, if the first conductivity type is p-type, the second conductivity type is n-type, and vice versa. The atomic concentration of second conductivity type dopants in the source semiconductor layer 10 may be in a range from $5.0 \times 10^{19}/cm^3$ to $2.0 \times 10^{21}/cm^3$, although lesser and greater atomic concentrations may also be used. The thickness of the source semiconductor layer 10 may be in a range from 100 nm to 600 nm, although lesser and greater thicknesses may also be used.

The source semiconductor layer 10 and the metallic plate layer 6 may be patterned such that the source semiconductor layer 10 and the metallic plate layer 6 extend over at least a portion of a memory array region 100 in which memory stack structures are to be subsequently formed and over a staircase region 200 in which stepped surfaces of electrically conductive layers embodying word lines are to be subsequently formed. A via interconnection region 400 may be provided around the memory array region 100 and the staircase region 200. In one embodiment, the top surface of the source semiconductor layer 10 may be coplanar with the top surface of the array-side dielectric material layer 910.

Figure 2:
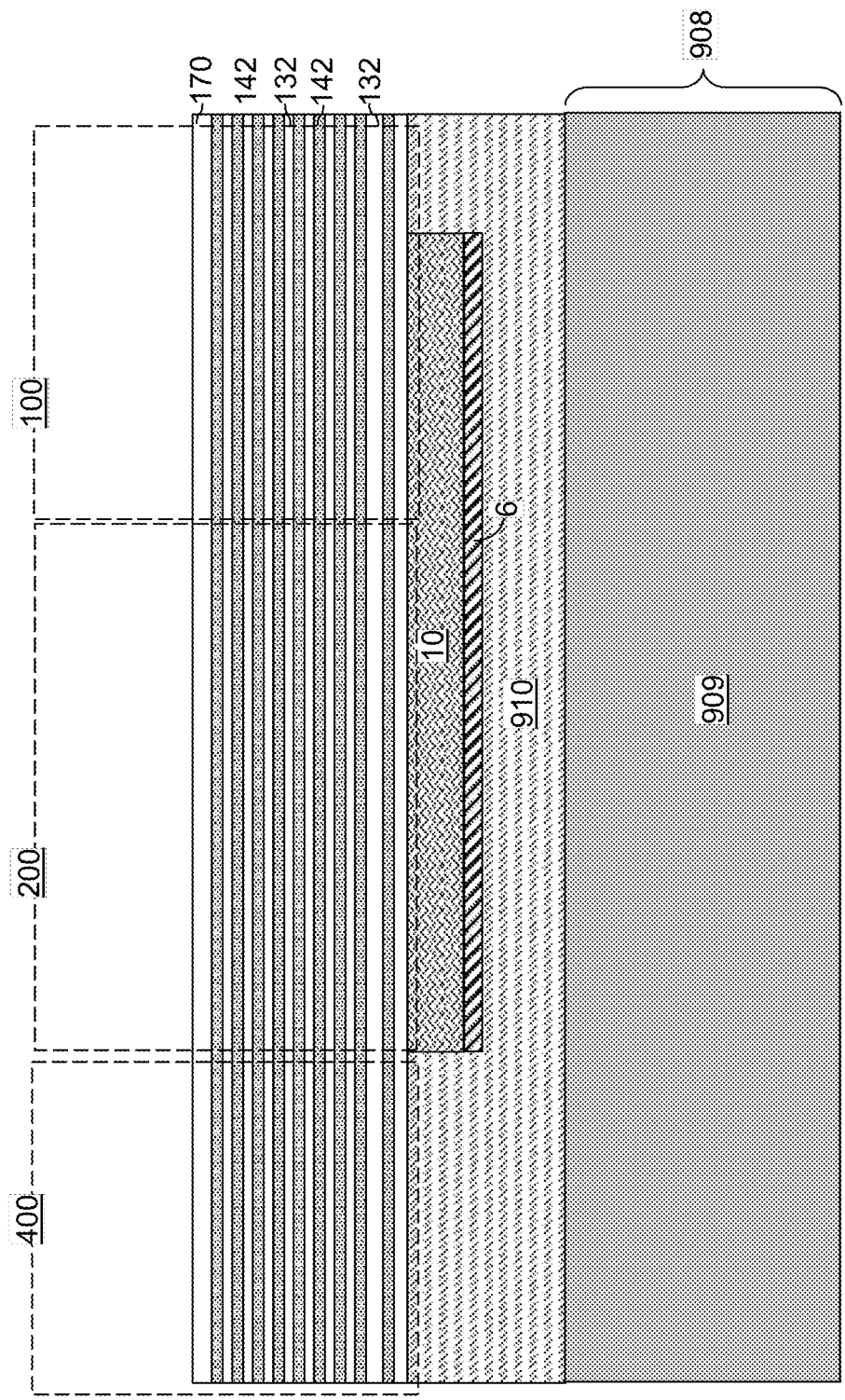
FIG. 2 is a vertical cross-sectional view of the first exemplary structure after formation of a first-tier alternating stack of first insulating layers and first spacer material layers according to an embodiment of the present disclosure.

Referring to FIG. 2, an alternating stack of first material layers and second material layers may be subsequently formed. Each first material layer may include a first material, and each second material layer may include a second material that is different from the first material. In embodiments in which at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers may be formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 may be formed over the source semiconductor layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
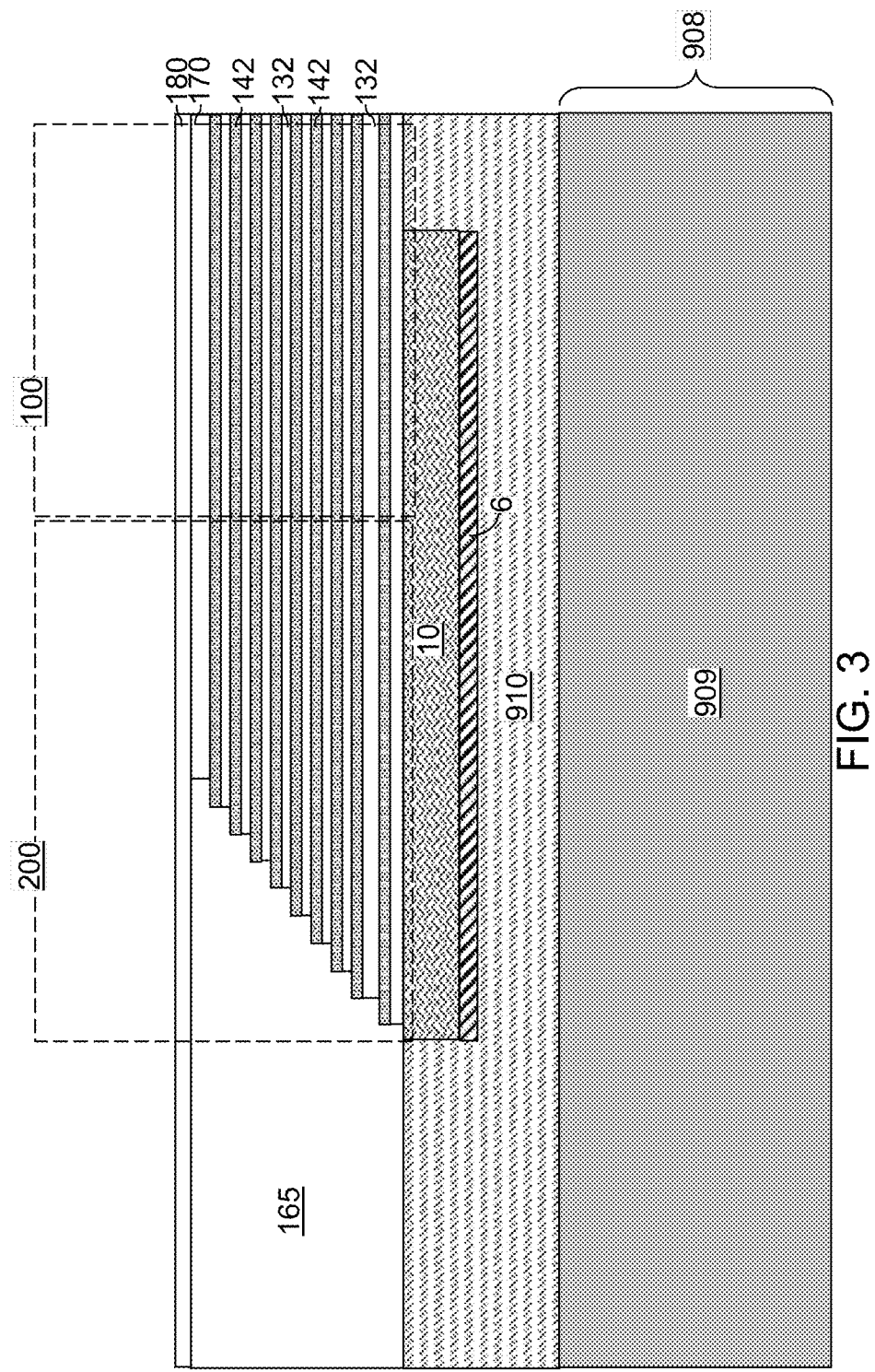
FIG. 3 is a vertical cross-sectional view of the first exemplary structure after patterning a first-tier staircase region, a first stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first-tier alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
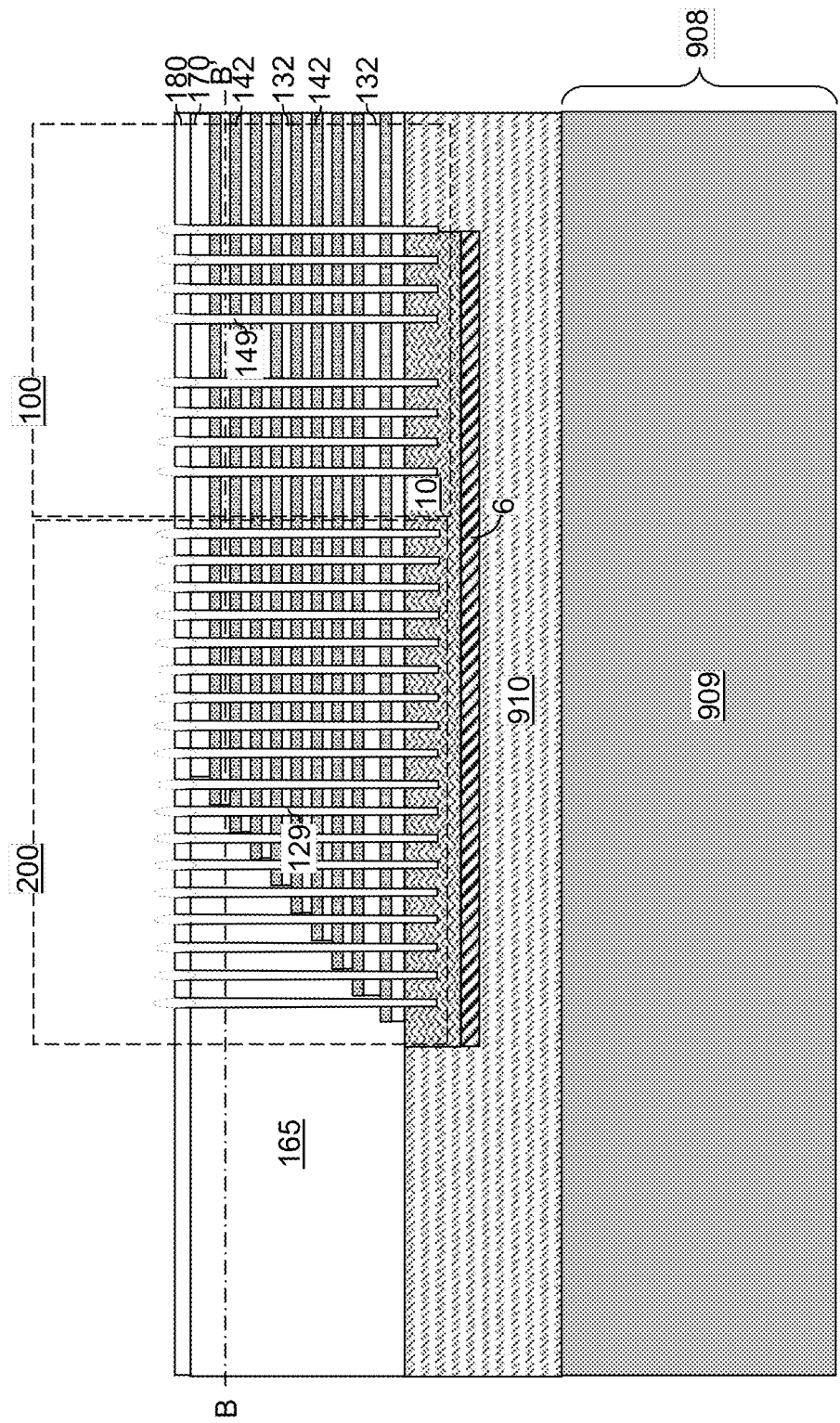
FIG. 4A is a vertical cross-sectional view of the first exemplary structure after formation of first-tier memory openings and first-tier support openings according to an embodiment of the present disclosure.

Referring to FIGS. 4A and 4B, various first-tier openings (149, 129) may be formed through the inter-tier dielectric layer 180 and the first-tier structure (132, 142, 170, 165) and into the source semiconductor layer 10. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the source semiconductor layer 10 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 may be openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 may be openings that are formed in the staircase region 200. A subset of the first-tier support openings 129 that is formed through the first stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4$/$O_2$/Ar etch). The sidewalls of the various first-tier openings (149, 129) may be substantially vertical, or may be tapered. In one embodiment, the terminal portion of the anisotropic etch process may include an overetch step that etches into an upper portion of the source semiconductor layer 10. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
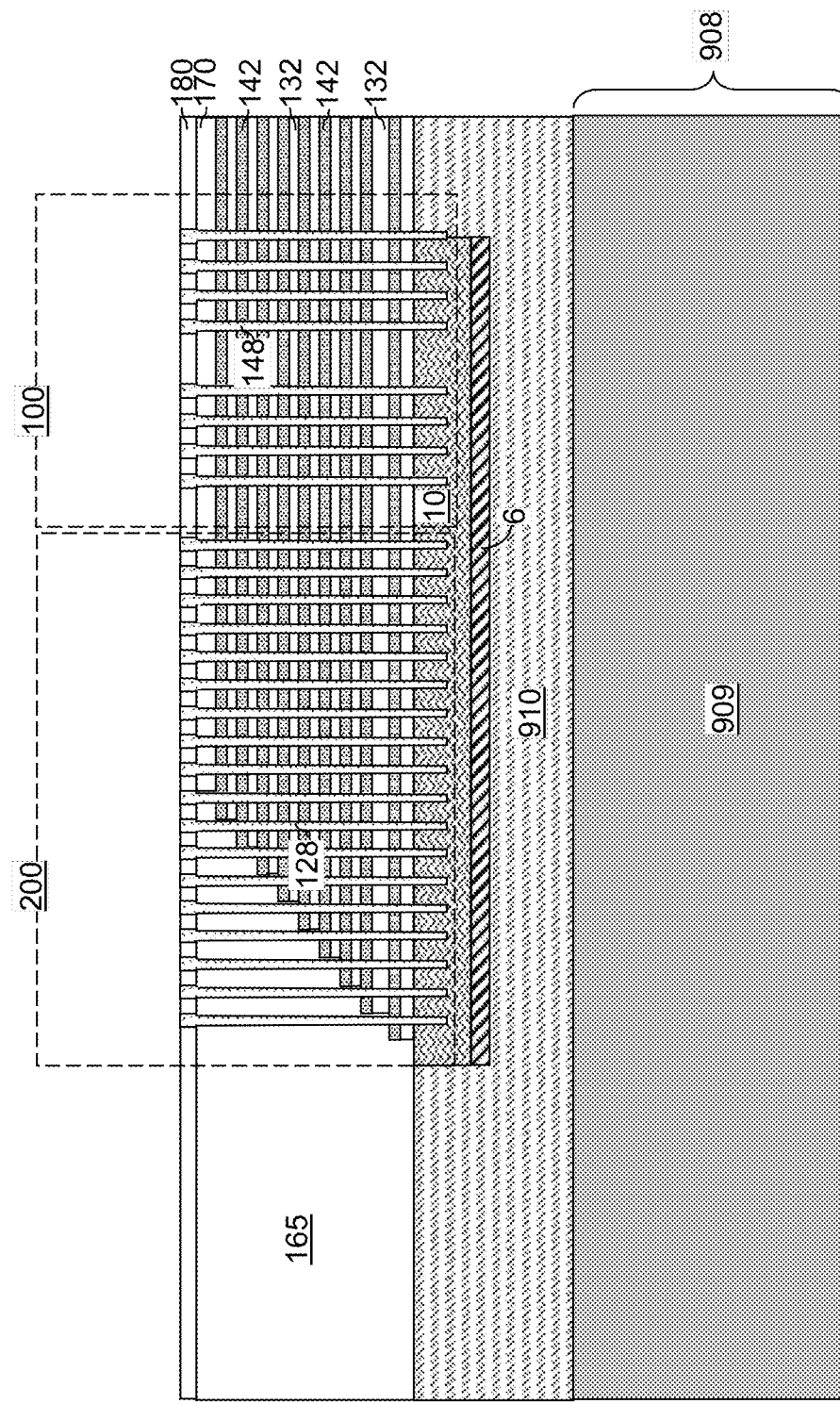
FIG. 5 is a vertical cross-sectional view of the first exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
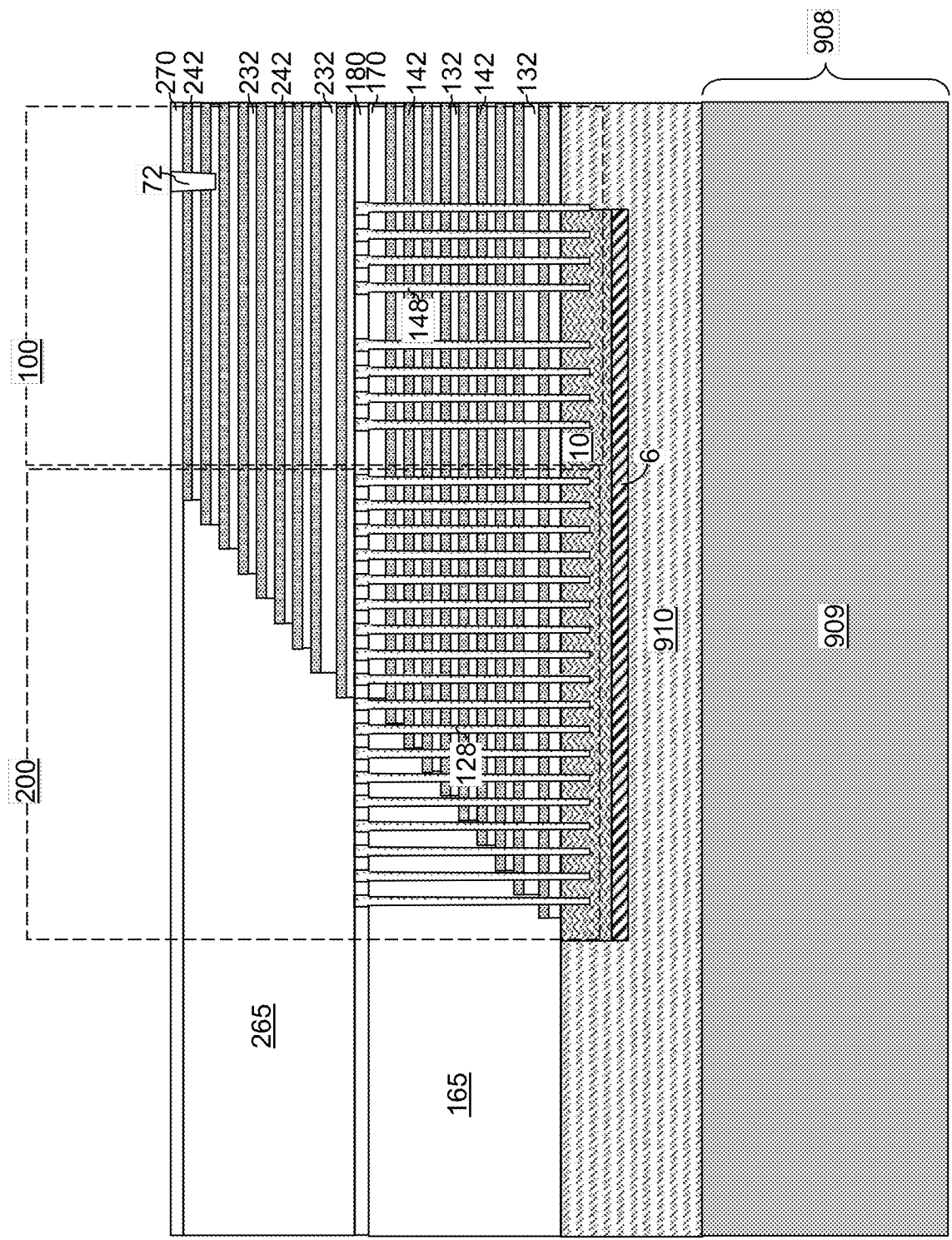
FIG. 6 is a vertical cross-sectional view of the first exemplary structure after formation of a second-tier alternating stack of second insulating layers and second spacer material layers, second stepped surfaces, and a second stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142. However, in an alternative embodiment, the second-tier structure may be omitted, and the device may have only a single tier. In another alternative embodiment, the device may include more than three tiers and additional tier structures may be formed over the second-tier structure using the steps described herein.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the source semiconductor layer 10, and at least one stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7A:
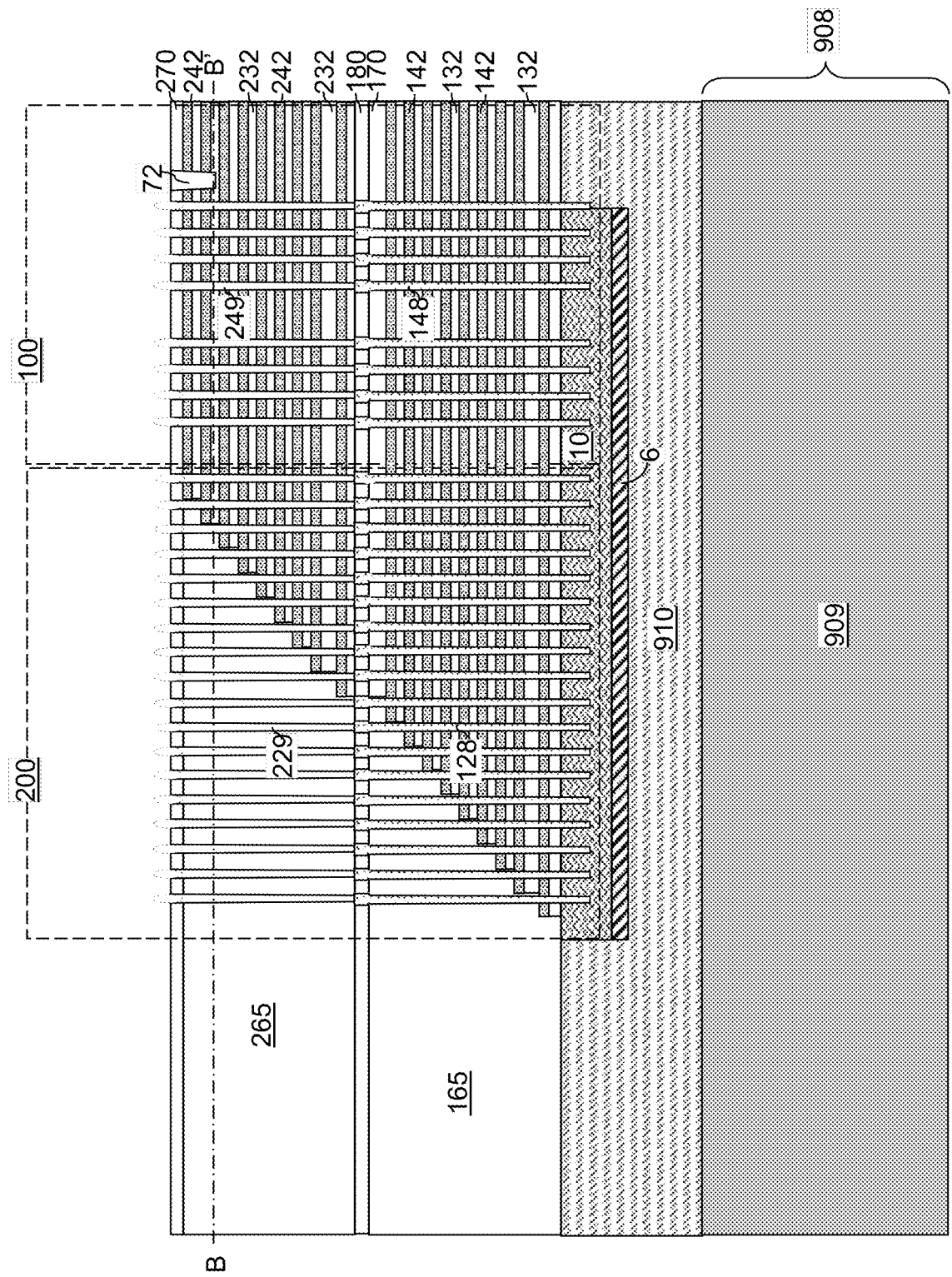
FIG. 7A is a vertical cross-sectional view of the first exemplary structure after formation of second-tier memory openings and second-tier support openings according to an embodiment of the present disclosure.
Figure 7B:
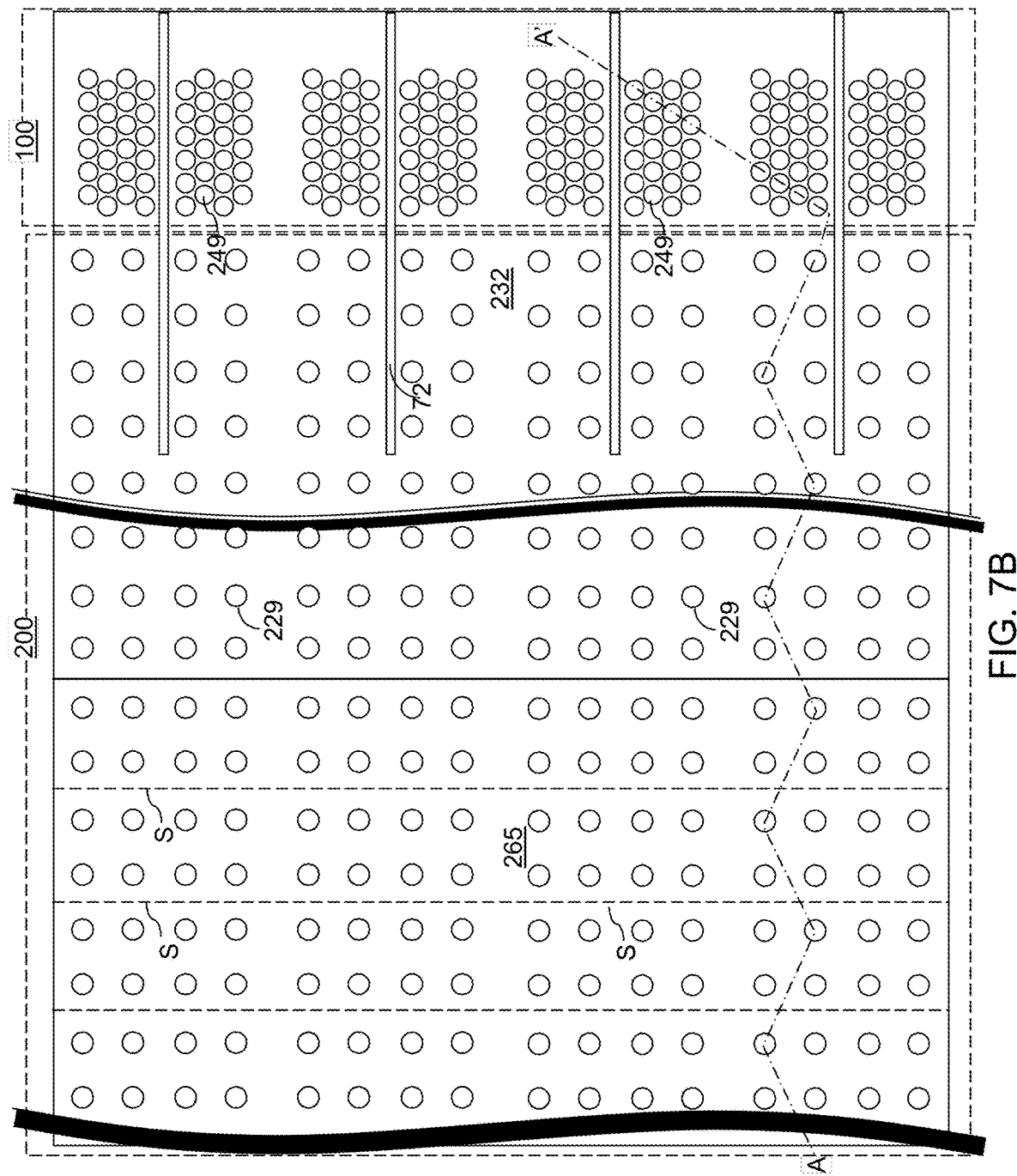
FIG. 7B is a horizontal cross-sectional of the first exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion 265. Locations of steps S in the first-tier alternating stack (132, 142)

and the second-tier alternating stack (232, 242) are illustrated as dotted lines in FIG. 7B.

The second anisotropic etch process may include an etch step in which the materials of the second-tier alternating stack (232, 242) are etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
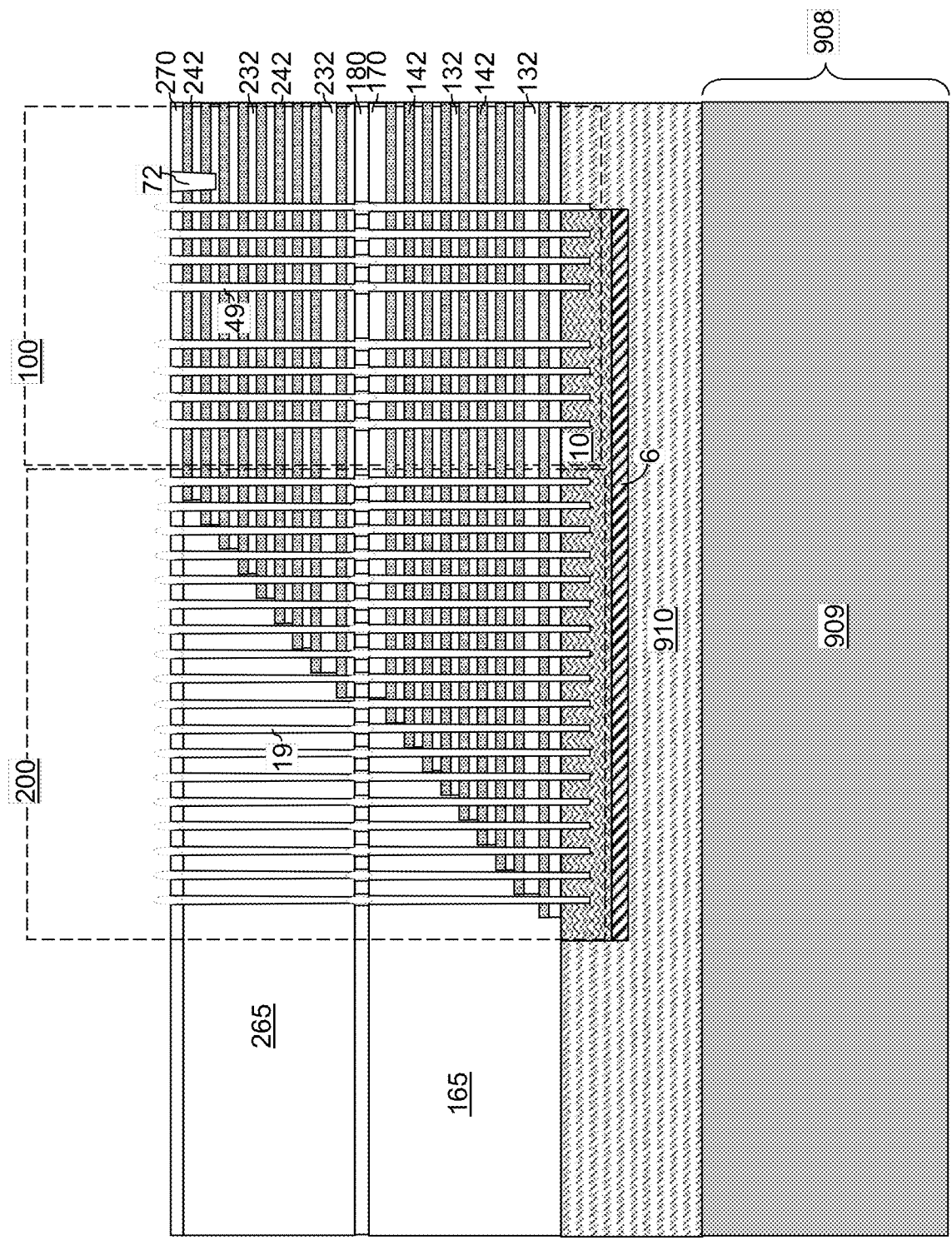
FIG. 8 is a vertical cross-sectional view of the first exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a pedestal channel portion 11 may be formed by a selective semiconductor material deposition process at the bottom of each memory opening 49 and at the bottom of each support opening 19. A doped semiconductor material having a doping of a first conductivity type may be selectively grown from the physically exposed surfaces of the source semiconductor layer 10, while growth of the doped semiconductor material from dielectric surfaces is suppressed during the selective semiconductor material deposition process. A semiconductor precursor gas, a dopant gas including dopants atoms of the first conductivity type, and an etchant may be flowed into a process chamber including the first exemplary structure concurrently or alternately. A periphery of a top surface each pedestal channel portion 11 may contact a sidewall of a first insulating layer 132 that overlies, and contacts, a bottommost first sacrificial material layer 142. The atomic concentration of first conductivity type dopants in the pedestal channel portions 11 may be in a range from $1.0\times10^{14}/cm^3$ to $1.0\times10^{18}/cm^3$, although lesser and greater dopant atomic concentrations may also be used. A p-n junction may be formed at each interface between the source semiconductor layer 10 and the pedestal channel portions 11.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{15}/cm^3$ to $1.0 \times 10^{19}/cm^3$, such as from $1.0 \times 10^{16}/cm^3$ to $1.0 \times 10^{18}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The source semiconductor layer 10, the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
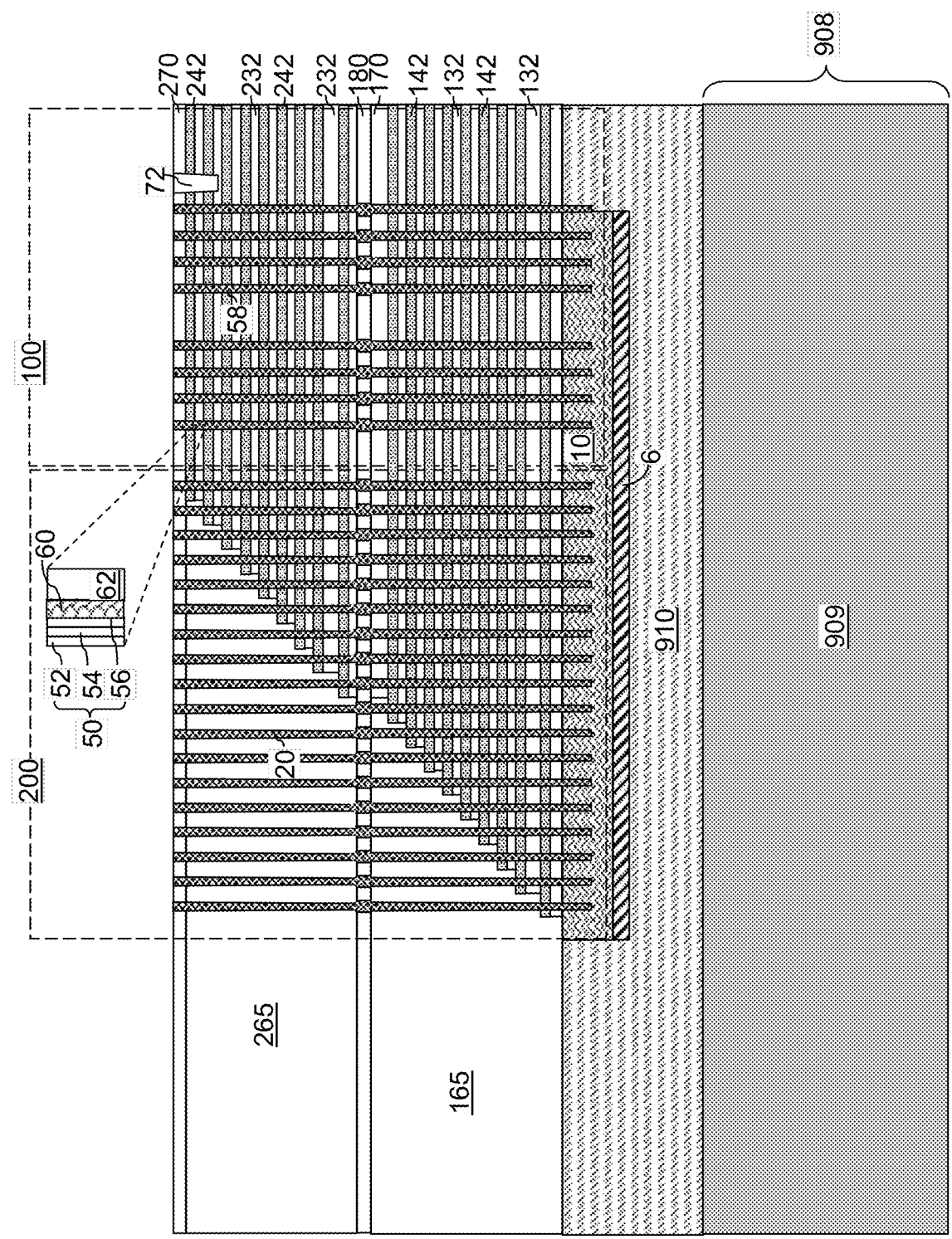
FIG. 10 is a vertical cross-sectional view of the first exemplary structure after formation of memory opening fill structures and support pillar structures according to an embodiment of the present disclosure.

Referring to FIG. 10, the first exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
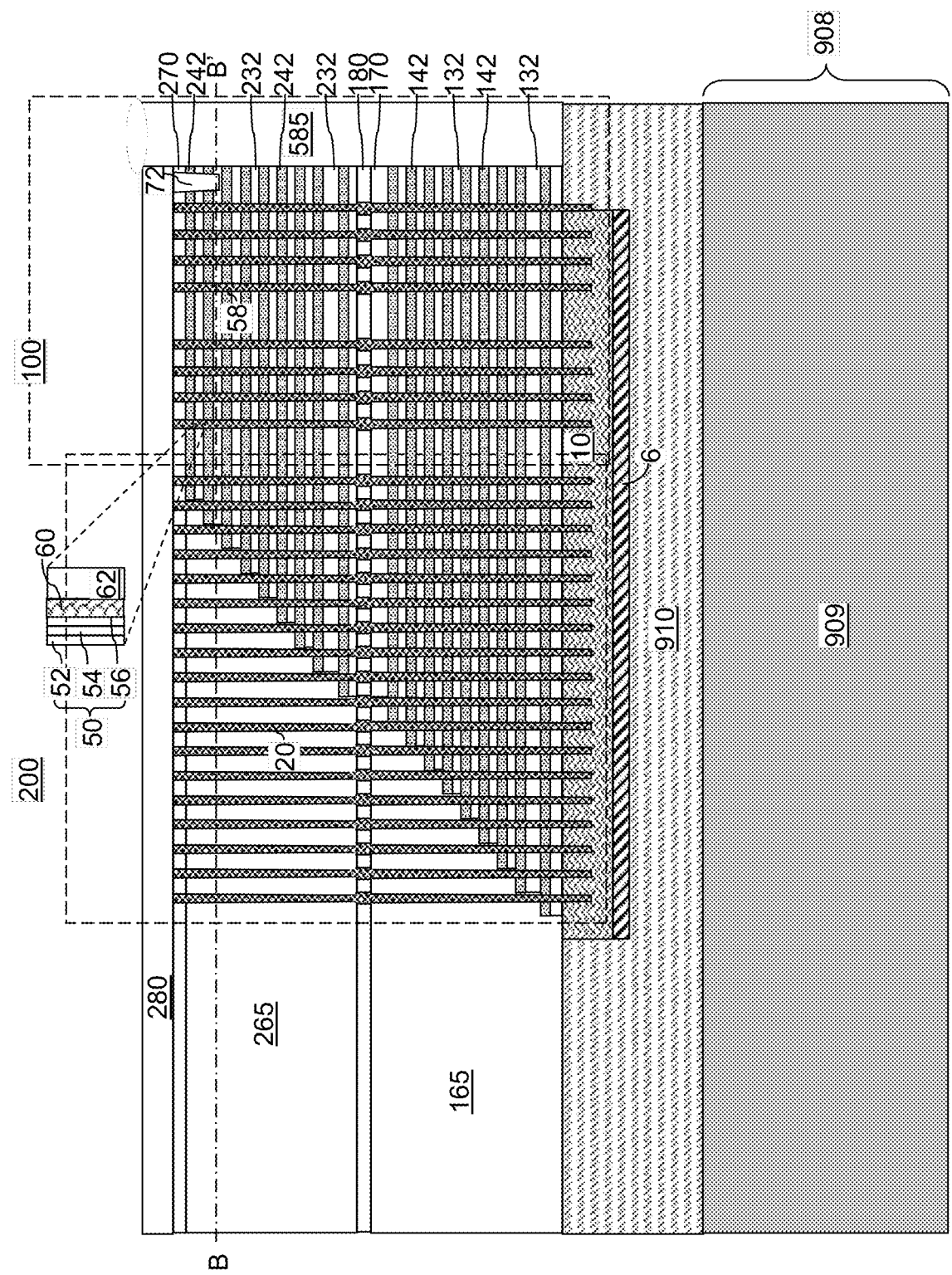
FIG. 11A is a vertical cross-sectional view of the first exemplary structure after formation of pillar cavities according to an embodiment of the present disclosure.
Figure 11B:
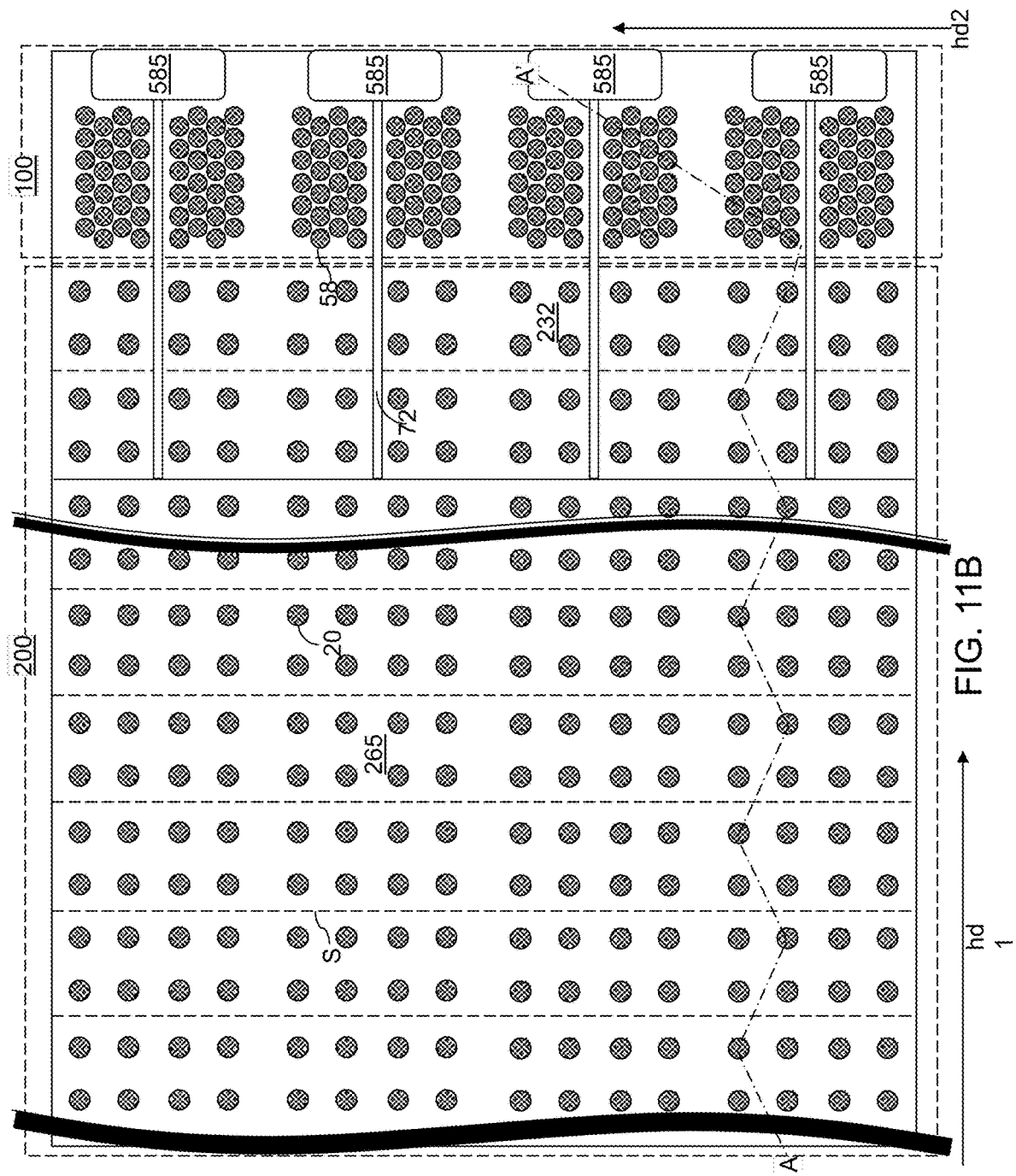
FIG. 11B is a horizontal cross-sectional of the first exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of an array-side dielectric material layer 910 may be physically exposed at the bottom of each vertical interconnection region cavity 585. The photoresist layer may be removed, for example, by ashing.

Figure 12:
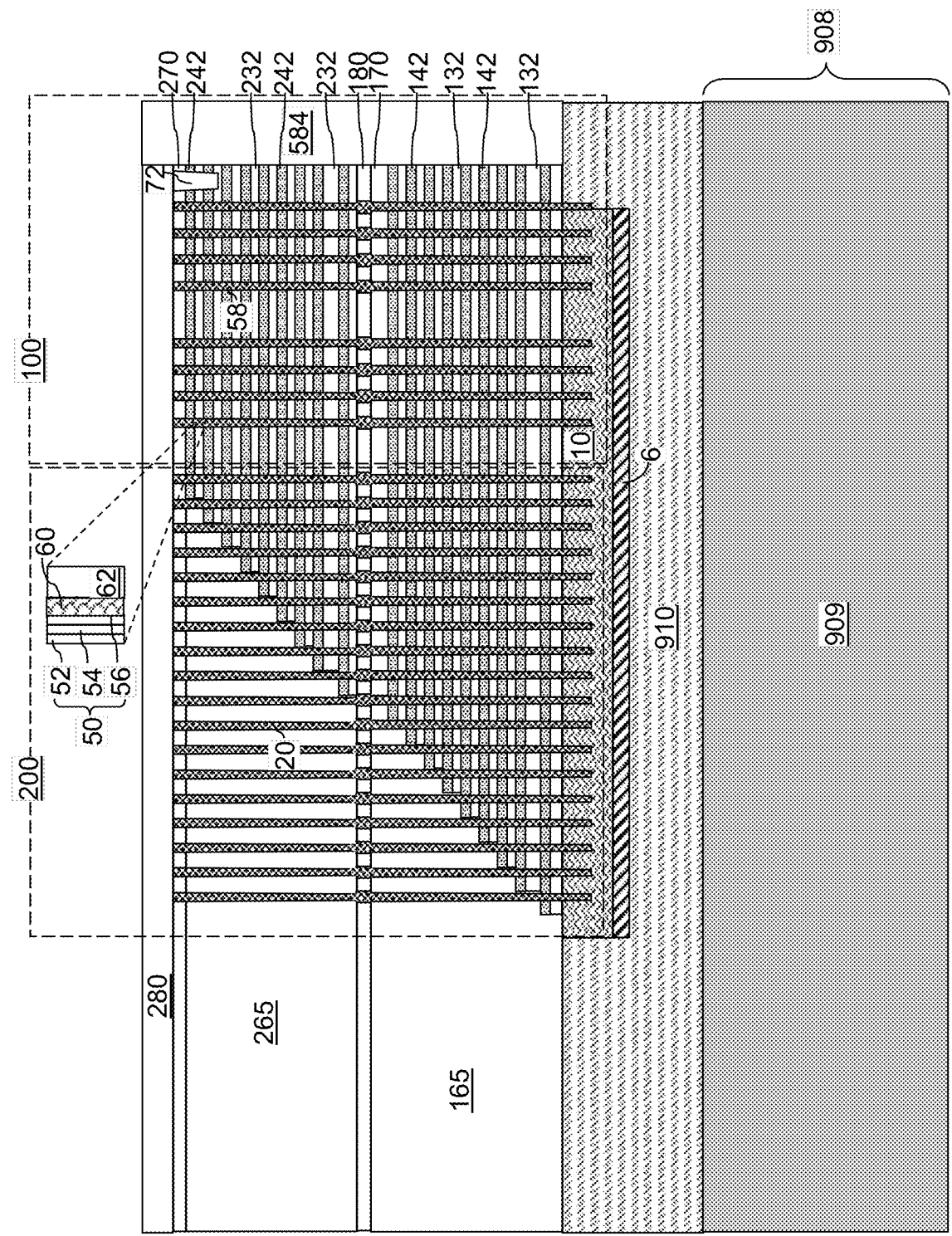
FIG. 12 is a vertical cross-sectional view of the first exemplary structure after formation of dielectric pillar structures according to an embodiment of the present disclosure.

Referring to FIG. 12, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 13A:
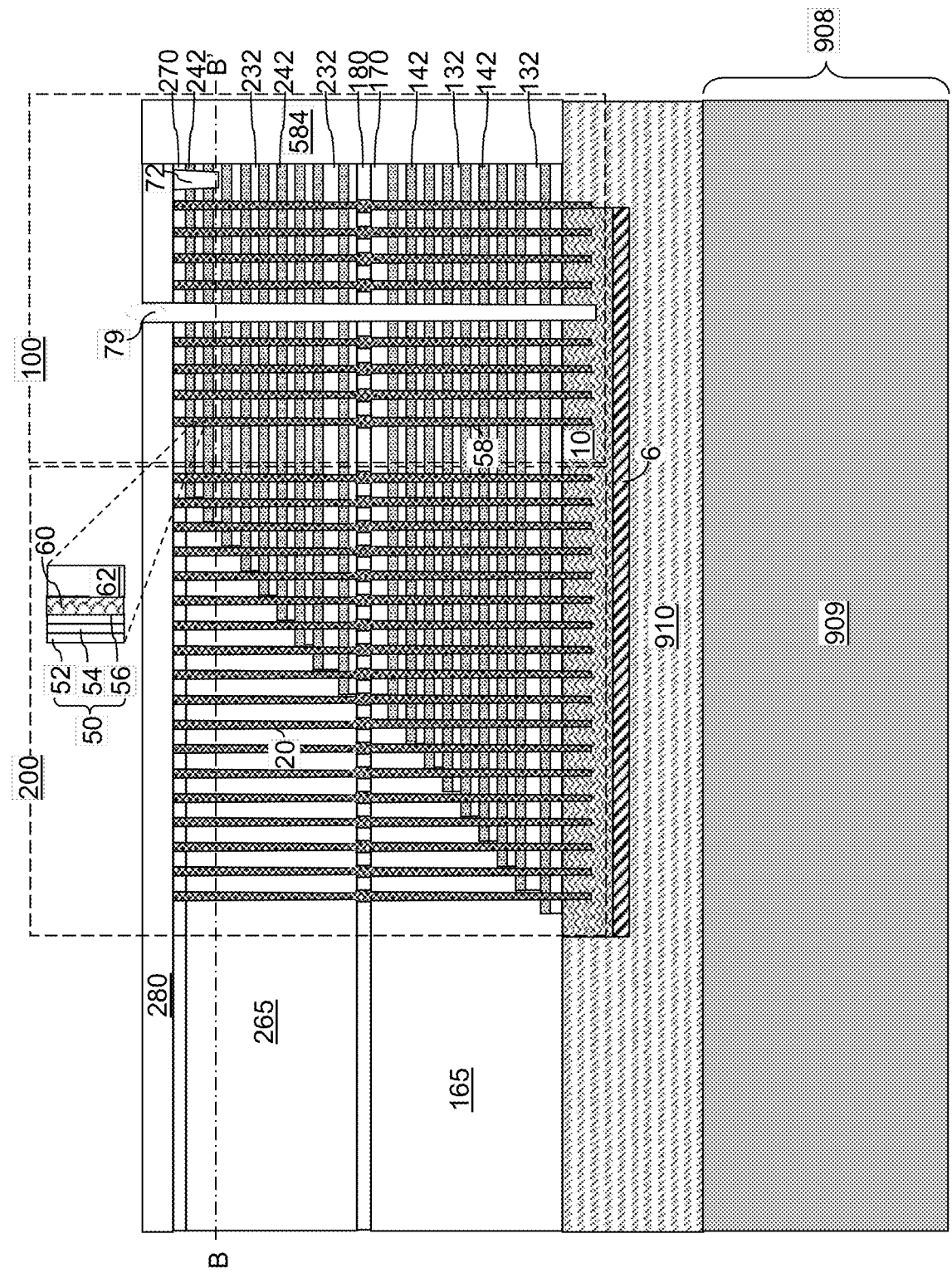
FIG. 13A is a vertical cross-sectional view of the first exemplary structure after formation of a first contact-level dielectric layer and backside trenches according to an embodiment of the present disclosure.

Referring to FIGS. 13A and 13B, a photoresist layer (not shown) may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer through the first contact-level dielectric layer 280, the second-tier structure (232, 242, 270, 265, 72), and the first-tier structure (132, 142, 170, 165), and into the source semiconductor layer 10. Portions of the first contact-level dielectric layer 280, the second-tier structure (232, 242, 270, 265, 72), the first-tier structure (132, 142, 170, 165), and the source semiconductor layer 10 that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79. While it is desirable for the backside trenches 79 to be formed with completely straight sidewalls, the backside trenches 79 are often formed with local width variations with non-straight surfaces due to various effects including local variations of process parameters (such as local variations in gas flow, pressure, electrical field, etc.) and charge density variations within the first exemplary structure due to local layout variations of conductive components within the first exemplary structure.

Figure 14:
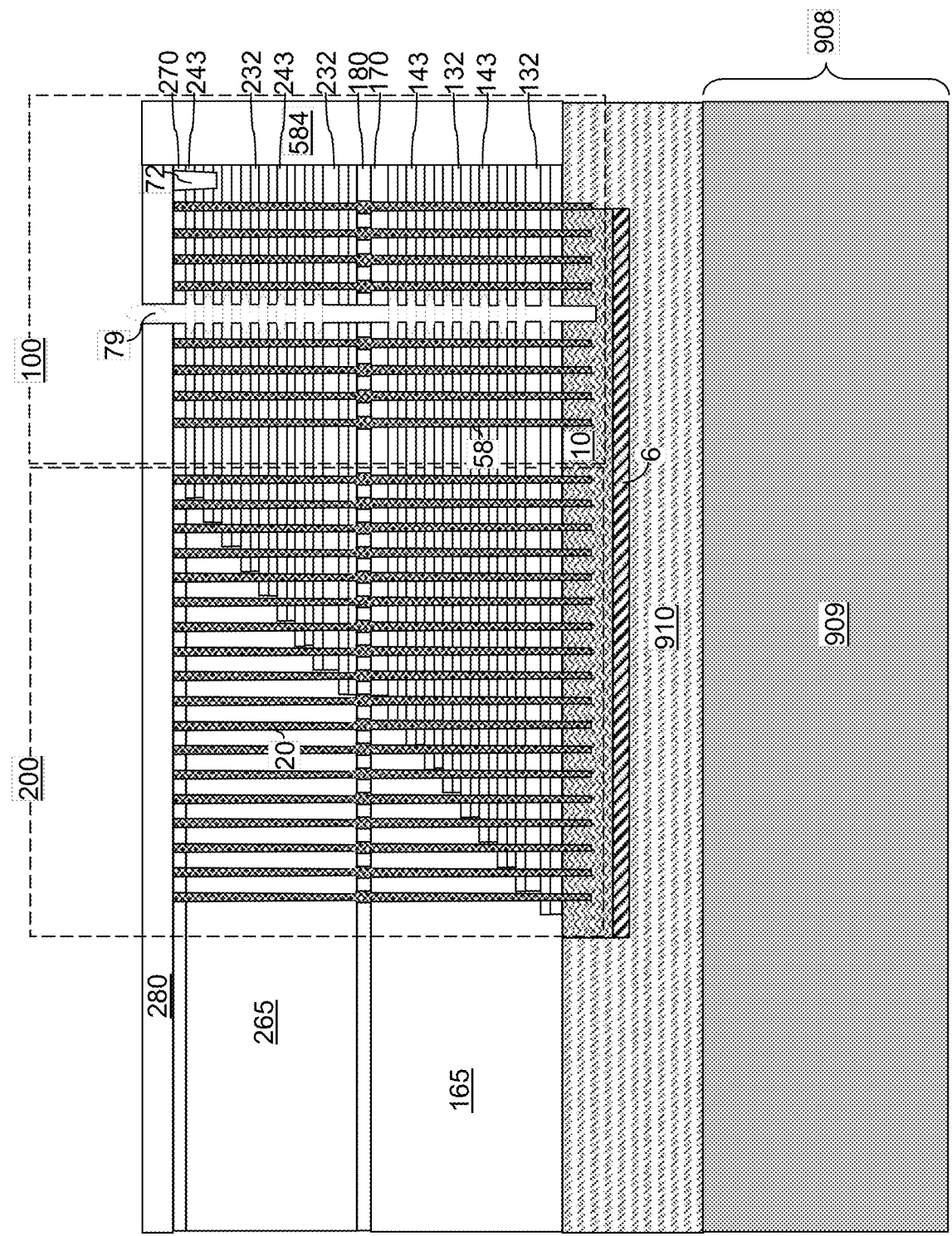
FIG. 14 is a vertical cross-sectional view of the first exemplary structure after formation of backside recesses according to an embodiment of the present disclosure.

Referring to FIG. 14, the sacrificial material layers (142, 242) may be removed selective to the insulating layers (132, 232), the first and second insulating cap layers (170, 270), the first contact-level dielectric layer 280, and the source semiconductor layer 10. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) may be formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the carrier substrate layer 909. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 15A:
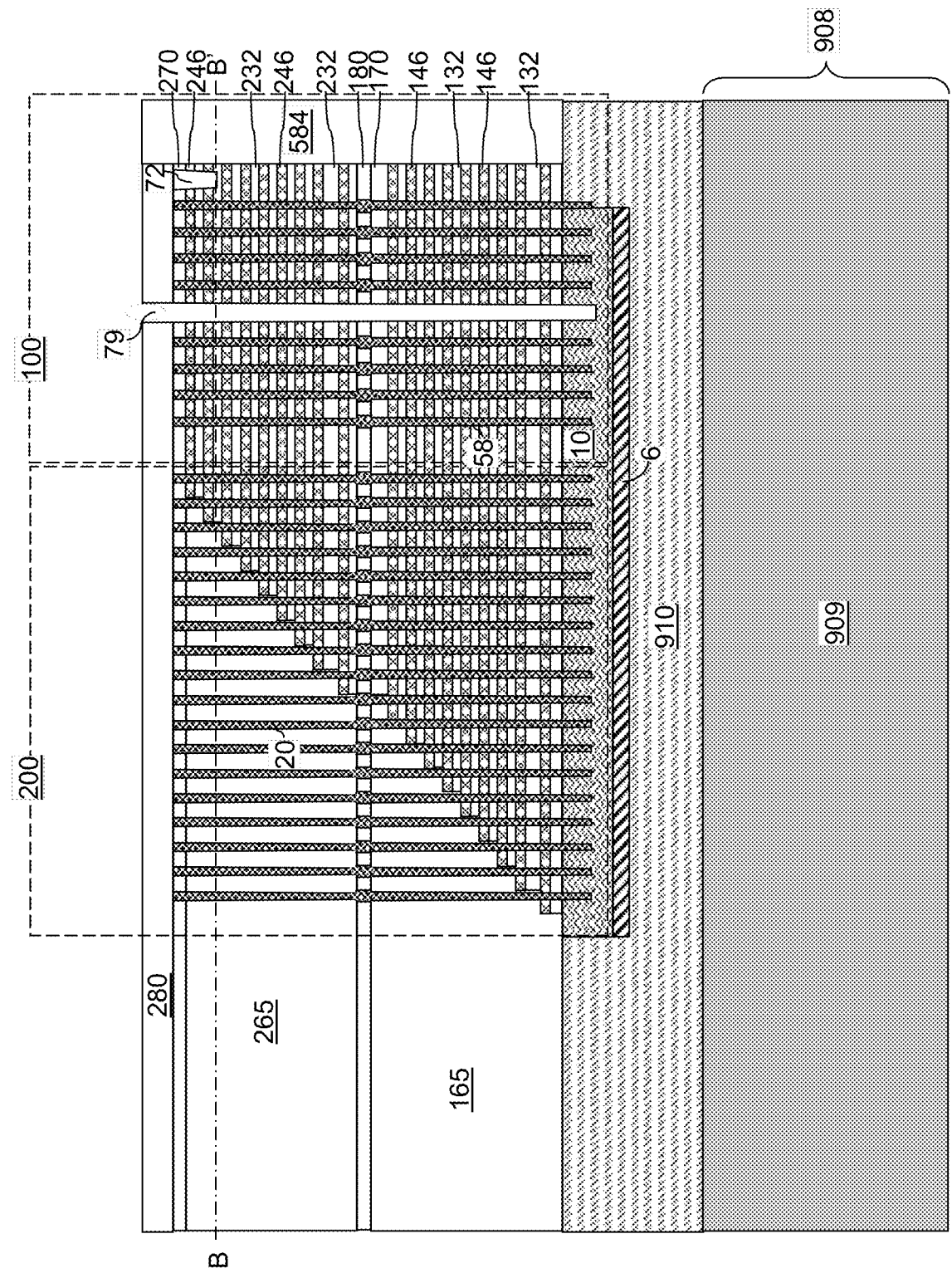
FIG. 15A is a vertical cross-sectional view of the first exemplary structure after formation of electrically conductive layers according to an embodiment of the present disclosure.
Figure 15B:
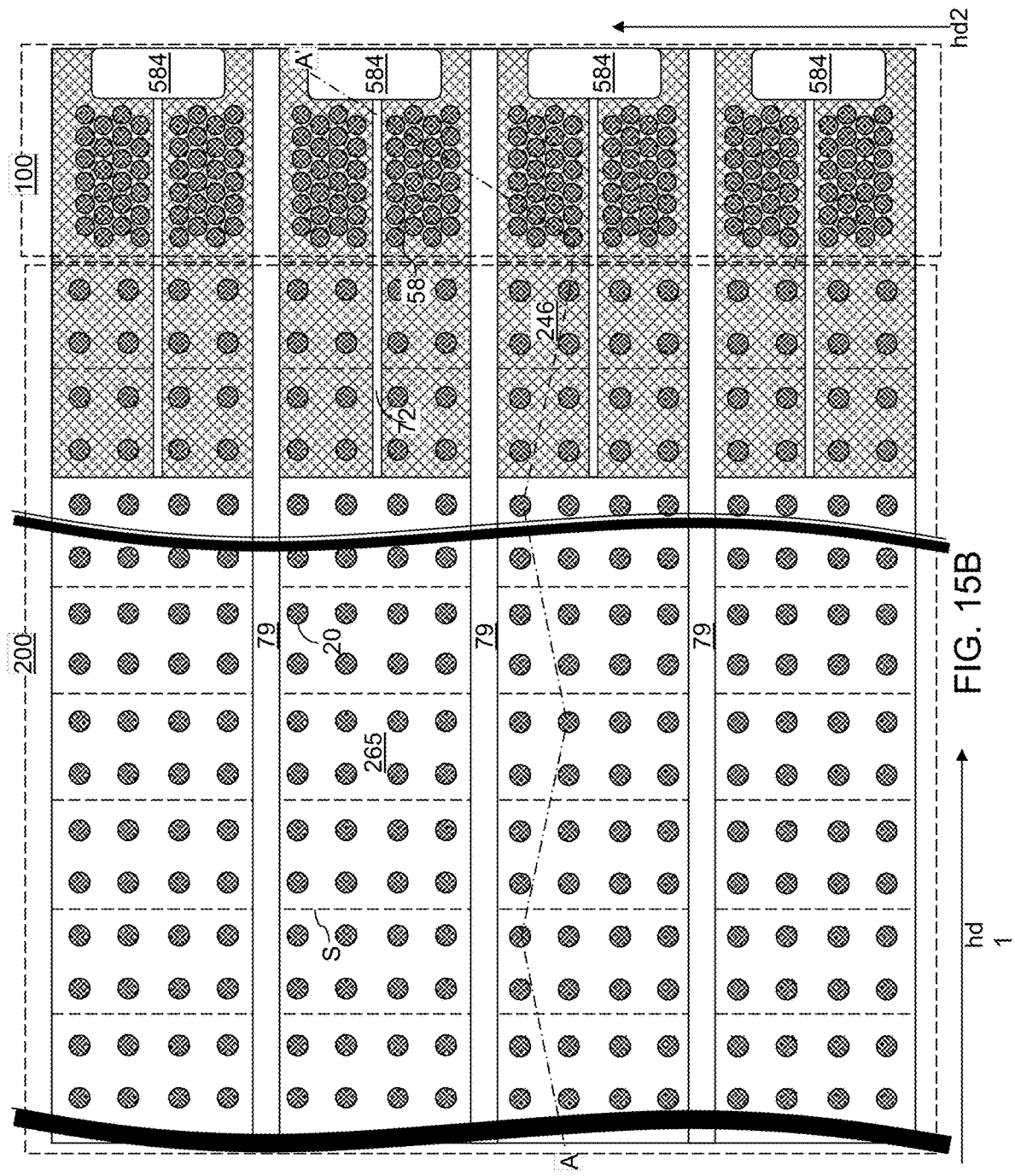
FIG. 15B is a horizontal cross-sectional of the first exemplary structure along the horizontal plane B-B' of FIG. 15A. The hinged vertical plane A-A' corresponds to the plane of the vertical cross-sectional view of FIG. 15A.

Referring to FIGS. 15A and 15B, an oxidation process may be performed to oxidize physically exposed portions of the pedestal channel portions 11. Tubular insulating spacers (not expressly illustrated) may be formed around each pedestal channel portion 11. A backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying via interconnection region 400 may comprise word line switch devices configured to control a bias voltage to respective word lines. The memory-level assembly is located over the carrier substrate layer 909. The memory-level assembly includes at least one alternating stack (132, 146, 232, 246) and memory stack structures 55 vertically extending through the at least one alternating stack (132, 146, 232, 246).

Figure 16A:
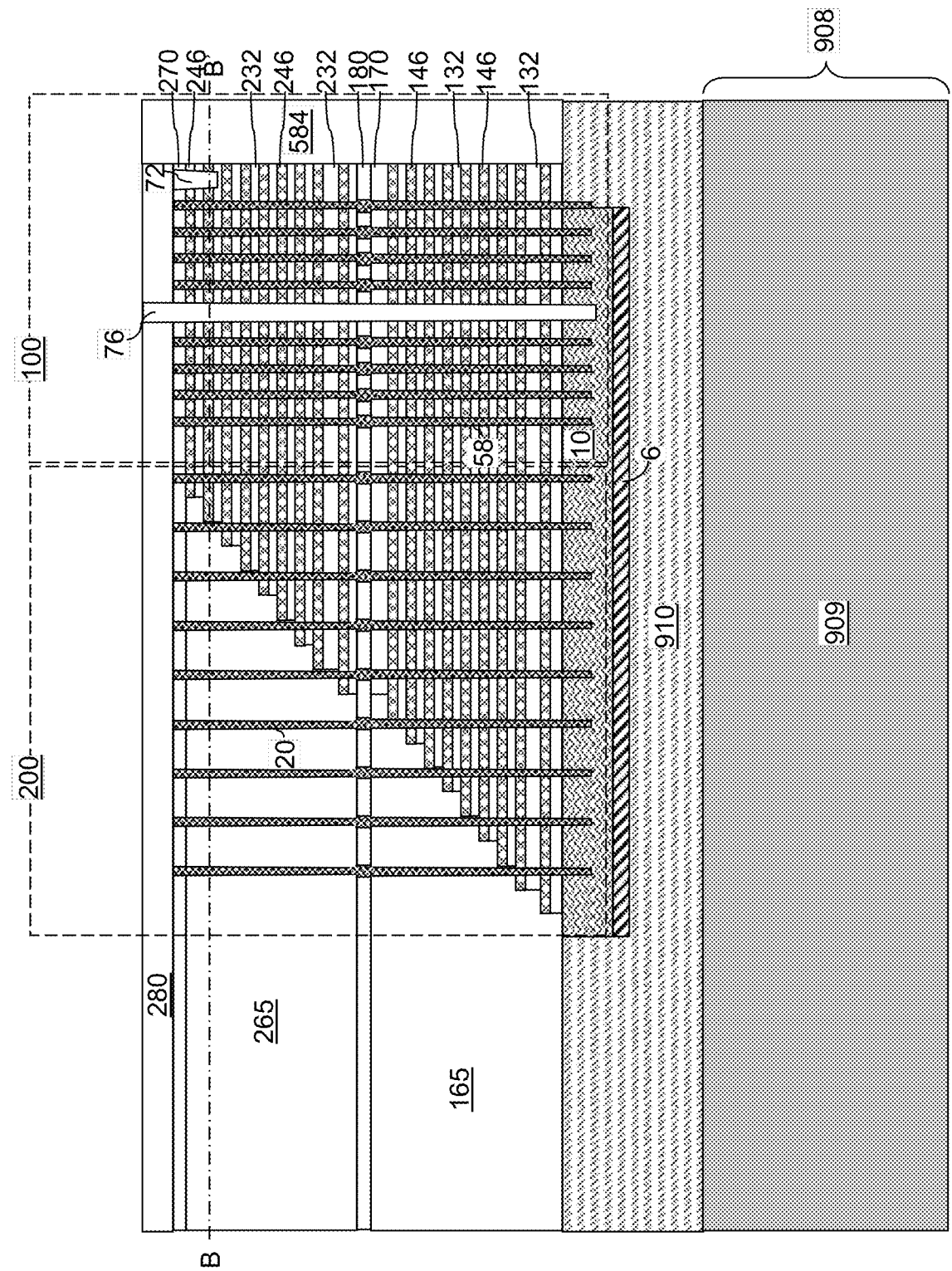
FIG. 16A is a vertical cross-sectional view of the first exemplary structure after formation of backside trench fill structures in the backside trenches according to an embodiment of the present disclosure.
Figure 16B:
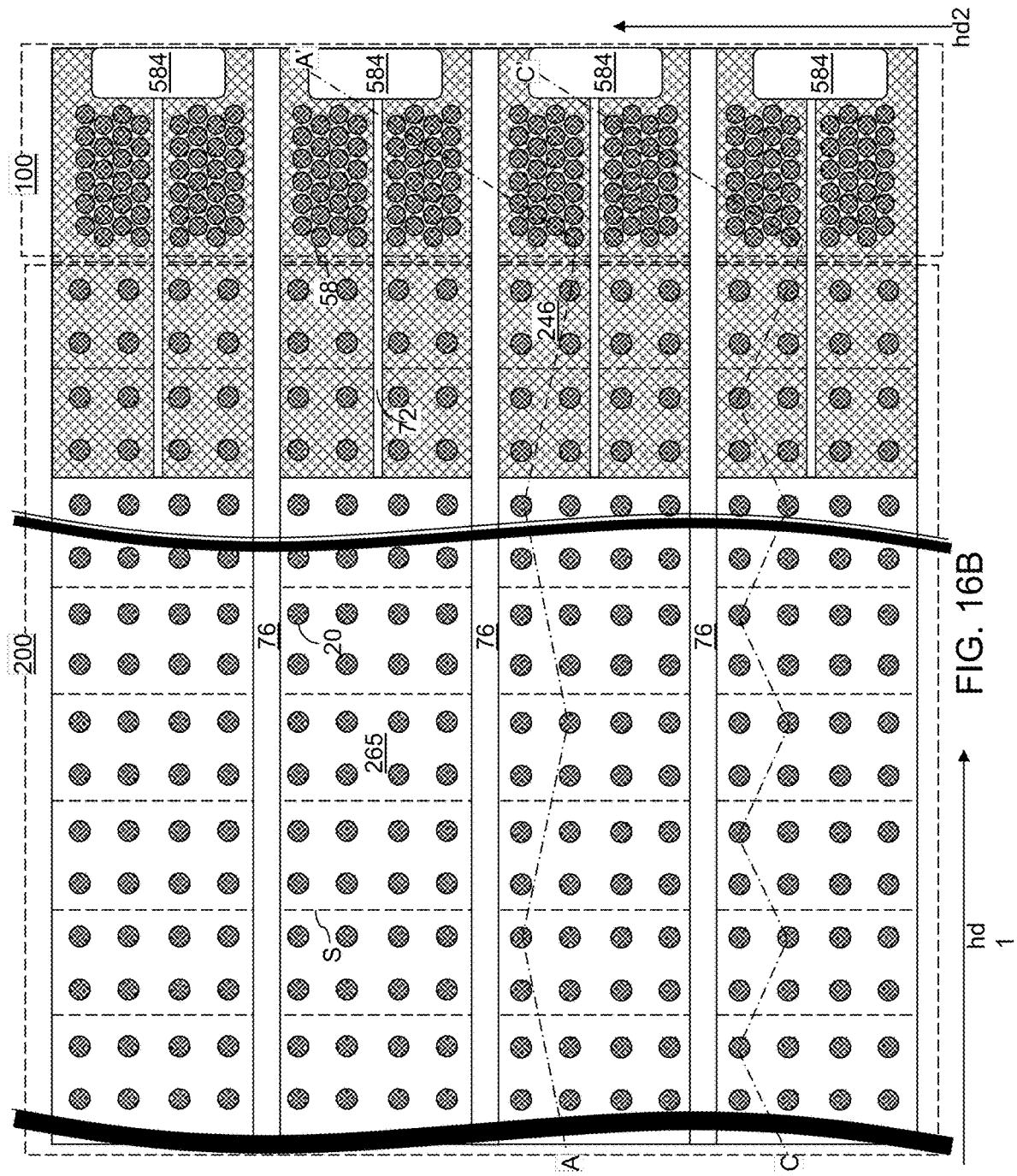
FIG. 16B is a horizontal cross-sectional of the first exemplary structure along the horizontal plane B-B' of FIG. 16A. The hinged vertical plane A-A' corresponds to the plane of the vertical cross-sectional view of FIG. 16A.
Figure 16C:
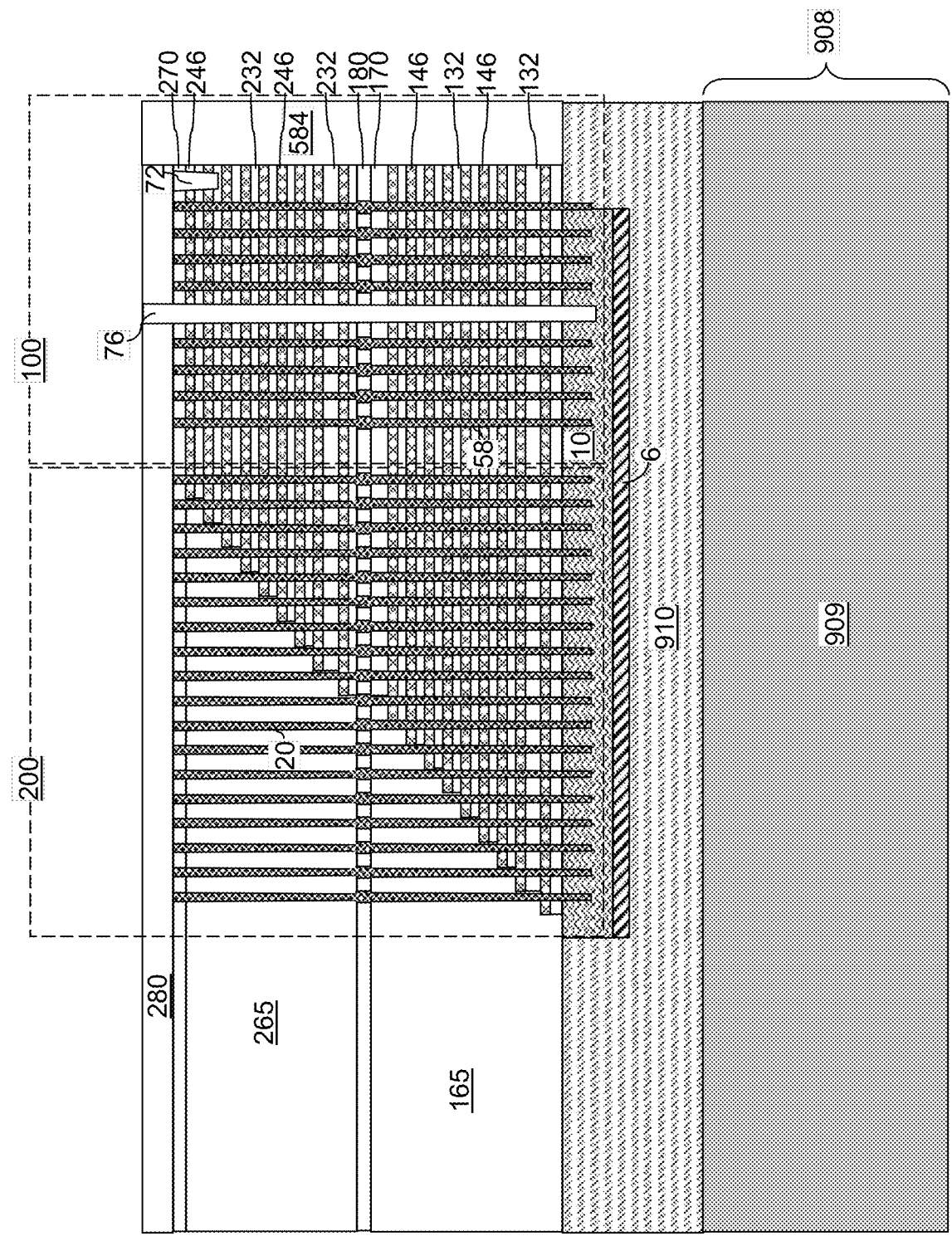
FIG. 16C is a vertical cross-sectional view of the first exemplary structure along the vertical plane C-C' of FIG. 16B.

Referring to FIGS. 16A-16C, a backside trench fill structure 76 may be formed within each backside trench 79. Each backside trench fill structure 76 may consist of at least one dielectric fill material such as silicon oxide, silicon nitride, and/or a dielectric metal oxide material. Alternatively, the backside trench fill structure 76 may include a laterally-insulated source contact via structure that includes a conductive via structure contacting the source semiconductor layer 10 and a dielectric spacer that laterally surrounds the conductive via structure.

Figure 17A:
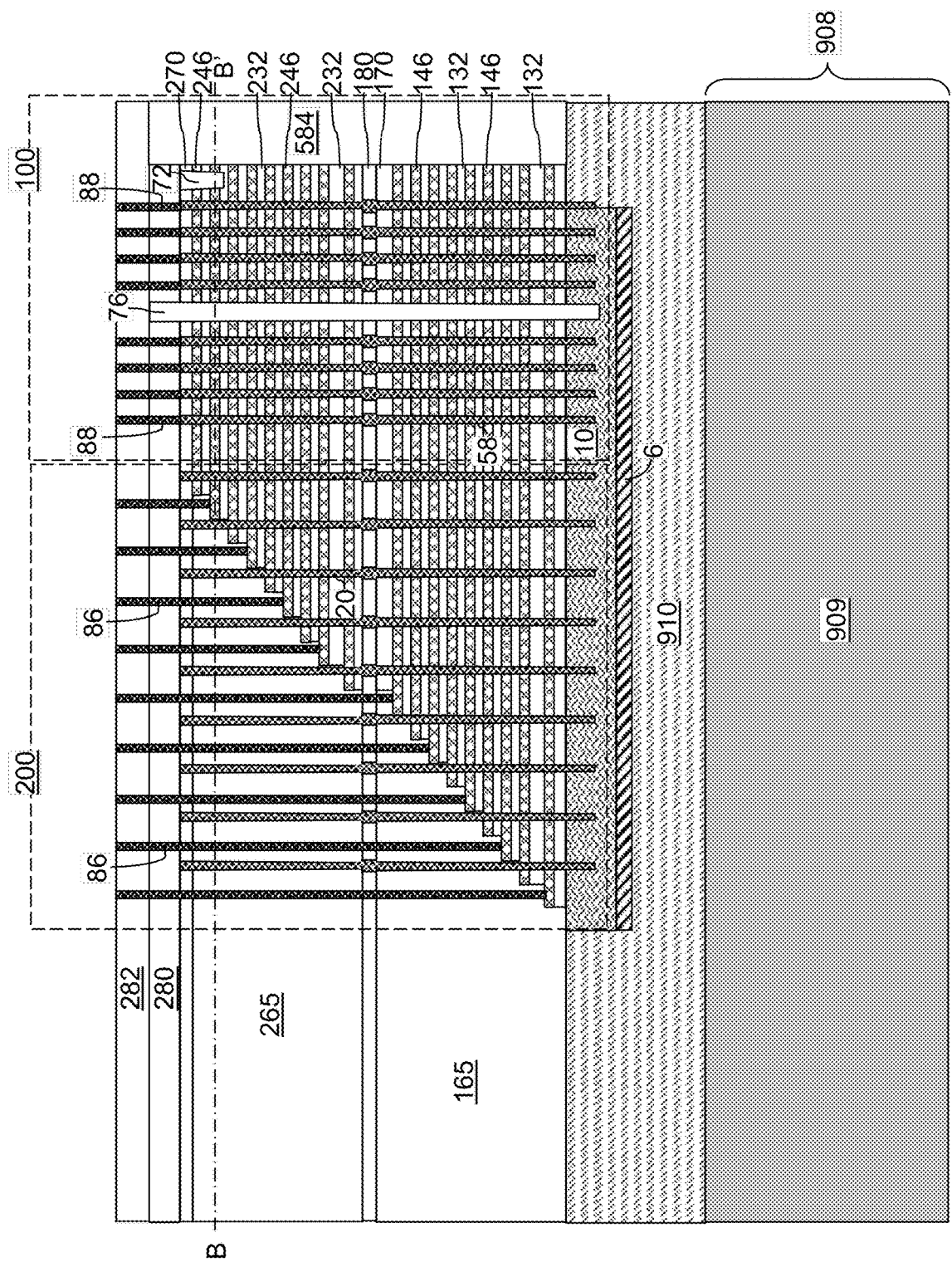
FIG. 17A is a vertical cross-sectional view of the first exemplary structure after formation of a second contact-level dielectric layer and various contact via structures according to an embodiment of the present disclosure.
Figure 17B:
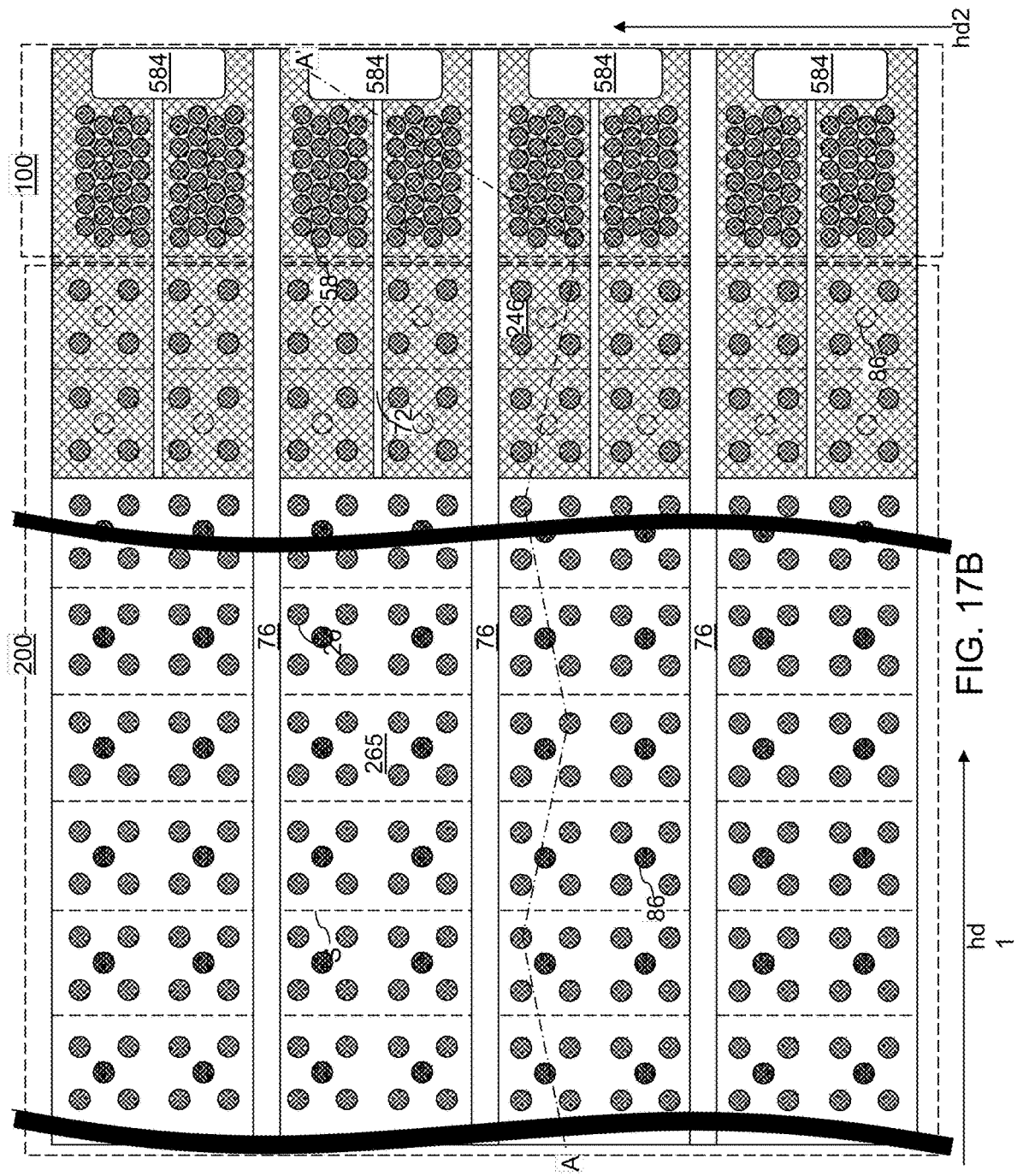
FIG. 17B is a horizontal cross-sectional view of the first exemplary structure along the vertical plane B-B' of FIG. 17A. The hinged vertical plane A-A' corresponds to the plane of the vertical cross-sectional view of FIG. 17A.

Referring to FIGS. 17A and 17B, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures 88 may be formed in the memory array region 100, and openings for forming staircase region contact via structures 86 may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second stepped dielectric material portions (165, 265). The photoresist layer may be subsequently removed, for example, by ashing.

Drain contact via structures 88 may be formed in the drain contact via cavities and on a top surface of a respective one of the drain regions 63. Staircase-region contact via structures 86 may be formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 18:
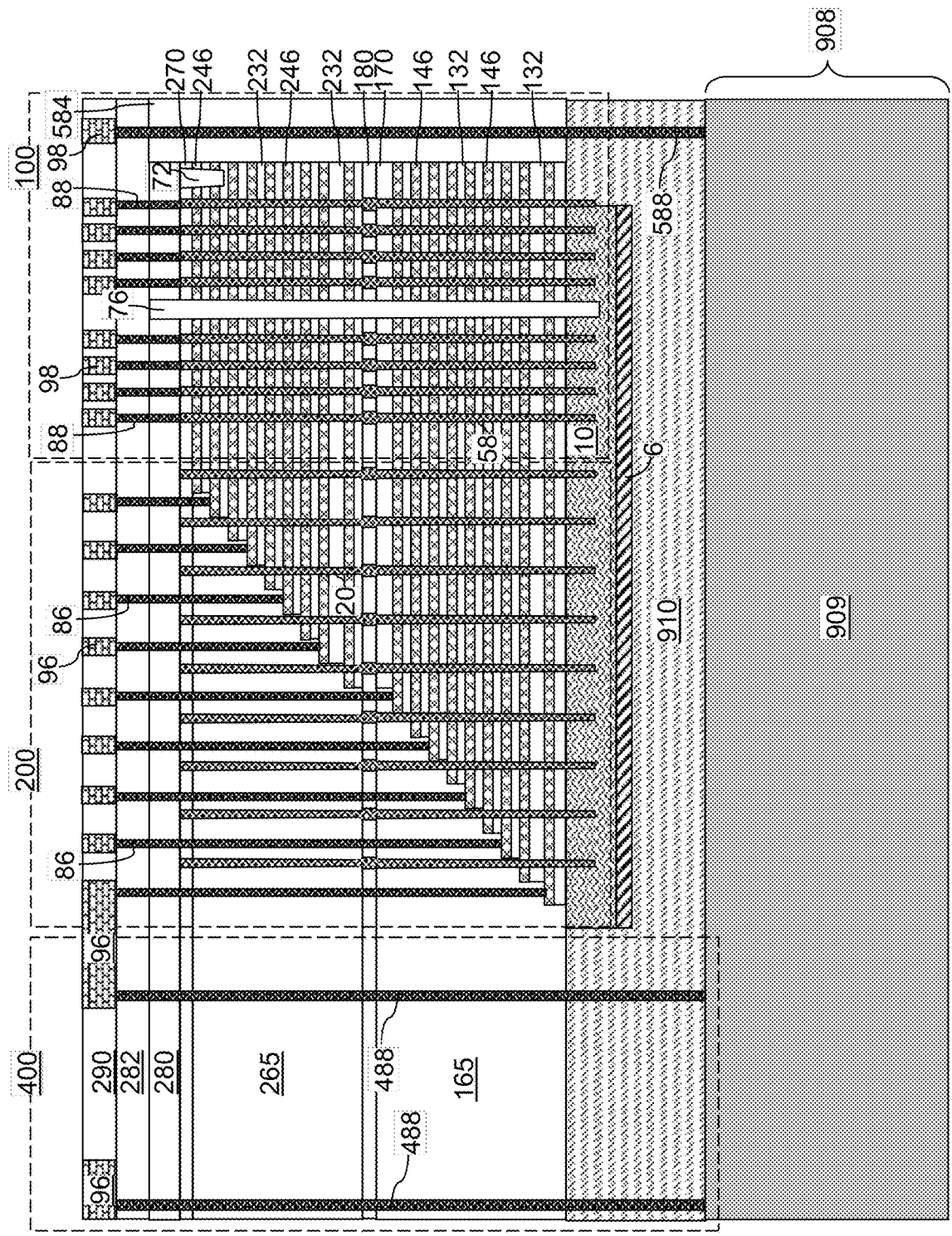
FIG. 18 is a vertical cross-sectional view of the first exemplary structure after formation of through-memory-level via structures and upper metal line structures according to an embodiment of the present disclosure.

Referring to FIG. 18, first through-memory-level via cavities may be formed through the second and first contact-level dielectric layers (282, 280), the second and first stepped dielectric material portions (265, 165), and the array-side dielectric material layer 910 to top surfaces of the carrier substrate layer 909 in the via interconnection region 400. Second through-memory-level via cavities may be formed through the interconnection region dielectric fill material portions 584 and the array-side dielectric material layer 910 to the top surface of the carrier substrate layer 909. At least one conductive material may be deposited in the first through-memory-level via cavities and in the second through-memory-level via cavities. Excess portions of the at least one conductive material may be removed from above the horizontal plane including the top surface of the second contact-level dielectric layer 282. Each remaining portion of the at least one conductive material in a first through-memory-level via cavity constitutes a first through-memory-level via structure 488. Each remaining portion of the at least one conductive material in a second through-memory-level via cavity constitutes a second through-memory-level via structure 588.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the first through-memory-level via structures 488 and/or the second through-memory-level via structures 588.

In one embodiment, the three-dimensional memory device may comprise a monolithic three-dimensional NAND memory device, the electrically conductive strips (146, 246) comprise, or are electrically connected to, a respective word line of the monolithic three-dimensional NAND memory device, the substrate 908 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 908, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 908, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Figure 19:
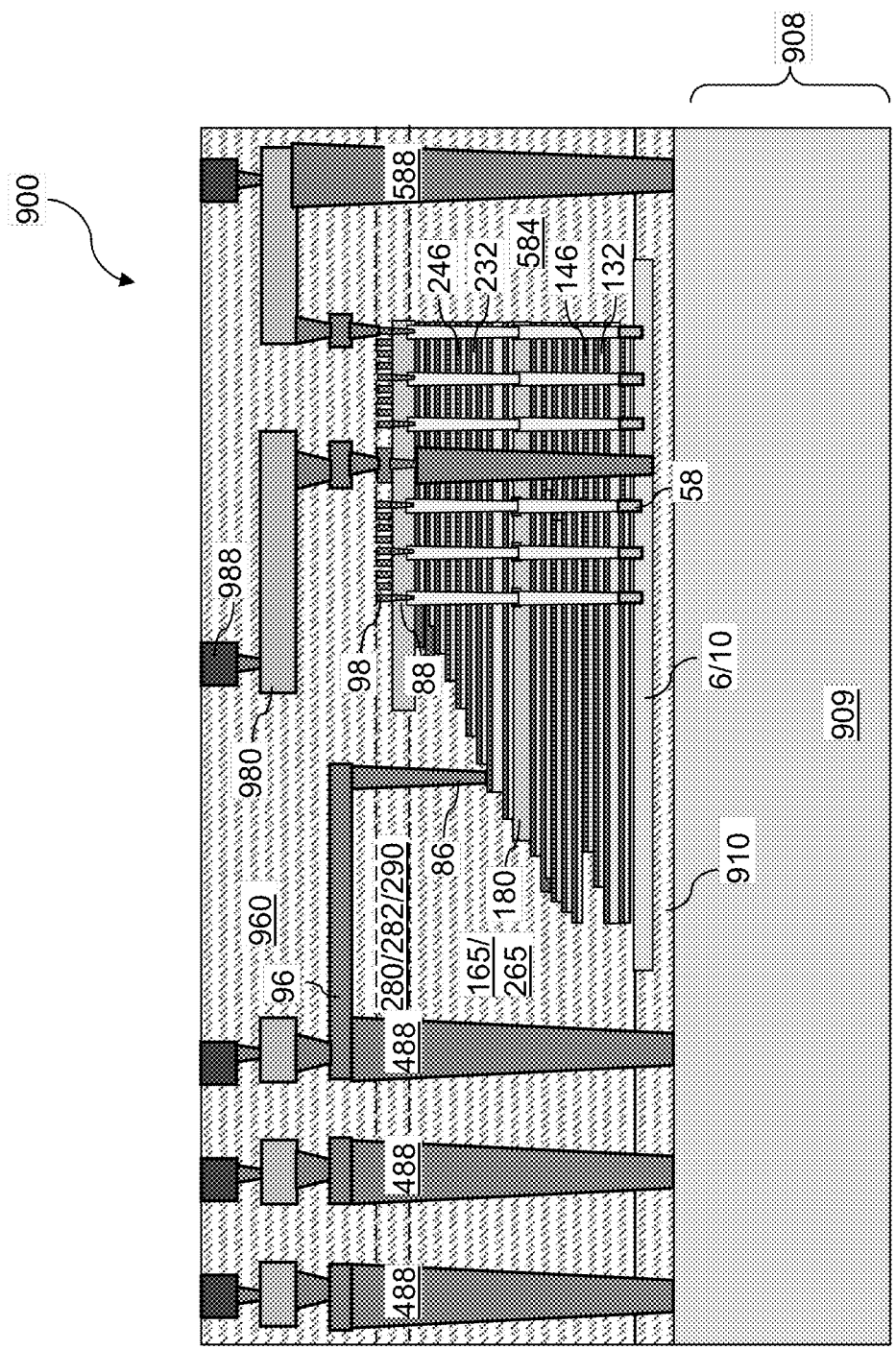
FIG. 19 is a vertical cross-sectional view of another configuration of the first exemplary structure after formation of interconnect-side dielectric material layers and interconnect-side bonding pads according to an embodiment of the present disclosure.

Referring to FIG. 19, interconnect-side dielectric material layers 960 may be deposited over the line-level dielectric layer 290. Various additional memory-die metal interconnect structures 980 may be formed in the interconnect-side dielectric material layers 960. Generally, the various metal interconnect structures (88, 86, 98, 96, 980) may be formed in the combination of the first contact-level dielectric layer 280, the second contact-level dielectric layer 282, the line-level dielectric layer 290, and the interconnect-side dielectric material layers 960 with appropriate shifting of metal interconnect levels. The thickness of the interconnect-side dielectric material layers 960 may be in a range from 300 nm to 3,000 nm, although lesser and greater thicknesses may also be used.

Pad cavities may be formed in the upper portion of the additional memory-die metal interconnect structures 980 such that a respective one of the memory-die metal interconnect structures 980 is exposed at the bottom of each pad cavity. In one embodiment, the pad cavities may be arranged as a one-dimensional array or as a two-dimensional array, and may have a respective polygonal, circular, elliptical, or generally-curvilinear shape.

A conductive material may be deposited in the pad cavities to form various interconnect-side bonding pads 988. The interconnect-side bonding pads 988 may include source-network interconnect-side bonding pads electrically connected to the source semiconductor layer 10, word-line-connection interconnect-side bonding pads that are electrically connected to a respective one of the electrically conductive layers (146, 246) that function word lines, and bit-line-connection interconnect-side bonding pads that are electrically connected to the bit lines 98. The first exemplary structure comprises a memory die 900.

A plurality of memory dies 900 may be provided. Each of the memory dies 900 may include an alternating stack of insulating layers (132, 232) and word lines comprising a subset of the electrically conductive layers (146, 246). The alternating stack {(132, 146), (232, 246)} has stepped surfaces in which a subset of the electrically conductive layers (146, 246) has a lateral extent that increases with a distance from a bonding surface of the memory die 900 including the interconnect-side bonding pads 988. Memory stack structures 55 vertically extend through the alternating stack {(132, 146), (232, 246)}. Each of the memory stack structures 55 include a respective vertical semiconductor channel 60 and a respective set of vertically stacked memory elements located at levels of the electrically conductive layers (146, 246). Each set of vertically stacked memory elements may include portions of a charge storage layer 54 located at the levels of the electrically conductive layers (146, 246). Word line contact via structures (which are a subset of staircase-region contact via structures 86 that contact a subset of the electrically conductive layers (146, 246) that function as word lines) may contact a respective one of the word lines. Each of the word line contact via structures vertically extend from a respective one of the word lines toward the bonding surface of the memory die 900.

Multiple instances of the memory die 900 may be provided with an identical design, or with variations in one or more interconnect level layouts, which may be provided by using a different reticle including the variations in a respective interconnect level layout during lithographic exposure processes. In embodiments in which multiple instances of the memory die 900 may be provided, the multiple instances of the memory die 900 are herein referred to as a first memory die (or a first die), a second memory die (or a second die), a third memory die (or a third die), etc. A three-dimensional memory device in the first memory die is herein referred to as a first three-dimensional memory device, a three-dimensional memory device in the second memory die is herein referred to as a second three-dimensional memory device, etc. The alternating stack of insulating layers (132, 232) and electrically conductive layers (146, 246) in the first memory die is herein referred to as a first-die alternating stack of first-die insulating layers and first-die electrically conductive layers, the alternating stack of insulating layers (132, 232) and electrically conductive layers (146, 246) in the second memory die is herein referred to as a second-die alternating stack of second-die insulating layers and second-die electrically conductive layers, and so on. The interconnect-side dielectric material layers 960 in the first memory die is herein referred to as first-die interconnect-side dielectric material layers, the interconnect-side dielectric material layers 960 in the second memory die is herein referred to as second-die interconnect-side dielectric material layers, and so on. The interconnect-side bonding pads 988 in the first memory die is herein referred to as first-die interconnect-side bonding pads, the interconnect-side bonding pads 988 in the second memory die is herein referred to as second-die interconnect-side bonding pads, and so on. Within each memory die 900, the interconnect-side bonding pads 988 are formed in the interconnect-side dielectric material layers 960, and are located on the alternating stack {(132, 146), (232, 246)} and on an opposite side of the semiconductor substrate of the respective memory die 900. The interconnect-side bonding pads 988 are electrically connected to nodes of the three-dimensional memory device in the memory die 900. In one embodiment, areas of the interconnect-side bonding pads 988 may overlap with the areas of the first through-memory-level via structure 488 and the second through-memory-level via structure 588 in a plan view, i.e., in a view along a direction that is perpendicular to the interface between the source semiconductor layer 10 and the alternating stack {(132, 146), (232, 246)}.

Figure 20:
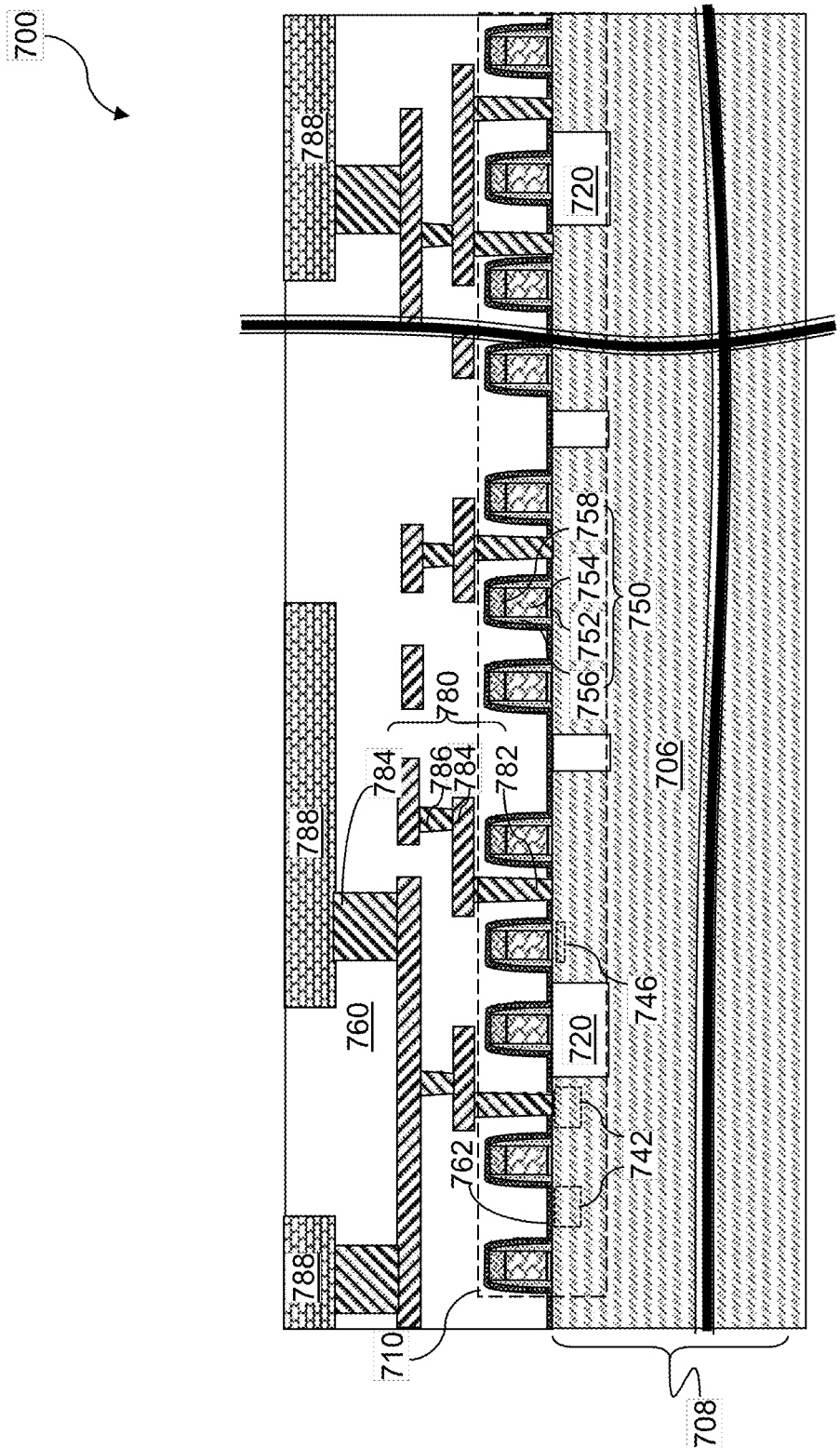
FIG. 20 is a vertical cross-sectional view of a support die according to an embodiment of the present disclosure.

Referring to FIG. 20, a support die 700 may be provided, which comprises various semiconductor devices 710 formed on a support-die substrate 708. The support-die substrate 708 includes a support-die semiconductor layer 706. The support-die semiconductor layer 706 may include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

The semiconductor devices 710 includes a peripheral circuitry for operation of the three-dimensional memory arrays in the memory die 900. The peripheral circuitry may include a word line driver that drives word lines of the three-dimensional memory array (comprising the electrically conductive layers (146, 246)) within the memory die 900, a bit line driver that drives the bit lines 98 in the memory die 900, a word line decoder circuit that decodes the addresses for the electrically conductive layers (146, 246), a bit line decoder circuit that decodes the addresses for the bit lines 98, a sense amplifier circuit that senses the states of memory elements within the memory stack structures 55 in the memory die 900, a source power supply circuit that provides power to the source semiconductor layer 10 in the memory die 900, a data buffer and/or latch, or any other semiconductor circuit that may be used to operate the array of memory stack structures 55 in the memory die 900.

Shallow trench isolation structures 720 may be provided in a surface region of the support-die semiconductor layer 706 to provide electrical isolation from semiconductor devices of the peripheral circuitry. The various semiconductor devices 710 may include field effect transistors, which include respective transistor active regions 742 (i.e., source regions and drain regions), a channel 746, and a gate structure 750. The field effect transistors may be arranged in a CMOS configuration. Each gate structure 750 may include, for example, a gate dielectric 752, a gate electrode 754, a dielectric gate spacer 756 and a gate cap dielectric 758. For example, the semiconductor devices 710 may include word line drivers for electrically biasing word lines of the memory die 900, which comprise the electrically conductive layers (146, 246), and source power supply field effect transistors that generate power to be supplied to the source semiconductor layer in the memory die 900

Dielectric material layers may be formed over the semiconductor devices 710, which are herein referred to as support-die dielectric layers 760. Optionally, a dielectric liner 762 (such as a silicon nitride liner) may be formed to apply mechanical stress to the various field effect transistors and/or to prevent diffusion of hydrogen or impurities from the Support-die dielectric layers 760 into the semiconductor devices 710. Support-die metal interconnect structures 780 are formed within the support-die dielectric layers 760. The support-die metal interconnect structures 780 may include various device contact via structures 782 (e.g., source and drain electrodes which contact the respective source and drain nodes of the device or gate electrode contacts), interconnect-level metal line structures 784, interconnect-level metal via structures 786, and support-die bonding pads 788. The support-die bonding pads 788 may be configured to mate with the interconnect-side bonding pads 988 of a memory die 900, or to array-side bonding pads to be subsequently formed on a memory die 900, to provide electrically conductive paths between the memory die 900 and the support die 700.

In one embodiment, the semiconductor devices 710 of the support die 700 may include complementary metal-oxide-semiconductor (CMOS) devices. In one embodiment, the peripheral circuitry may include a peripheral circuitry configured to drive multiple memory dies 900. In one embodiment, the support-die bonding pads 788 may be electrically connected to a first subset of the peripheral circuitry that is configured to drive a first instance of the memory die 900 (i.e., a first memory die). A second subset of the peripheral circuitry may be configured to drive a second instance of the memory die 900 (i.e., a second memory die). At least one additional subset of the peripheral circuitry may be configured to drive a respective additional instance of the memory die 900 (i.e., an additional memory die).

Figure 21:
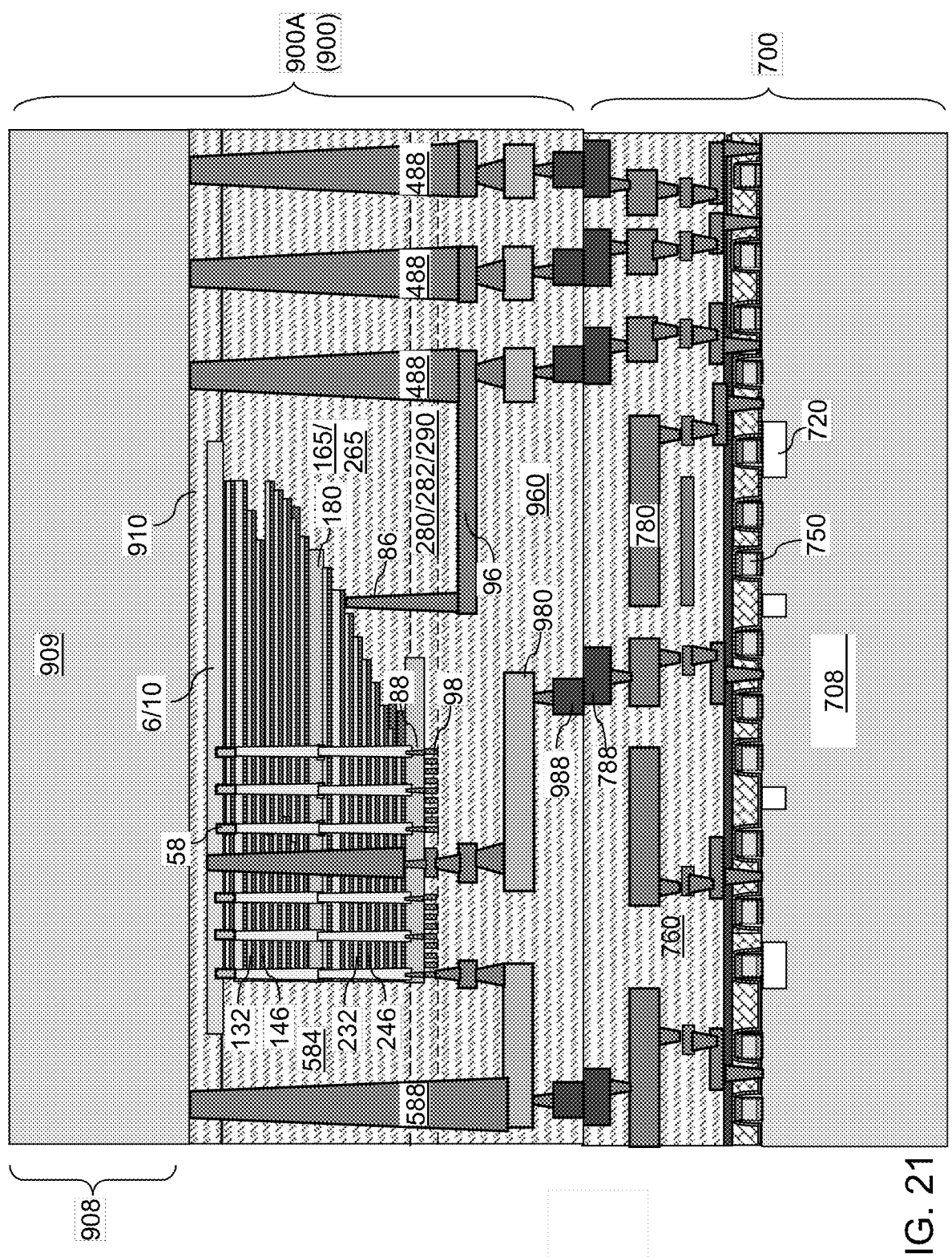
FIG. 21 is a vertical cross-sectional view of a first exemplary bonded assembly according to an embodiment of the present disclosure.

Referring to FIG. 21, a first exemplary bonded assembly according to an embodiment of the present disclosure is illustrated, which may be formed by bonding the interconnect-side bonding pads 988 of a first memory die 900A (which is an instance of a memory die 900) to the support-die bonding pads 788 of a support die 700. Metal-to-metal bonding may be used to bond the first memory die 900A to the support die 700.

Figure 22:
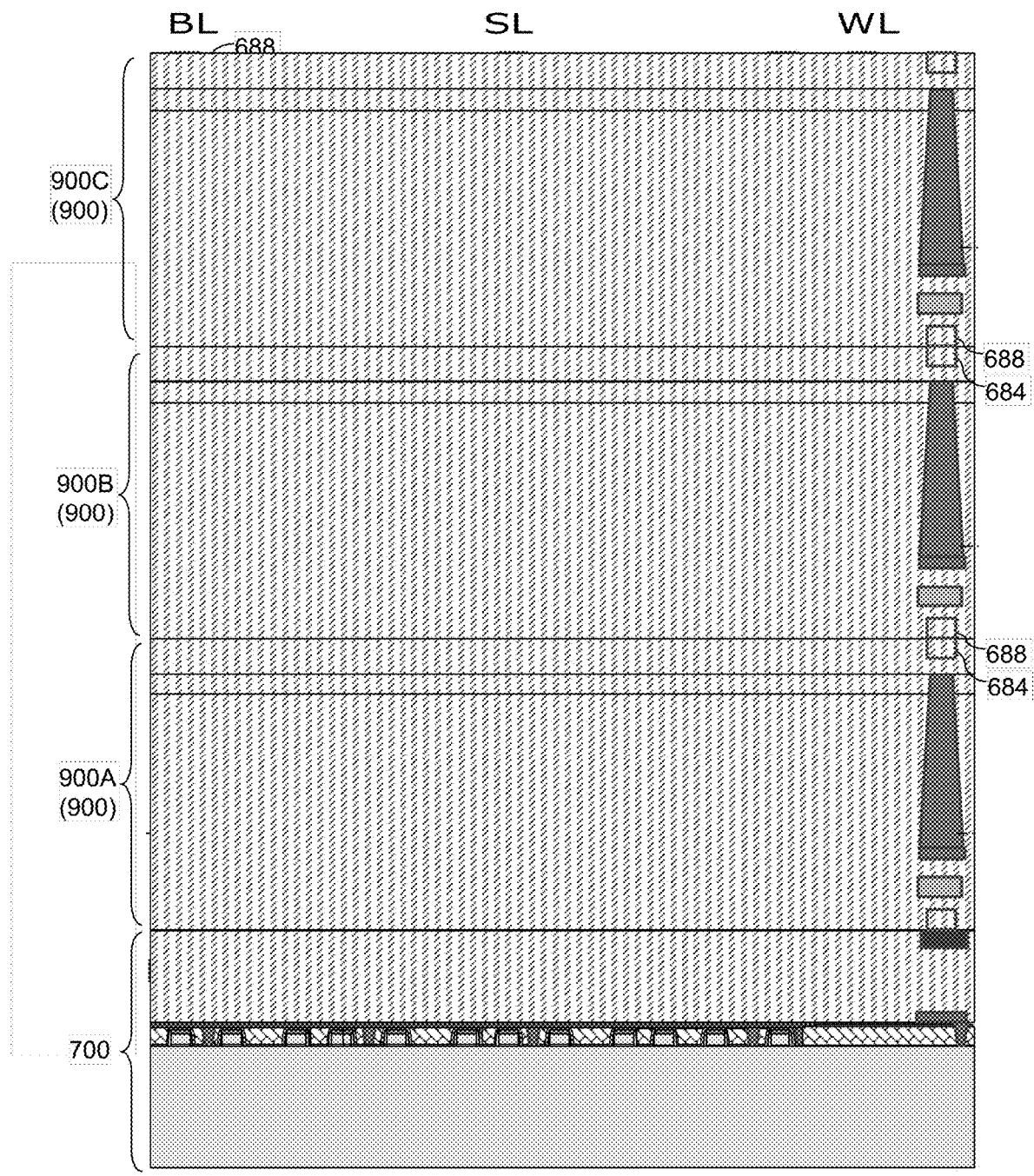
FIG. 22 is a vertical cross-sectional view of the first exemplary bonded assembly after bonding three memory dies according to an embodiment of the present disclosure.
Figure 23:
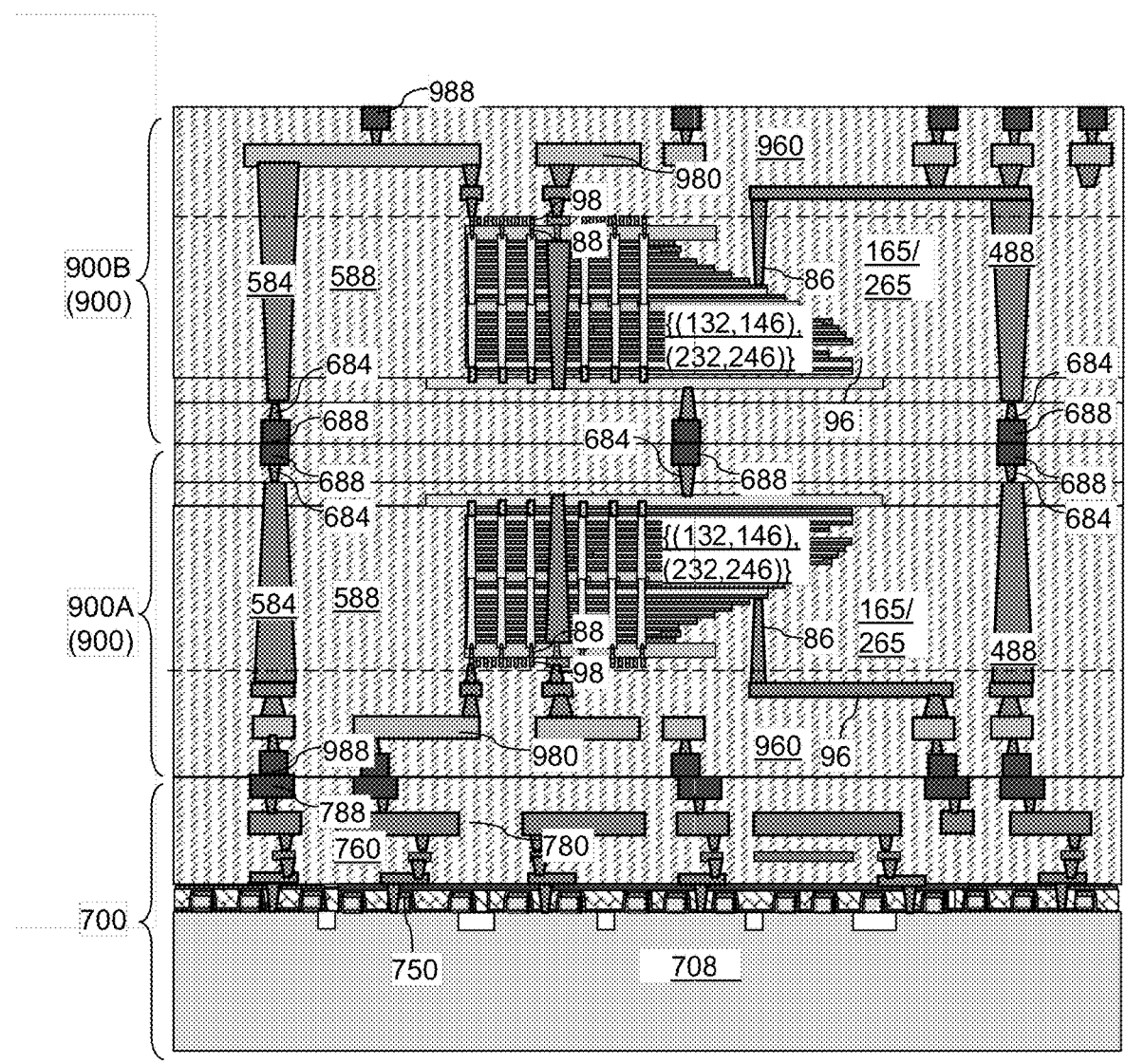
FIG. 23 is a vertical cross-sectional view of a second exemplary bonded assembly according to an embodiment of the present disclosure.

Referring to FIG. 22, the carrier substrate 908 may be removed from the first exemplary bonded assembly (700, 900A). In an illustrative example, a combination of a grinding process and a touch-up wet etch process may be used to remove the carrier substrate 908. The grinding process may remove a predominant portion of the carrier substrate 908, and the touch-up wet etch process may apply a chemical that removes the material of the carrier substrate layer 909 selective to the material of the array-side dielectric material layer 910. For example, if the carrier substrate layer 909 includes silicon, a wet etch process using a KOH solution may be used to remove the carrier substrate layer 909 selective to the material of the array-side dielectric material layer 910.

Array-side connection via structures 684 may be formed through the array-side dielectric material layer 910 on a respective array-side end surfaces of the first through-memory-level via structure 488 and the second through-memory-level via structure 588. Array-side bonding pads 688 may be formed directly on a respective one of the array-side connection via structures 684. The array-side connection via structures 684 and the array-side bonding pads 688 may be formed using two single damascene processes or using a dual damascene process. For example, via cavities may be formed through the array-side dielectric material layer 910, and line cavities may be formed with areal overlaps with the via cavities and with a lesser depth before, or after, formation of the via cavities to provide integrated line and via cavities. At least one conductive liner material (such as an underbump metallurgy (UBM) stack) and a metallic bonding material (such as copper) may be sequentially deposited in the integrated line and via cavities to form combinations of an array-side connection via structure 684 and an array-side bonding pad 688. The pattern of the array-side bonding pads 688 may be a mirror image pattern of the interconnect-side bonding pads 988. The areas of the array-side bonding pads 688 may overlap with the areas of the interconnect-side bonding pads 988. The array-side bonding pads 688 are physically exposed one the side of the first memory die 900A.

Additional instances of the memory die 900 may be provided, which may include a second memory die 900B and a third memory die 900C with a respective carrier substrate 908. In case pattern of the array-side bonding pads 688 is a mirror image pattern of the interconnect-side bonding pads 988, the additional instances of the memory die 900 may be stacked on top of the first memory die 900A such that sidewalls of the additional instances of the memory die 900 are aligned, i.e., located within same two-dimensional planes, as the sidewalls of the first memory die 900A.

For example, the second memory die 900B may be bonded to the first memory die 900A after removal of the carrier substrate 908 from the first memory die 900A. In this case, the interconnect-side bonding pads 988 of the second memory die 900B may be bonded to the array-side bonding pads 688 of the first memory die 900A by metal-to-metal bonding. The carrier substrate 908 of the second memory die 900B may be subsequently removed from the second memory die 900B, for example, by grinding and/or etching. Array-side connection via structures 684 and array-side bonding pads 688 may be formed through the array-side dielectric material layer 910 of the second memory die 900B using a same set of processing steps that are used to form the array-side connection via structures 684 and the array-side bonding pads 688 in the first memory die 900A.

Subsequently, the third memory die 900C may be bonded to the second memory die 900B after formation of the array-side connection via structures 684 and the array-side bonding pads 688 in the second memory die 900B. In this case, the interconnect-side bonding pads 988 of the third memory die 900C may be bonded to the array-side bonding pads 688 of the second memory die 900B by metal-to-metal bonding. The carrier substrate 908 of the third memory die 900C may be subsequently removed from the third memory die 900C, for example, by grinding and/or etching. Array-side connection via structures 684 and array-side bonding pads 688 may be formed through the array-side dielectric material layer 910 of the third memory die 900C using a same set of processing steps that are used to form the array-side connection via structures 684 and the array-side bonding pads 688 in the first memory die 900A.

The stacking of the additional instances of the memory die 900 may continue until a target number of instances of the memory die 900 is stacked on the support die 700. A first subset of the array-side bonding pads 688 may be connected to the source semiconductor layers 10 within the memory dies 900 through a first subset of the metal interconnect structures within the memory dies 900, and may be connected to a source power supply circuit within the support die 700. At least one array-side bonding pads 688 selected from the first subset of the array-side bonding pads 688 may be physically exposed on one side of the topmost memory die in a region labeled "SL." A second subset of the array-side bonding pads 688 may be connected to a respective set of bit lines 98 within each of the memory dies 900 through a second subset of the metal interconnect structures within the memory dies 900, and may be connected to a bit line driver circuit and a sense circuit within the support die 700. At least one array-side bonding pads 688 selected from the second subset of the array-side bonding pads 688 may be physically exposed on one side of the topmost memory die in a region labeled "BL." A third subset of the array-side bonding pads 688 may be connected to a respective set of at least one word (comprising the electrically conductive layers (146, 246)) within each of the memory dies 900 through a third subset of the metal interconnect structures within the memory dies 900, and may be connected to a word line driver circuit within the support die 700. At least one array-side bonding pads 688 selected from the third subset of the array-side bonding pads 688 may be physically exposed on one side of the topmost memory die in a region labeled "WL."

Within each memory die 900, array-side bonding pads 688 are formed in the array-side dielectric material layer 910 on the alternating stack {(132, 146), (232, 246)} of the respective memory die 900 and on an opposite side of the interconnect-side bonding pads 988 of the same memory die 900. Within each memory die 900, the array-side bonding pads 688 are electrically connected to a respective one of the interconnect-side bonding pads 988 through a respective subset of metal interconnect structures provided within the memory die 900. At least one subset of metal interconnect structures passes through, and directly contacts, a respective set of dielectric material portions (such as a combination of array-side dielectric material layer 910, stepped dielectric material portions (165, 265), and interconnect-side dielectric material layers 960 or a combination of array-side dielectric material layer 910, interconnection region dielectric fill material portions 584, and interconnect-side dielectric material layers 960) that extend from the interconnect-side bonding pads 988 to the array-side bonding pads 688 without contacting any semiconductor material portion therebetween.

Referring to FIG. 26, a second exemplary bonded assembly according to an embodiment of the present disclosure is illustrated, which may be derived from the first exemplary bonded assembly illustrated in FIG. 21 by removing the carrier substrate 908 of the first memory die 900A. A combination of a grinding process and a touch-up wet etch process may be used to remove the carrier substrate 908 of the first memory die 900A. Array-side connection via structures 684 and array-side bonding pads 688 may be formed through the array-side dielectric material layer 910 of the first memory die 900A using the processing steps described above. The array-side bonding pads 688 are physically exposed one the side of the first memory die 900A.

A second memory die 900B may be provided. An interconnect-side surface of the second memory die 900B including the interconnect-side bonding pads 988 may be attached to a temporary carrier substrate (not shown), for example, using an adhesive layer. A combination of a grinding process and a touch-up wet etch process may be used to remove the carrier substrate 908 of the second memory die 900B. Array-side connection via structures 684 and array-side bonding pads 688 may be formed through the array-side dielectric material layer 910 of the second memory die 900B. The array-side bonding pads 688 are physically exposed one the side of the second memory die 900B. The array-side bonding pads 688 of the second memory die 900B may be bonded to the array-side bonding pads 688 of the first memory die 900A by metal-to-metal bonding. The temporary carrier substrate may be detached from the bonded assembly of the support die 700, the first memory die 900A, and the second memory die 900B by removing the adhesive layer, for example, by dissolving in a solvent.

In an alternative configuration, a temporary carrier substrate may be bonded to the interconnect-side surface of the first memory die 900A, and array-side connection via structures 684 and array-side bonding pads 688 may be formed through the array-side dielectric material layer 910 of the first memory die 900A. The array-side bonding pads 688 of the first memory die 900A may be bonded to the support-side bonding pads 788 of a support die 700, and the temporary carrier substrate may be subsequently removed. At least another memory die such as a second memory die 900B may be bonded to the first memory die 900A. For example, second-die array-side bonding pads 688 and the second-die interconnect-side bonding pads 988 of the second die 900B may be bonded to the first-die interconnect-side bonding pads 988 of the first memory die 900A.

Referring to all drawings and according to various embodiments of the present disclosure, a bonded assembly comprising a first memory die 900A and a support die 700 bonded to the first memory die 900A is provided. The first memory die 900A comprises: a first three-dimensional memory device comprising a first-die alternating stack of first-die insulating layers (132. 232) and first-die electrically conductive layers (146, 246); first-die interconnect-side bonding pads 988 formed in first-die interconnect-side dielectric material layers 960 located on a first side of the first-die alternating stack {(132. 146), (232, 246)} and electrically connected to nodes of the first three-dimensional memory device; and first-die array-side bonding pads 688 formed in first-die array-side dielectric material layer 910 located on a second side of the first-die alternating stack {(132. 146), (232, 246)} and electrically connected to a respective one of the first-die interconnect-side bonding pads 988 through a respective subset of first-die metal interconnect structures (86, 88, 96, 98, 980, 488, 588, 684), wherein at least one subset of first-die metal interconnect structures {(684, 488, 96, 980) or (684, 588, 980)} passes through, and directly contacts, a respective set of dielectric material portions {(910, 165, 265, 960, 180, 270, 280, 282, 290) or (910, 584, 960, 282, 290)} that extend from the first-die interconnect-side bonding pads 988 to the first-die array-side bonding pads 688 without contacting any semiconductor material portion (such as a source semiconductor layer 10); wherein the support die 700 comprises a peripheral circuitry configured to control operation of the first three-dimensional memory device and comprises support-die bonding pads 788 electrically connected to various nodes of the peripheral circuitry; and wherein the support-die bonding pads 788 are bonded to a set of bonding pads selected from the first-die array-side bonding pads 688 and the first-die interconnect-side bonding pads 988.

In one embodiment, each set of dielectric material portions {(910, 165, 265, 960, 180, 270, 280, 282, 290) or (910, 584, 960, 282, 290)} extends between a respective electrically connected pair of a first-die array-side bonding pad 688 and a first-die interconnect-side bonding pad 988.

In one embodiment, each subset of first-die metal interconnect structures {(684, 488, 96, 980) or (684, 588, 980)} consists of metal line structures and metal via structures.

In one embodiment, the first three-dimensional memory device comprises a first three-dimensional array of memory elements formed within the first-die alternating stack {(132. 146), (232, 246)} and located at each level of the first-die electrically conductive layers (146, 246), for example, as portions of charge storage layers 54 located at the levels of the first-die electrically conductive layers (146, 246).

In one embodiment, the first three-dimensional array of memory elements is located within a two-dimensional array of memory stack structures 55, wherein each of the memory stack structures 55 comprises a respective vertical semiconductor channel 60 and a respective vertical stack of memory elements extending through the first-die alternating stack {(132. 146), (232, 246)} and located adjacent to the respective vertical semiconductor channel 60.

In one embodiment, the first memory die 900A comprises a doped semiconductor layer (such as a source semiconductor layer 10) electrically connected to a first end portion of each of the vertical semiconductor channels 60, wherein the doped semiconductor layer is laterally offset from each set of dielectric material portions {(910, 165, 265, 960, 180, 270, 280, 282, 290) or (910, 584, 960, 282, 290)}.

In one embodiment, the first memory die 900A comprises: at least one array-side connection via structure 684 formed in the first-die array-side dielectric material layer 910 and electrically connecting the doped semiconductor layer (such as a source semiconductor layer 10) to one of the first-die array-side bonding pads 688; and bit lines 98 formed in the first-die interconnect-side dielectric material layers 960 and electrically connected to a second end portion of a respective subset of the vertical semiconductor channels 60 and a respective one of the first-die interconnect-side bonding pads 988.

In one embodiment, the first-die alternating stack {(132, 146), (232, 246)} comprises stepped surfaces in a terrace region in which the first-die electrically conductive layers (146, 246) have a respective lateral extent that decreases with a vertical distance from a Euclidean plane including bonding surfaces of the first-die array-side bonding pads 688; the first memory die 900A comprises a stepped dielectric material portion (165 or 265) that contacts a respective subset of the first-die insulating layers (132, 232) in the terrace region; and at least one of the sets of dielectric material portions (910, 165, 265, 960, 180, 270, 280, 282, 290) comprises the stepped dielectric material portion (165 or 265).

In one embodiment, the bonded assembly further comprises a second memory die 900B bonded to the first memory die 900A. The second memory die 900B comprises a second three-dimensional memory device comprising a second-die alternating stack of second-die insulating layers (132, 232) and second-die electrically conductive layers (146, 246), the peripheral circuitry of the support die 700 is configured to control operation of the second three-dimensional array of memory elements, and the sets of first-die metal interconnect structures (86, 88, 96, 98, 980, 488, 588, 684) within the first memory die 900A provide electrically conductive paths between the peripheral circuitry and nodes of the second three-dimensional memory device in the second memory die 900B.

In one embodiment, the first three-dimensional memory device comprises a set of first word lines (comprising electrically conductive layers (146, 246) in the first memory die 900A) and a set of first bit lines 98; the set of first word lines comprises portions of the first-die electrically conductive layers (146, 246); the set of first bit lines 98 is formed in the first-die interconnect-side dielectric material layers 960; the second three-dimensional memory device comprises a set of second word lines (comprising electrically conductive layers (146, 246) in the second memory die 900B) and a set of second bit lines 98; the set of second word lines 98 comprises portions of the second-die electrically conductive layers (146, 246); and the set of second bit lines 98 is formed in second-die interconnect-side dielectric material layers 960 in the second memory die 900B.

In one embodiment, the second memory die 900B comprises: second-die interconnect-side bonding pads 988 formed in second-die interconnect-side dielectric material layers 960 located on a first side of the second-die alternating stack {(132, 146), (232, 246)} and electrically connected to nodes of the second three-dimensional memory device; and second-die array-side bonding pads 688 formed in second-die array-side dielectric material layer 910 located on a second side of the second-die alternating stack {(132, 146), (232, 246)} and electrically connected to a respective one of the second-die interconnect-side bonding pads 988 through a respective subset of second-die metal interconnect structures (86, 88, 96, 98, 980, 488, 588, 684), wherein at least one subset of second-die metal interconnect structures {(684, 488, 96, 980) or (684, 588, 980)} passes through, and directly contacts, a respective set of dielectric material portions {(910, 165, 265, 960, 180, 270, 280, 282, 290) or (910, 584, 960, 282, 290)} that extend from the second-die interconnect-side bonding pads 988 to the second-die array-side bonding pads 688 without contacting any semiconductor material portion (such as a source semiconductor layer 10).

Figure 24:
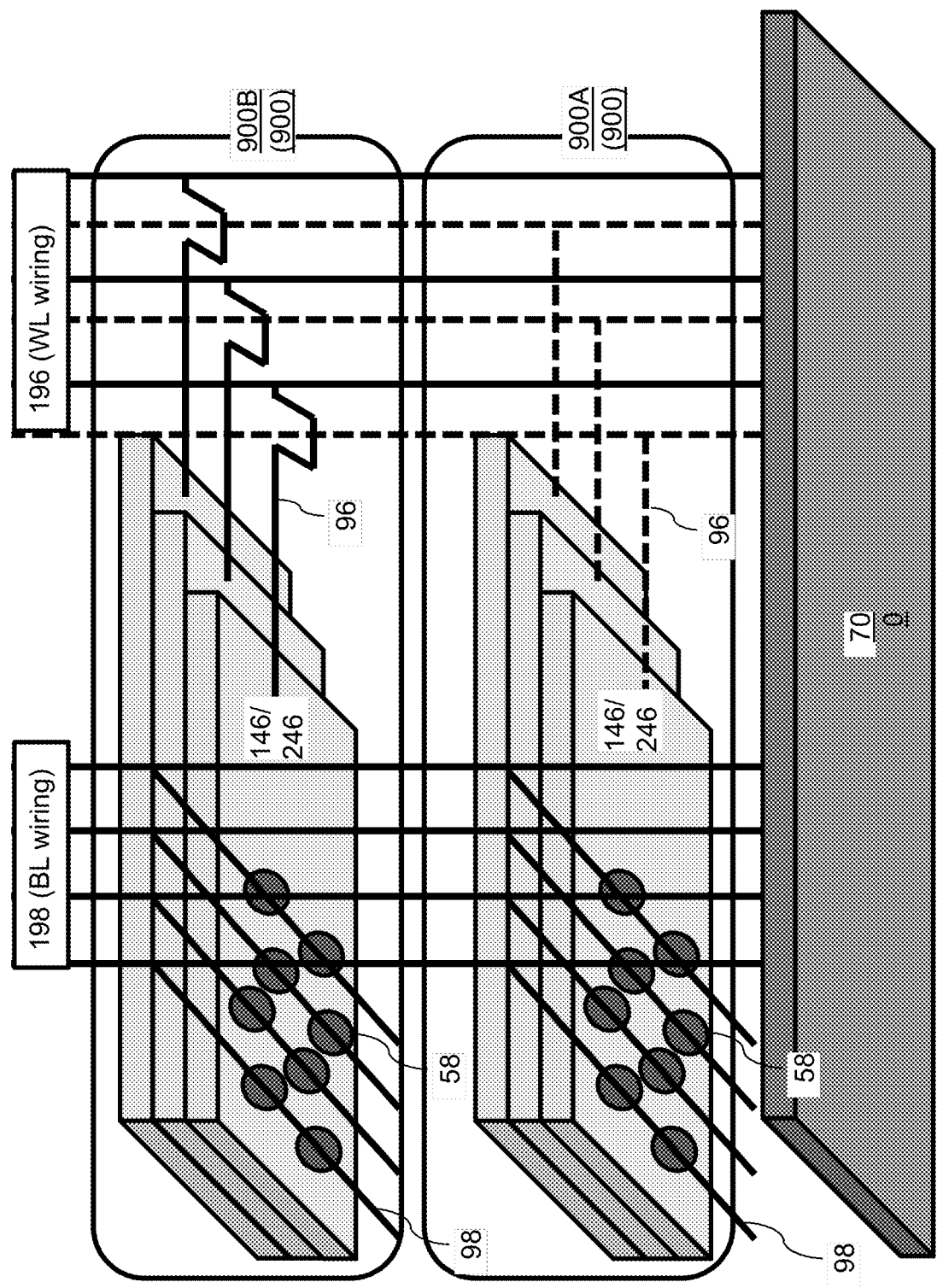
FIG. 24 illustrates a first exemplary interconnection configuration that may be used for the bonded assemblies of the present disclosure.
Figure 25:
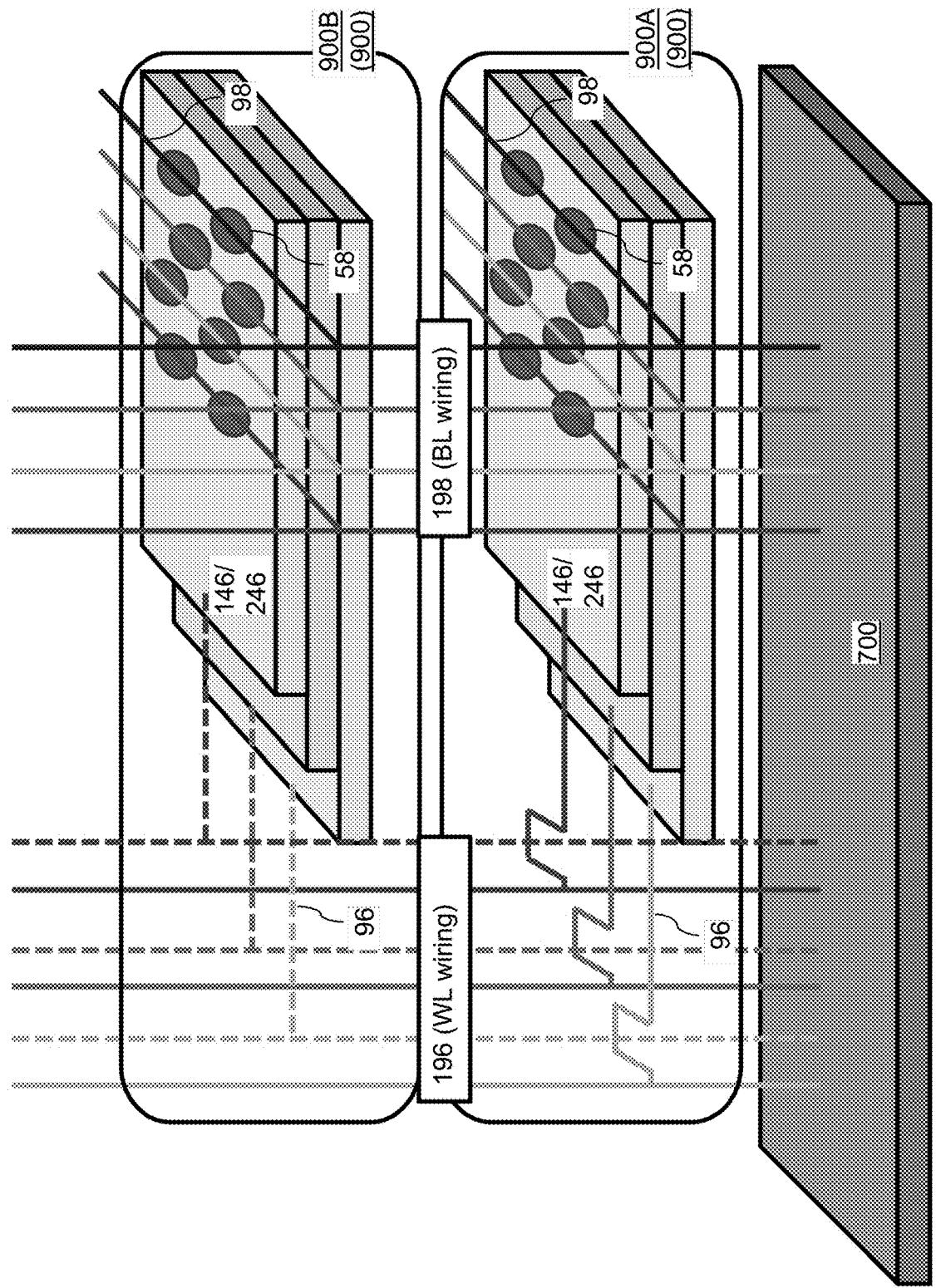
FIG. 25 illustrates a first exemplary interconnection configuration that may be used for the bonded assemblies of the present disclosure.

Referring to FIGS. 24 and 25, a first exemplary interconnection configuration is illustrated, which may be used for the bonded assemblies of the present disclosure. In the first exemplary interconnection configuration, bit line wiring 198 and word line wiring 196 are configured such that the bit line wiring 198 is shared across multiple memory dies 900, while the word line wiring 198 is specific to each memory die 900. In other words, bit lines 98 in multiple memory dies 900 are driven by electrical signals transmitted through a common set of metal interconnect structures, while word lines in different memory dies 900 are driven by electrical signals transmitted through a different set of metal interconnect structures. As used herein, bit line wiring 198 refers to a set of all metal interconnect structures 980 that are electrically connected to the bit lines 98 of the memory dies 900 in a bonded assembly (700, 900). As used herein, word line wiring 196 refers to a set of all metal interconnect structures 980 that are electrically connected to the word lines (comprising electrically conductive layers (146, 246)) of the memory dies 900 in a bonded assembly (700, 900). In this case, each first bit line 98 within the set of first bit lines 98 in the first memory die 900A is electrically connected to a respective second bit line 98 within the set of second bit lines 98 in the second memory die 900B by a combination of a respective subset of first metal interconnect structures 980 formed in the first-die interconnect-side dielectric material layers 960, a respective subset of second metal interconnect structures 980 formed in the second-die interconnect-side dielectric material layers 960, and a respective pair of bonding pads {(988, 688), (988, 988), or (688, 688)} located at an interface between the first memory die 900A and the second memory die 900B.

A second exemplary interconnection configuration may be used in lieu of the first exemplary interconnection configuration. In the second exemplary interconnection configuration, bit line wiring 198 and word line wiring 196 are configured such that word line wiring 196 is shared across multiple memory dies 900, while the bit line wiring 198 is specific to each memory die 900. In other words, word lines in multiple memory dies 900 are driven by electrical signals transmitted through a common set of metal interconnect structures, while bit lines 98 in different memory dies 900 are driven by electrical signals transmitted through a different set of metal interconnect structures. Each first word line within the set of first word lines (comprising an electrically conductive layer (146, 246) in the first memory die 900A) is electrically connected to a respective second word line of the set of second word lines (comprising an electrically conductive layer (146, 246) in the second memory die 900B) by a combination of a respective subset of first metal interconnect structures 980 formed in the first-die interconnect-side dielectric material layers 960, a respective subset of second metal interconnect structures 980 formed in the second-die interconnect-side dielectric material layers 960, and a respective pair of bonding pads {(988, 688), (988, 988), or (688, 688)} located at an interface between the first memory die 900A and the second memory die 900B.

Referring to FIG. 26, an exemplary scheme for implementing the first exemplary interconnection configuration illustrated in FIGS. 24 and 25 is illustrated. The array-side bonding pads 688 and the interconnect-side bonding pads 988 may be arranged as a periodic one-dimensional array or a periodic two-dimensional array having a uniform center-to-center pitch. A vertical connection through a memory die 900 may include a respective set of an interconnect-side bonding pad 988, one or more metal interconnect structures 980 formed in an interconnect-side dielectric material layers 960, and interconnection line structures 96, a first through-memory-level via structure 488 or a second through-memory-level via structure 588, an array-side connection via structures 684, and an array-side bonding pad 688. The interconnect-side bonding pad 988 and the array-side bonding pad 688 may be laterally offset from each other along the direction of the uniform center-to-center pitch by an offset distance that is the same as the uniform center-to-center pitch or is an integer multiple of the uniform center-to-center pitch.

Referring to FIG. 27, a schematic vertical cross-sectional view of metal interconnect structures is shown for a bonded assembly including multiple memory dies 900 that are configured to provide independent word line control for the multiple memory dies 900. The multiple memory dies 900 may have an identical design at all design levels, i.e., may be identical in structure. The staggered vertical connection for the word lines provide control of word lines in different memory dies 900 by selecting a support-side bonding pad 788 to transmit a control signal to the first memory die 900A. For example, one bonding pad selected from the four bonding pads labeled "Die 0 WL pad," "Die 1 WL pad," "Die 2 WL pad," and "Die 3 WL pad" may be selected for word line control signal transmission, and a selected memory die 900 may be activated for control depending on the selection of the bonding pad through staggered connection of the word line signals.

In one embodiment, the second-die interconnect-side bonding pads 988 have a same pattern as the first-die interconnect-side bonding pads 988, and the second-die array-side bonding pads 688 and the first-die array side bonding pads 688 have a mirror image pattern of the pattern of the second-die interconnect-side bonding pads 988. In one embodiment, all memory dies 900 within a bonded assembly (700, 900A, 900B, 900C, 900D, etc.) may have the same structure. Alternatively, different metal wiring may be provided in different memory dies 900 by alternating metal wiring only in selected wiring levels, which may be a single metal wiring level or two metal wiring levels, for example. IN one embodiment, the second-die metal interconnect structures 980 and the first-die metal interconnect structures 980 include a greater total number of layout levels having a common interconnect layout than a total number of layout levels having different interconnect layouts.

The various embodiments of the present disclosure provide stacking of multiple memory dies 900 without significant modification to metal wiring in the multiple memory dies 900, or with no modification in metal wiring across the multiple memory dies 900. In addition, the various embodiments of the present disclosure increase the bit density by stacking of plurality memory dies on a support die without the need to use expensive through substrate vias (TSV). The various embodiments of the present disclosure allow for a number of cell wafers to be stacked with a relatively easy process. Various embodiments may use shared bit lines or shared word lines or a combination thereof. Other embodiments may not use any shared bit lines or shared word lines. Thus, the various embodiments provide a memory device with increased density at a lower cost.

Figure 28A:
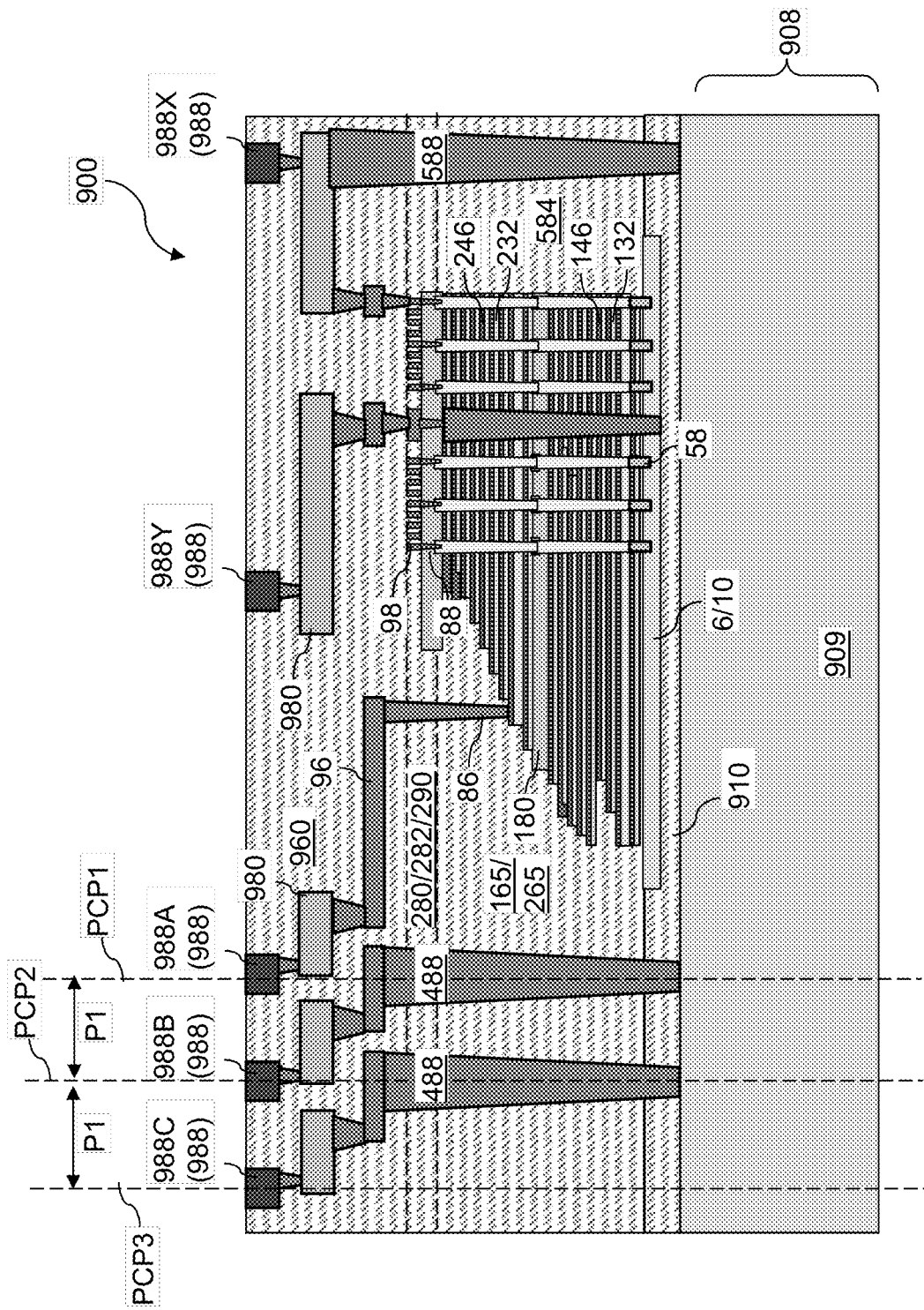
FIG. 28A is a schematic vertical cross-sectional view of a memory die according to a second embodiment of the present disclosure.
Figure 28B:
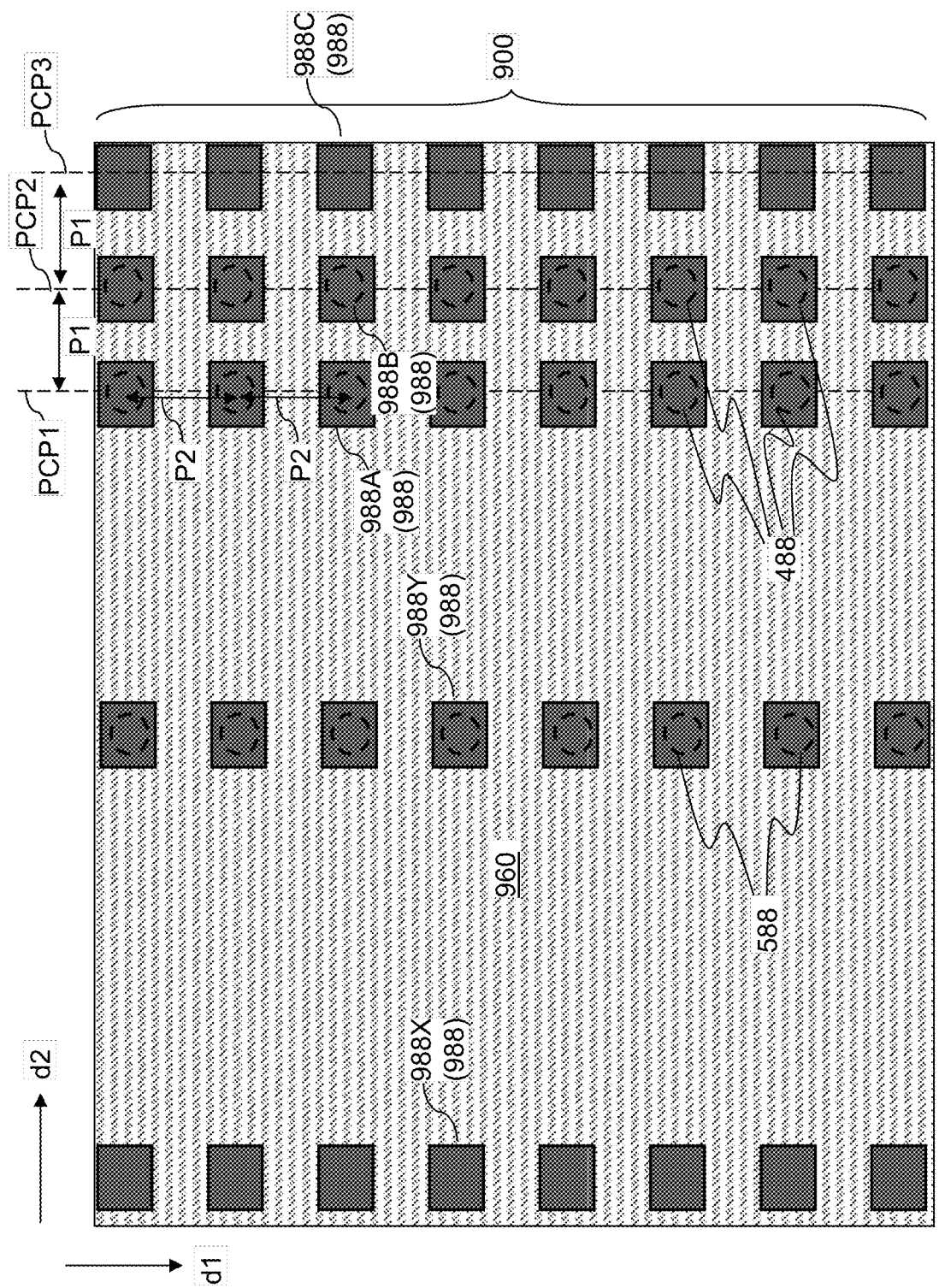
FIG. 28B is a top-down view of the memory die of FIG. 28A.

Referring to FIGS. 28A and 28B, a memory die 900 according to a second embodiment of the present disclosure is illustrated, which can be derived from the memory die 900 in FIG. 18 by alternating the layout of the first through-memory-level via structure 488 and optionally, the layout of the second through-memory-level via structures 588. Specifically, the first through-memory-level via structures 488 can be arranged as multiple rows that are parallel to one another. In one embodiment, the center-to-center distance between each neighboring pair of rows can be the same, which is herein referred to as an inter-row pitch P1. In one embodiment, the inter-row pitch P1 of the rows of first through-memory-level via structures 488 can be the same as the inter-row pitch for rows of interconnect-side bonding pads that may be subsequently formed.

In one embodiment, each row of first through-memory-level via structures 488 can be formed as a one-dimensional periodic array of first through-memory-level via structures 488 having a periodic pitch, which is herein referred to as an intra-row pitch P2. The intra-row pitch P2 of the first through-memory-level via structures 488 can be the same as an intra-row pitch for the interconnect-side bonding pads to be subsequently formed. In one embodiment, the first through-memory-level via structures 488 can be formed as a two-dimensional periodic array, such as a rectangular array, in which the first through-memory-level via structures 488 are arranged in multiple rows that extend parallel to the first horizontal direction hd1 or the second horizontal direction hd2.

The layout of the second through-memory-level via structures 588 may be arranged such that each of the second through-memory-level via structures 588 are formed within areas in which additional interconnect-side bonding pads are to be subsequently formed.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the first through-memory-level via structures 488 and/or the second through-memory-level via structures 588. A combination of interconnect-side dielectric material layers 960 and memory-die metal interconnect structures 980 can be subsequently formed over the line-level dielectric layer 290 by performing the processing steps of FIG. 19.

The pattern of the upper-level metal interconnect structures (96, 98) and the memory-die metal interconnect structures 980 may be selected such that each electrically conductive path including a first through-memory-level via structure 488 is laterally shifted along a direction perpendicular to the rows of the first through-memory-level via structures 488 by the inter-row pitch P1. In embodiments in which the first through-memory-level via structures 488 may be arranged as a rectangular periodic array, each electrically conductive path including a first through-memory-level via structure 488 may not be shifted along a direction parallel to the rows of the first through-memory-level via structures 488. In embodiments in which the first through-memory-level via structures 488 may be arranged as a hexagonal periodic array, each electrically conductive path including a first through-memory-level via structure 488 may be shifted along a direction parallel to the rows of the first through-memory-level via structures 488 by one half of the intra-row pitch P2.

Pad cavities may be formed in the upper portion of the additional memory-die metal interconnect structures 980 such that a respective one of the memory-die metal interconnect structures 980 is exposed at the bottom of each pad cavity. In one embodiment, the pad cavities may be arranged as a one-dimensional array or as a two-dimensional array, and may have a respective polygonal, circular, elliptical, or generally-curvilinear shape. A conductive material may be deposited in the pad cavities to form various interconnect-side bonding pads 988. The interconnect-side bonding pads 988 may include source-network interconnect-side bonding pads electrically connected to the source semiconductor layer 10, word-line-connection interconnect-side bonding pads that are electrically connected to a respective one of the electrically conductive layers (146, 246) that function word lines, and bit-line-connection interconnect-side bonding pads that are electrically connected to the bit lines 98.

The various metal interconnect structures (88, 86, 98, 96, 980) may be formed in the combination of the first contact-level dielectric layer 280, the second contact-level dielectric layer 282, the line-level dielectric layer 290, and the interconnect-side dielectric material layers 960 with such that electrical connections including a first through-memory-level via structure 488 is laterally shifted by the inter-row pitch P1 along the direction perpendicular to the horizontal lengthwise direction of each row of first through-memory-level via structures 488.

The interconnect-side bonding pads 988 may include in-array interconnect-side bonding pads (988A, 988B, 988C) that are arranged as rows of bonding pads having a uniform inter-row pitch P1 throughout, straight-connection interconnect-side bonding pads 988X that are electrically connected to, and has an areal overlap in a plan view with, a respective one of the second through-memory-level via structure 488, and detoured-connection interconnect-side bonding pads 988Y that may be electrically connected to, but is laterally shifted from, a respective one of the second through-memory-level via structures 588 or a respective one of the first through-memory-level via structures 488.

The in-array interconnect-side bonding pads (988A, 988B, 988C) may be arranged as a periodic two-dimensional array of bonding pads, and may include first-row interconnect-side bonding pads 988A that are most proximal to a memory array region 100, second-row interconnect-side bonding pads 988B that are laterally shifted from the first-row interconnect-side bonding pads 988A by the inter-row pitch P1 away from the memory array region 100, third-row interconnect-side bonding pads 988C that are laterally shifted from the second-row interconnect-side bonding pads 988B by the inter-row pitch P1 away from the memory array region 100, and so on.

The metal interconnect structures (88, 86, 98, 96, 980) provide electrical connections between the first through-memory-level via structures 488 that have an areal overlap with the in-array interconnect-side bonding pads (988A, 988B, 988C) and overlying in-array interconnect-side bonding pads (988A, 988B, 988C) except one outermost row of in-array interconnect-side bonding pads (988A, 988B, 988C). For example, each row of in-array interconnect-side bonding pads (988A, 988B, 988C) other than an outermost row of in-array interconnect-side bonding pads (988A, 988B, 988C) can be electrically connected to a respective row of first through-memory-level via structures 488.

The outermost row of in-array interconnect-side bonding pads (988A, 988B, 988C) that are not electrically connected to the first through-memory-level via structures 488 may be the first-row interconnect-side bonding pads 988A or an outermost row of in-array interconnect-side bonding pads located at an opposite side of the first-row interconnect-side bonding pads 988A. The outermost row of in-array interconnect-side bonding pads (988A, 988B, 988C) that are not electrically connected to the first through-memory-level via structures 488 can be electrically connected to nodes of a three-dimensional memory device in the memory die 900. In one embodiment, the outermost row of in-array interconnect-side bonding pads (988A, 988B, 988C) that are not electrically connected to the first through-memory-level via structures 488 can be electrically connected to the word lines of the three-dimensional memory array, which may comprise the electrically conductive layers (146, 246). Alternatively, the outermost row of in-array interconnect-side bonding pads (988A, 988B, 988C) that are not electrically connected to the first through-memory-level via structures 488 can be electrically connected to the bit lines 98 of the three-dimensional memory array.

In an alternative embodiment, the electrical connection between the in-array interconnect-side bonding pads (988A, 988B, 988C) and the first through-memory-level via structures 488 may be shifted by m times the inter-row pitch P1, in which m is an integer greater than 1. In this case, m rows of in-array interconnect-side bonding pads (988A, 988B, 988C) may be used to provide electrical connections to nodes within the three-dimensional memory array of the memory die 900. The nodes within the three-dimensional memory array of the memory die 900 may include the word lines or the bit lines of the three-dimensional memory array.

In one embodiment, a pad center plane can vertically extend through each geometrical center of in-array interconnect-side bonding pads (988A, 988B, 988C) within a row of in-array interconnect-side bonding pads (988A, 988B, 988C). For example, a first pad center plane PCP1 may extend through each geometrical center of the first-row interconnect-side bonding pads 988A, a second pad center plane PCP2 may extend through each geometrical center of the second-row interconnect-side bonding pads 988B, a third pad center plane PCP2 may extend through each geometrical center of the third-row interconnect-side bonding pads 988C, and so on. Each pad center plane (PCP1, PCP2, PCP3) may be a vertical Euclidean plane (i.e., a flat plane without a curvature). Each pad center plane (PCP1, PCP2, PCP3) other than the pad center plane that passes through a most distal row of in-array interconnect-side bonding pads may pass through a respective row of first through-memory-level via structures 488. In one embodiment, each pad center plane (PCP1, PCP2, PCP3) other than the pad center plane that passes through a most distal row of in-array interconnect-side bonding pads can pass through geometrical centers of a respective row of first through-memory-level via structures 488. Neighboring pairs of pad center planes (PCP1, PCP2, PCP3) may be laterally spaced from each other by the inter-row pitch P1.

Each row of the in-array interconnect-side bonding pads (988A, 988B, 988C) may laterally extend horizontally along a first direction d1, which may be the first horizontal direction hd1 or the second horizontal direction hd2 described above. The multiple rows of the in-array interconnect-side bonding pads (988A, 988B, 988C) may be spaced apart along a second direction d2 that is a horizontal direction perpendicular to the first direction d1 with the uniform inter-row pitch P1. In one embodiment, each of the in-array interconnect-side bonding pads (988A, 988B, 988C) may be electrically connected to a respective one of the first through-memory-level via structures 488, and may be laterally offset from the respective one of the first through-memory-level via structures 488 along the second direction d2 by the uniform inter-row pitch P1.

A plurality of memory dies 900 may be provided. Each of the memory dies 900 may include an alternating stack of insulating layers (132, 232) and word lines comprising a subset of the electrically conductive layers (146, 246). The alternating stack {(132, 146), (232, 246)} has stepped surfaces in which a subset of the electrically conductive layers (146, 246) has a lateral extent that increases with a distance from a bonding surface of the memory die 900 including the interconnect-side bonding pads 988. Memory stack structures 55 vertically extend through the alternating stack {(132, 146), (232, 246)}. Each of the memory stack structures 55 may include a respective vertical semiconductor channel 60 and a respective set of vertically stacked memory elements located at levels of the electrically conductive layers (146, 246). Each set of vertically stacked memory elements may include portions of a charge storage layer 54 located at the levels of the electrically conductive layers (146, 246). Word line contact via structures (which are a subset of staircase-region contact via structures 86 that contact a subset of the electrically conductive layers 46 that function as word lines) may contact a respective one of the word lines. Each of the word line contact via structures vertically extend from a respective one of the word lines toward the bonding surface of the memory die 900.

Multiple instances of the memory die 900 may be provided with an identical design. The multiple instances of the memory die 900 are herein referred to as a first memory die (or a first die), a second memory die (or a second die), a third memory die (or a third die), etc. A three-dimensional memory device in the first memory die is herein referred to as a first three-dimensional memory device, a three-dimensional memory device in the second memory die is herein referred to as a second three-dimensional memory device, etc. The alternating stack of insulating layers (132, 232) and electrically conductive layers (146, 246) in the first memory die is herein referred to as a first-die alternating stack of first-die insulating layers and first-die electrically conductive layers, the alternating stack of insulating layers (132, 232) and electrically conductive layers (146, 246) in the second memory die is herein referred to as a second-die alternating stack of second-die insulating layers and second-die electrically conductive layers, and so on. The interconnect-side dielectric material layers 960 in the first memory die is herein referred to as first-die interconnect-side dielectric material layers, the interconnect-side dielectric material layers 960 in the second memory die is herein referred to as second-die interconnect-side dielectric material layers, and so on. The interconnect-side bonding pads 988 in the first memory die is herein referred to as first-die interconnect-side bonding pads, the interconnect-side bonding pads 988 in the second memory die is herein referred to as second-die interconnect-side bonding pads, and so on. Within each memory die 900, the interconnect-side bonding pads 988 are formed in the interconnect-side dielectric material layers 960, and are located on the alternating stack {(132, 146), (232, 246)} and on an opposite side of the semiconductor substrate of the respective memory die 900. The interconnect-side bonding pads 988 are electrically connected to nodes of the three-dimensional memory device in the memory die 900, or may provide electrical connections that pass through the memory die with, or without, lateral shift in electrical connections.

Figure 29:
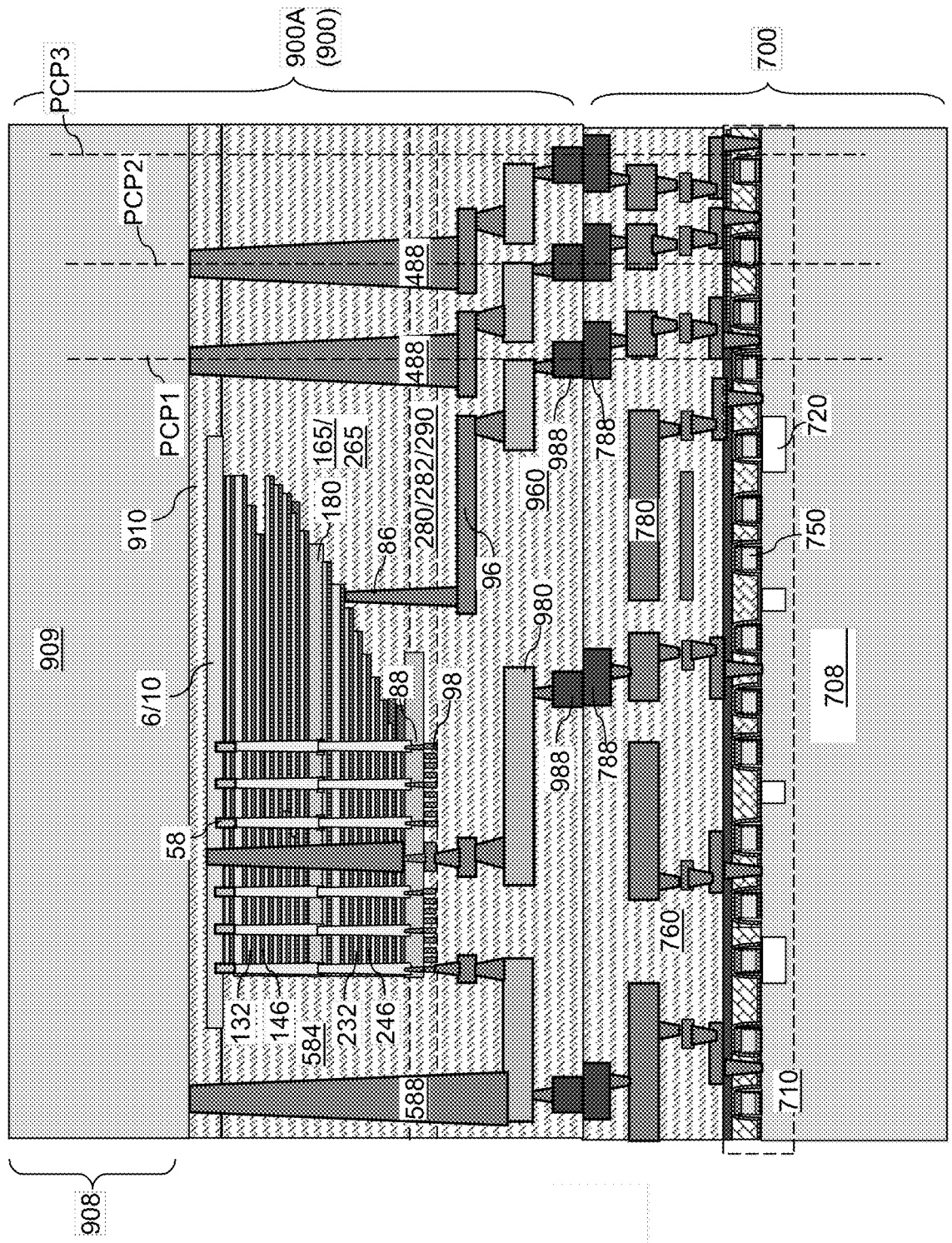
FIG. 29 is a vertical cross-sectional view of a second exemplary bonded structure after bonding a first memory die to a support die according to an embodiment of the present disclosure.

Referring to FIG. 29, a support die 700 may be provided, which can be the same as the support die illustrated in FIG. 20 with modifications in the pattern of the support-die metal interconnect structures 780 and in the pattern for the support-die bonding pads 788. The pattern for the support-die bonding pads 788 may be modified to match a mirror image of the pattern for the interconnect-side bonding pads 988 of each memory die 900. The pattern of the support-die metal interconnect structures 780 may be modified to provide electrically conductive paths between the various nodes of the semiconductor devices, such as field effect transistors, on the top surface of the support-die substrate 708.

The support die 700 may include semiconductor devices 710, which includes a peripheral circuitry configured to control memory stack structures 55 in a first three-dimensional memory array of a first memory die 900A to be subsequently attached thereto, memory stack structures 55 in a second three-dimensional memory array of a second memory die to be subsequently attached to the first memory die 900A, and optionally memory stack structures 55 in at least one additional three-dimensional memory array of any additional memory die to be subsequently attached indirectly to the support die 700 through the first memory die 900A and the second memory die. Generally, the peripheral circuitry may be configured to control memory stack structures in N memory dies to be subsequently attached thereto, in which N is an integer greater than 1.

The peripheral circuitry may include a word line driver that drives word lines of the three-dimensional memory array (comprising the electrically conductive layers (146, 246)) within each attached memory die 900, a bit line driver that drives the bit lines 98 within each attached memory die 900, a word line decoder circuit that decodes the addresses for the electrically conductive layers (146, 246) within each attached memory die 900, a bit line decoder circuit that decodes the addresses for the bit lines 98 within each attached memory die 900, a sense amplifier circuit that senses the states of memory elements within the memory stack structures 55 within each attached memory die 900, a source power supply circuit that provides power to the source semiconductor layer 10 within each attached memory die 900, a data buffer and/or latch, or any other semiconductor circuit that may be used to operate the array of memory stack structures 55 within each attached memory die 900.

In one embodiment, the interconnect-side bonding pads 988 of the first memory die 900A (which is an instance of a memory die 900) may be bonded to the support-die bonding pads 788 of the support die 700. Metal-to-metal bonding may be used to bond the interconnect-side bonding pads 988 of the first memory die 900A to the support-die bonding pads 788 of the support die 700.

In an alternative embodiment, a sacrificial handle substrate (not shown) may be attached to the first memory die 900A on the side including the interconnect-side bonding pads 988. The carrier substrate layer 909 of the first memory die 900A may be removed to physically expose a bottom surface of the array-side dielectric material layer 910. Array-side connection via structures 684 and the array-side bonding pads 688 may be formed through the array-side dielectric material layer 910 on the bottom surfaces of the first through-memory-level via structures 488, the second through-memory-level via structures 588, and the source semiconductor layer 10. The array-side bonding pads 688 may be formed in an image pattern of the pattern of the support-die bonding pads 788 of the support die 700, and the array-side bonding pads 688 of the first memory die 900A may be bonded to the support-die bonding pads 788 of the support die 700 using metal-to-metal bonding. The sacrificial handle substrate may be subsequently detached from the first memory die 900A. While the present disclosure is described primarily using an embodiment in which the interconnect-side bonding pads 988 of the first memory die 900A are bonded to the support-die bonding pads 788 of the support die 700, embodiment are expressly contemplated herein in which the array-side bonding pads 688 of the first memory die 900A are bonded to the support-die bonding pads 788 of the support die 700.

The bonding pads of the first memory die 900A that are bonded to the support-die bonding pads 788 of the support die 700 are herein referred to as first-die proximal bonding pads. The first-die proximal bonding pads may be the interconnect-side bonding pads 988 of the first memory die 900A or the array-side bonding pads 688 of the first memory die 900A.

Figure 30A:
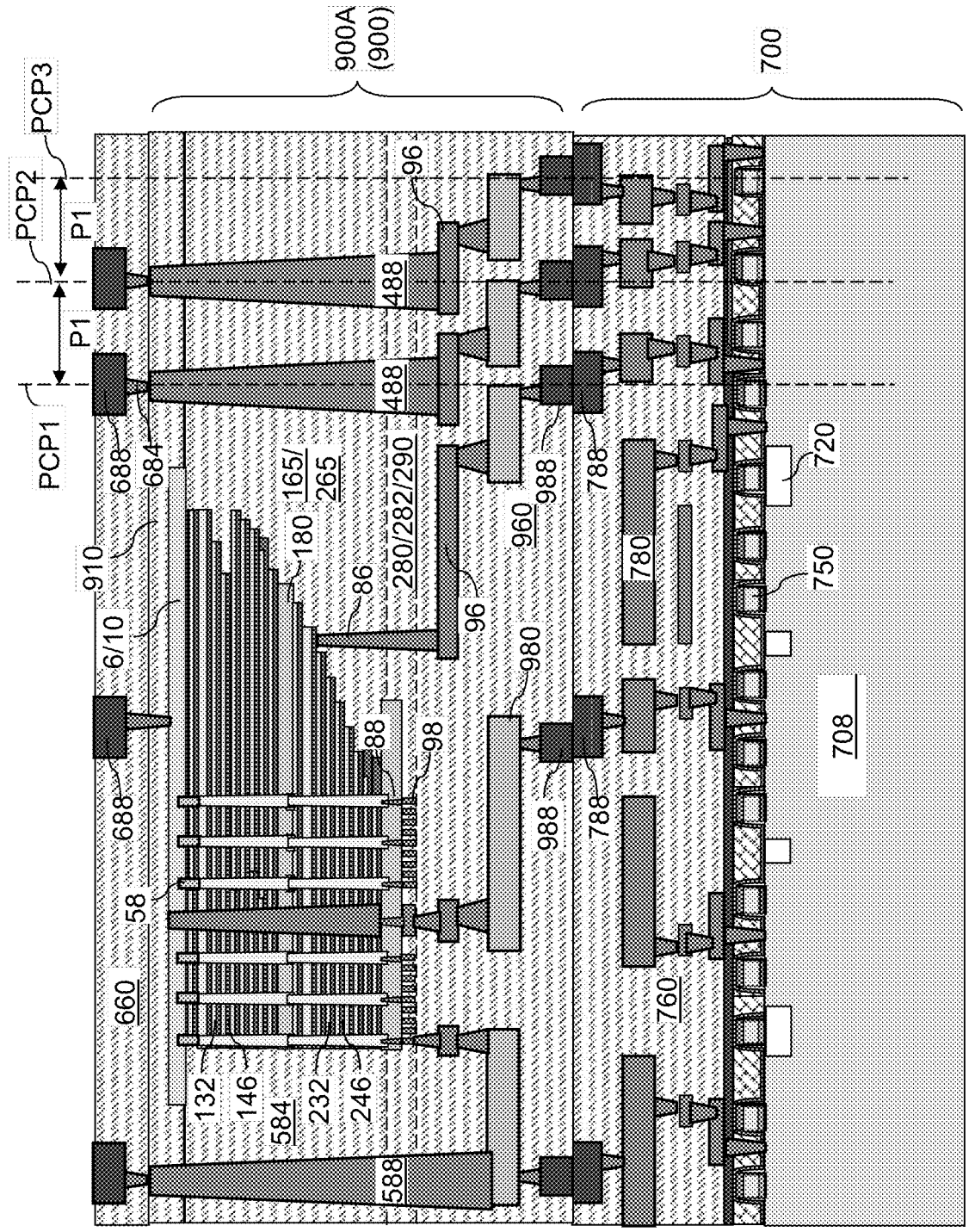
FIG. 30A is a vertical cross-sectional view of the second exemplary bonded structure after removal of a bulk substrate layer from the first memory die and formation of first-die distal bonding pads according to an embodiment of the present disclosure.
Figure 30B:
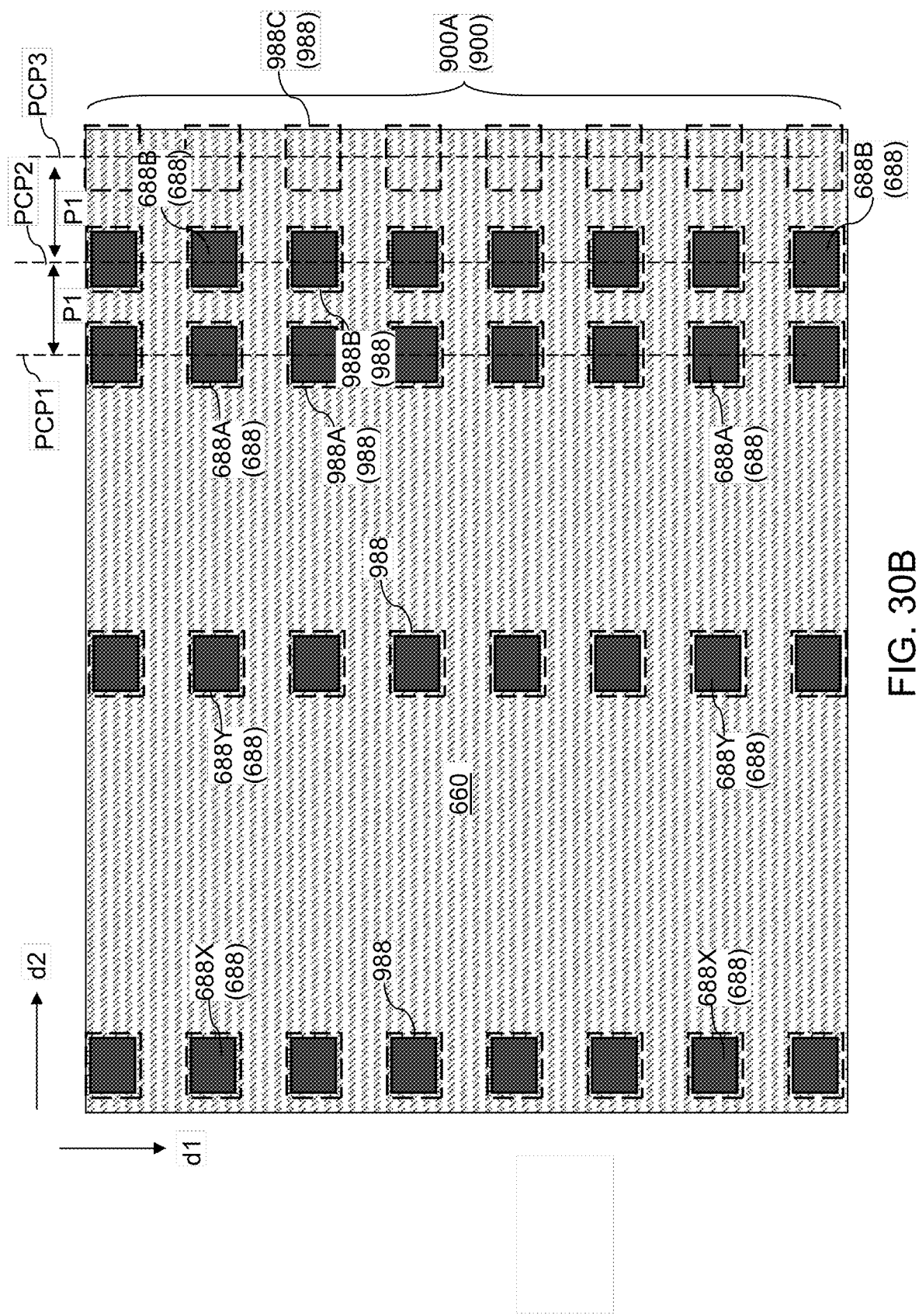
FIG. 30B is a top-down view of the second exemplary bonded structure of FIG. 30A.

Referring to FIGS. 30A and 30B, in case the interconnect-side bonding pads 988 of the first memory die 900A are bonded to the support-die bonding pads 788 of the support die 700, the carrier substrate 908 of the first memory die 900A may be removed from the second exemplary bonded assembly (700, 900A). In an illustrative example, a combination of a grinding process and a touch-up wet etch process may be used to remove the carrier substrate 908. The grinding process may remove a predominant portion of the carrier substrate 908, and the touch-up wet etch process may apply a chemical that removes the material of the carrier substrate layer 909 selective to the material of the array-side dielectric material layer 910. For example, if the carrier substrate layer 909 includes silicon, a wet etch process using a KOH solution may be used to remove the carrier substrate layer 909 selective to the material of the array-side dielectric material layer 910.

A pad-level dielectric material layer 660 may be optionally deposited on the array-side dielectric material layer 910. Array-side connection via structures 684 may be formed through the array-side dielectric material layer 910 and the pad-level dielectric material layer 660 (if used) on a respective array-side end surfaces of the first through-memory-level via structure 488 and the second through-memory-level via structure 588. Array-side bonding pads 688 may be formed directly on a respective one of the array-side connection via structures 684. The array-side connection via structures 684 and the array-side bonding pads 688 may be formed using two single damascene processes or using a dual damascene process. For example, via cavities may be formed through the array-side dielectric material layer 910, and line cavities may be formed with areal overlaps with the via cavities and with a lesser depth before, or after, formation of the via cavities to provide integrated line and via cavities. At least one conductive liner material (such as an underbump metallurgy (UBM) stack) and a metallic bonding material (such as copper) may be sequentially deposited in the integrated line and via cavities to form combinations of an array-side connection via structure 684 and an array-side bonding pad 688.

According to an embodiment of the present disclosure, the pattern of the array-side bonding pads 688 may be formed as a mirror image pattern of the interconnect-side bonding pads 988. Thus, the areas of the array-side bonding pads 688 may overlap with the areas of the interconnect-side bonding pads 988 in a plan view. The array-side bonding pads 688 are physically exposed one the side of the first memory die 900A.

The bonding pads of the first memory die 900A that are located on the physically exposed side of the first memory die 900A (i.e., on the opposite side of the first-die proximal bonding pads) are herein referred to as first-die distal bonding pads. In case the interconnect-side bonding pads 988 of the first memory die 900A are the first-die proximal bonding pads, the array-side bonding pads 688 of the first memory die 900A are first-die distal bonding pads, and vice versa.

The first-die distal bonding pads (such as the array-side bonding pads 688 of the first memory die 900A) may be formed in a mirror image pattern of the pattern of the first-die proximal boding pads (such as the interconnect-side bonding pads 988). The first-die distal bonding pads (such as the array-side bonding pads 688) may include multiple rows of first-die distal bonding pads formed on a physically exposed surface of a remaining portion of the first memory die 900A after bonding the first memory die 900A with the support die 700.

In one embodiment, the array-side bonding pads 688 may include in-array array-side bonding pads (688A, 688B) that are arranged as rows of bonding pads having a uniform inter-row pitch P1 throughout, straight-connection array-side bonding pads 688X that are electrically connected to, and has an areal overlap in a plan view with, a respective one of the second through-memory-level via structure 488, and detoured-connection array-side bonding pads 688Y that are electrically connected to, but is laterally shifted from, a respective one of the second through-memory-level via structures 588 or a respective one of the first through-memory-level via structures 488.

The in-array array-side bonding pads (688A, 688B) may be arranged as a periodic two-dimensional array of bonding pads, and may include first-row array-side bonding pads 688A that are most proximal to a memory array region 100, second-row array-side bonding pads 688B that are laterally shifted from the first-row array-side bonding pads 688A by the inter-row pitch P1 away from the memory array region 100, and so on.

Generally, the first memory die 900A comprises multiple rows of first-die proximal bonding pads (such as the interconnect-side bonding pads 988) extending along a first direction d1 (for example, with an intra-row pitch P2) and spaced apart along a second direction d2 (for example, by the inter-row pitch P1) and bonded to the support die 700 at a first bonding interface plane (i.e., a horizontal plane including interfaces between the support-die bonding pads 788 and the interconnect-side bonding pads 988); multiple rows of first-die distal bonding pads (such as the array-side bonding pads 688) extending along the first direction d1 (for example, with an intra-row pitch P2) and spaced apart along the second direction d2 (for example, by the inter-row pitch P1), and a plurality of first-die laterally-shifting electrically conductive paths (684, 488, 96, 980) connecting a respective one of the first-die proximal bonding pads and a respective one of the first-die distal bonding pads that is laterally offset from the respective one of the first-die proximal bonding pads along the second direction d2, for example, by the inter-row pitch P1.

Figure 31:
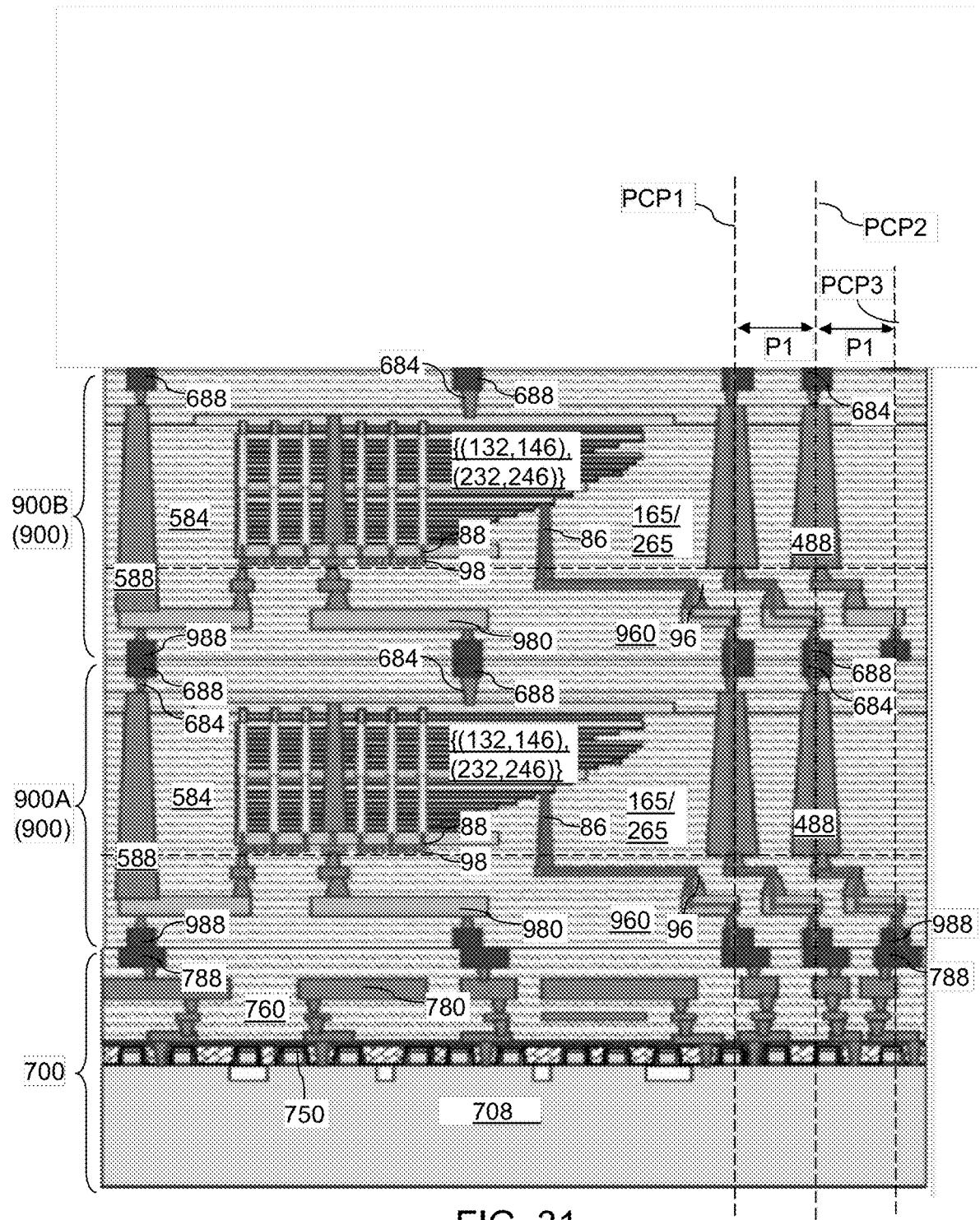
FIG. 31 is a vertical cross-sectional view of the second exemplary bonded structure after bonding a second memory die to the first memory die, removing a bulk substrate layer of the second memory die, and forming second-die distal bonding pads according to an embodiment of the present disclosure.

Referring to FIG. 31, a second memory die 900B is provided, which can have an identical structure as the first memory die 900A illustrated in FIG. 29. The second memory die 900B can be bonded to the first memory die 900A such that the orientation of the second memory die 900B as bonded to the first memory die 900A is the same as the orientation of the first memory die 900A. In other words, if the first memory die 900A is bonded to the support die 700 upside down, the second memory die 900B is bonded to the first memory die 900A upside down. If the first memory die 900A is bonded to the support die 700 upright, the second memory die 900B is bonded to the first memory die 900A upright. For example, if the first-die interconnect-side bonding pads 988 of the first memory die 900A are bonded to the support-die bonding pads 788 of the support die 700, the second-die interconnect-side bonding pads 988 of the second memory die 900B are bonded to the first-die array-side bonding pads 688 of the first memory die 900A. If the first-die array-side bonding pads 688 of the first memory die 900A are bonded to the support-die bonding pads 788 of the support die 700, the second-die array-side bonding pads 688 of the second memory die 900B are bonded to the first-die interconnect-side bonding pads 988 of the first memory die 900A.

In case the second-die interconnect-side bonding pads 988 of the second memory die 900B are bonded to the first-die array-side bonding pads 688 of the first memory die 900A, the carrier substrate 908 of the second memory die 900B may be removed from the second exemplary bonded assembly (700, 900A, 900B).

Array-side connection via structures 684 may be formed through the array-side dielectric material layer 910 of the second memory die 900B on a respective array-side end surfaces of the first through-memory-level via structure 488 and the second through-memory-level via structure 588. Array-side bonding pads 688 may be formed directly on a respective one of the array-side connection via structures 684. The array-side connection via structures 684 and the array-side bonding pads 688 may be formed using two single damascene processes or using a dual damascene process. For example, via cavities may be formed through the array-side dielectric material layer 910, and line cavities may be formed with areal overlaps with the via cavities and with a lesser depth before, or after, formation of the via cavities to provide integrated line and via cavities. At least one conductive liner material (such as an underbump metallurgy (UBM) stack) and a metallic bonding material (such as copper) may be sequentially deposited in the integrated line and via cavities to form combinations of an array-side connection via structure 684 and an array-side bonding pad 688.

According to an embodiment of the present disclosure, the pattern of the array-side bonding pads 688 of the second memory die 900B may be the same as the pattern of the array-side bonding pads of the first memory die 900A. The pattern of the array-side bonding pads 688 of the second memory die 900B may be the mirror image pattern of the interconnect-side bonding pads 988 of the second memory die 900B (which may be identical to the pattern of the interconnect-side bonding pads 988 of the first memory die 900A). Thus, the areas of the array-side bonding pads 688 of the second memory die 900B may overlap with the areas of the interconnect-side bonding pads 988 of the second memory die 900B in a plan view.

According to an embodiment, the second memory die 900B and the first memory die 900A may have an identical size, an identical layout, and an identical spatial orientation after bonding the second memory die 900B to the first memory die 900A. The edges (sidewall surfaces) of the second memory die 900B may be aligned to the edges of the first memory die 900A. In one embodiment, each edge of the second memory die 900B may be within a respective flat plane (that is perpendicular to interfaces between adjoined dies) that include a respective edge of the first memory die 900A. The multiple rows of first-die distal bonding pads can have a mirror image pattern of the multiple rows of first-die proximal bonding pads, and the multiple rows of first-die distal bonding pads may have an areal overlap with each of the multiple rows of first-die proximal bonding pads in a plan view along a direction perpendicular to an interface between the first memory die 900A and the second memory die 900B. The multiple rows of second-die distal bonding pads may have a mirror image pattern of the multiple rows of second-die proximal bonding pads, and the multiple rows of second-die distal bonding pads can have an areal overlap with each of the multiple rows of second-die proximal bonding pads in a plan view along a direction perpendicular to the interface between the first memory die 900A and the second memory die 900B.

Figure 32:
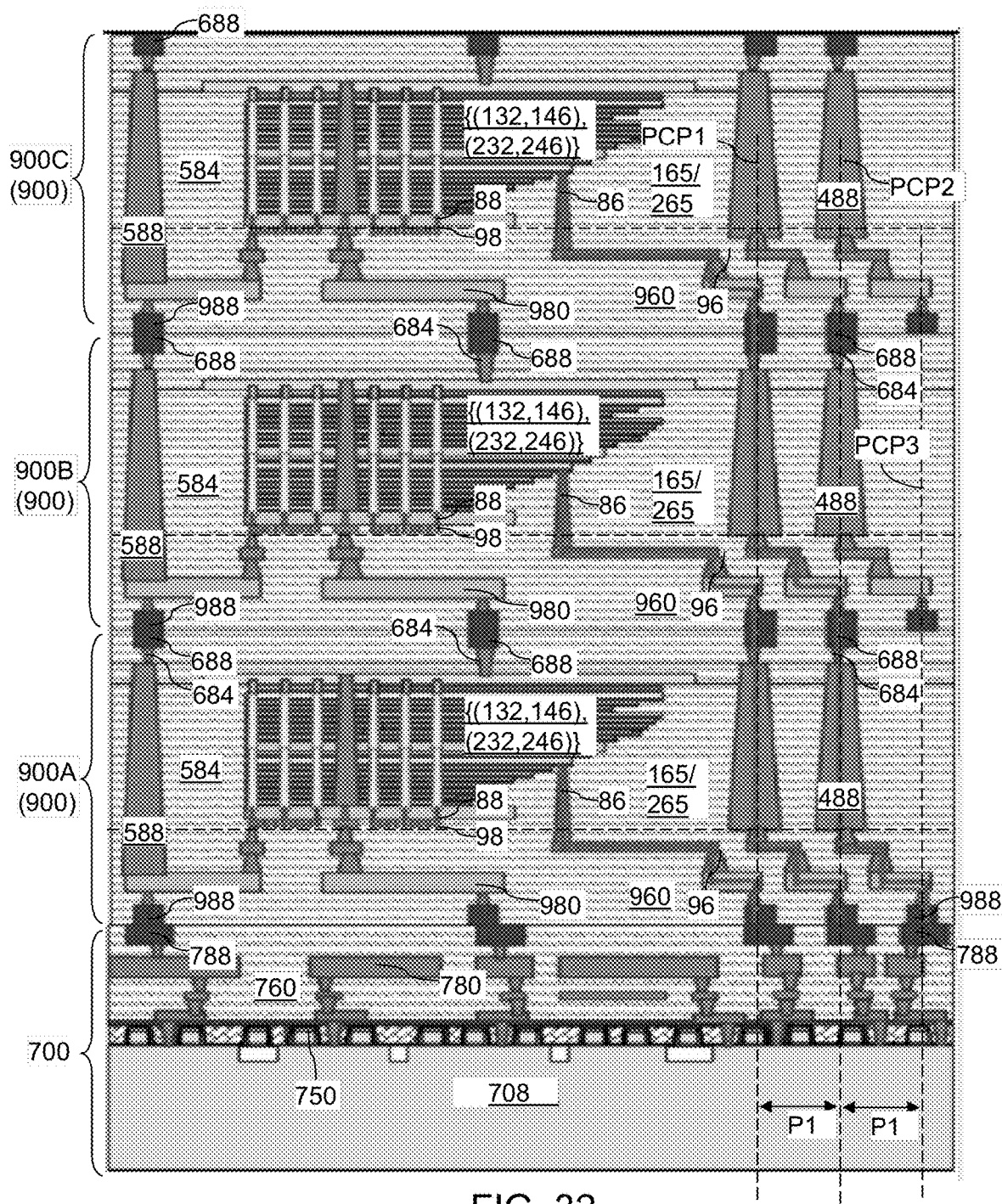
FIG. 32 is a vertical cross-sectional view of the second exemplary bonded structure after bonding a third memory die to the second memory die, removing a bulk substrate layer of the third memory die, and forming third-die distal bonding pads according to an embodiment of the present disclosure.
Figure 33:
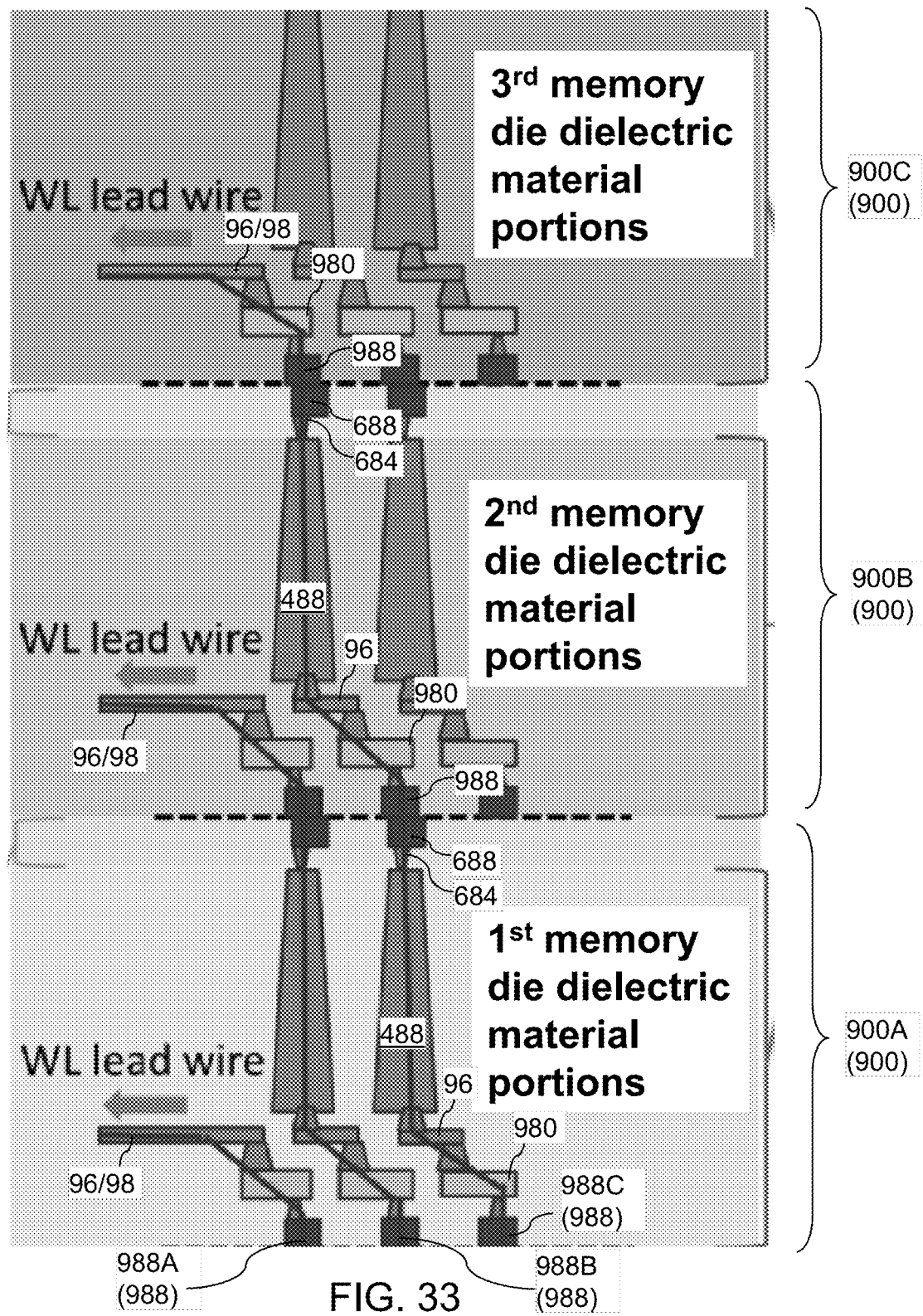
FIG. 33 is a schematic vertical cross-sectional view of a portion of the second exemplary bonded structure of FIG. 32 that illustrates lateral shifting of electrical connections in the second exemplary bonded structure.

Referring to FIGS. 32 and 33, the processing steps of FIG. 32 may be optionally repeated once or more times with another instance of the memory die 900, which can include a third memory die 900C, and optionally a fourth memory die (not shown), etc. The peripheral circuitry of the support die 700 may be configured to control two or more three-dimensional arrays of memory elements provided in a respective memory die, for example, by selecting electrical connections between a set of switches and a respective row of support-die bonding pads 799 that mate with the in-array interconnect-side bonding pads (988A, 988B, 988C).

FIG. 33 illustrates a die selection scheme in a configuration in which the different rows of support-die bonding pads 788 that mate with the in-array interconnect-side bonding pads (988A, 988B, 988C) are configured to provide electrical connections to different word lines (which may comprise the electrically conductive layers (142, 242) that are provided within a respective memory die 900A). When the switches in the support die 700 connects the word line drivers of the peripheral circuitry to the row of support-die bonding pads 788 that maters with the first-row interconnect-side bonding pads 988A, the word lines in the first memory die 900A are connected to the word line drivers of the peripheral circuitry. When the switches in the support die 700 connects the word line drivers of the peripheral circuitry to the row of support-die bonding pads 788 that maters with the second-row interconnect-side bonding pads 988B, the word lines in the second memory die 900B are connected to the word line drivers of the peripheral circuitry. When the switches in the support die 700 connects the word line drivers of the peripheral circuitry to the row of support-die bonding pads 788 that maters with the third-row interconnect-side bonding pads 988C, the word lines in the third memory die 900C are connected to the word line drivers of the peripheral circuitry, and so on. Thus, multiple instances of a memory die 900A having identical structures can be sequentially bonded to the support die 700 without shifting positions of a memory die relative to an underlying memory die, and without any custom-tailored modification in the metal line routing of the memory dies or use of any different lithographic mask set during manufacture of the memory dies 900. In other words, all of the memory dies 900 may be identical in size, design, and manufacture.

Referring to all drawings and according to various embodiments of the present disclosure, a bonded assembly is provided, which comprises: a first memory die 900A comprising a first three-dimensional memory device; a second memory die 900B comprising a second three-dimensional memory device; and a support die 700 bonded to the first memory die 900A and comprising a peripheral circuitry configured to control the first three-dimensional memory device and the second three-dimensional memory device and comprising multiple rows of support-die bonding pads 788, wherein the first memory die 900A comprises: multiple rows of first-die proximal bonding pads (such as the first-die interconnect-side bonding pads 988) extending along a first direction d1 and spaced apart along a second direction d2 and bonded to the support die 700 at a first bonding interface plane; multiple rows of first-die distal bonding pads (such as first-die array-side bonding pads 688) extending along the first direction d1 and spaced apart along the second direction d2 and bonded to the second memory die 900B at a second bonding interface plane; and a plurality of first-die laterally-shifting electrically conductive paths (684, 488, 96, 980) connecting a respective one of the first-die proximal bonding pads (such as one of the second-row interconnect-side bonding pads 988B and the third-row interconnect-side bonding pads 988C) and a respective one of the first-die distal bonding pads (such as first-die array-side bonding pads 688) that is laterally offset from the respective one of the first-die proximal bonding pads along the second direction d2 (for example, by an intra-row pitch P1 or by integer multiples of the intra-row pitch P1).

In one embodiment, the multiple rows of the first-die proximal bonding pads are spaced apart along the second direction d2 with a uniform inter-row pitch P1; the multiple rows of the first-die distal bonding pads are spaced apart along the second direction d2 with the uniform inter-row pitch P1; and the respective one of the first-die distal bonding pads is laterally offset from the respective one of the first-die proximal bonding pads along the second direction d2 by the uniform inter-row pitch P1 for each of the plurality of first-die laterally-shifting electrically conductive paths (684, 488, 96, 980).

In one embodiment, the plurality of first-die laterally-shifting electrically conductive paths (684, 488, 96, 980) comprises at least two rows of first-die electrically conductive paths (684, 488, 96, 980); each row of first-die laterally-shifting electrically conductive paths (684, 488, 96, 980) may be arranged along the first direction d1; and each neighboring pair of rows selected from the at least two rows may be spaced apart by the uniform inter-row pitch P1 or integer multiples thereof.

In one embodiment, first-die proximal bonding pads within each row of the first-die proximal bonding pads are spaced apart along the first direction d1 with a uniform intra-row pitch P2; and first-die distal bonding pads within each of the first-die distal bonding pads are spaced apart along the second direction d2 with the uniform intra-row pitch P2.

In one embodiment, the second memory die 900B comprises: multiple rows of second-die proximal bonding pads extending along the first direction d1 and spaced apart along the second direction d2 with the uniform inter-row pitch P1 and bonded to the first-die distal bonding pads at the second bonding interface plane; multiple rows of second-die distal bonding pads extending along the first direction d1 and spaced apart along the second direction d2 with the uniform inter-row pitch P1; and a plurality of second-die laterally-shifting electrically conductive paths (684, 488, 96, 980) connecting a respective one of the second-die proximal bonding pads and a respective one of the second-die distal bonding pads that may be laterally offset from the respective one of the second-die proximal bonding pads along the second direction d2 by the uniform inter-row pitch P1 or integer multiples thereof.

In one embodiment, the first memory die 900A comprises: additional first-die proximal bonding pads (such as the straight-connection interconnect-side bonding pads 988X) bonded to additional support die bonding pads 788 at the first bonding interface plane; additional first-die distal bonding pads bonded to the second memory die 900B at the second bonding interface plane; and first-die straight electrically conductive paths (684, 488, 96, 980) connecting a respective one of the additional first-die proximal bonding pads and a respective one of the additional first-die distal bonding pads that has an areal overlap with the respective one of the additional first-die proximal bonding pads in a plan view that is perpendicular to the first bonding interface plane.

In one embodiment, each pad center plane (such as PCP1, PCP2, PCP3) passing through geometrical centers of a respective row of first-die distal bonding pads and perpendicular to the first bonding interface plane passes through geometrical centers of a row of first-die proximal bonding pads. In one embodiment, a first pad center plane PCP1 passing through geometrical centers in a first row of the first-die proximal bonding pads (such as the first-row interconnect-side bonding pads 988A) and perpendicular to the first bonding interface plane passes through geometrical centers in a first row of the first-die distal bonding pads (such as a first row of array-side bonding pads 688 of the first memory die 900A); a second pad center plane PCP2 passing through geometrical centers in a second row of the first-side distal bonding pads (such as the second-row interconnect-side bonding pads 988B) and perpendicular to the first bonding interface plane passes through geometrical centers in a second row of the first-die distal bonding pads (such as a second row of array-side bonding pads 688 of the first memory die 900A); and the second pad center plane PCP2 is laterally offset from the first pad center plane PCP1 by the uniform inter-row pitch P1.

In one embodiment, the first-die proximal bonding pads are arranged in a first rectangular array; and the first-die distal bonding pads are arranged in a second rectangular array having a same inter-row pitch P1 and a same intra-row pitch P2 as the first-die proximal bonding pads. In one embodiment, each of the first-die distal bonding pads has an areal overlap with a respective one of the first-die proximal bonding pads in a plan view along a direction perpendicular to the first bonding interface plane; and the second rectangular array comprises a lesser number of rows than a total number of rows in the first rectangular array.

In one embodiment, the second memory die 900B and the first memory die 900A have an identical size, an identical layout, and an identical spatial orientation; and each edge of the second memory die 900B is within a respective flat plane (i.e., a Euclidean plane) that include a respective edge of the first memory die 900A.

In one embodiment, the first three-dimensional memory device comprises a first-die alternating stack of first-die insulating layers (132, 232) and first-die electrically conductive layers (142, 242) and first-die memory stack structures 55 extending through the first-die alternating stack; and the second three-dimensional memory device comprises a second-die alternating stack of second-die insulating layers (132, 232) and second-die electrically conductive layers (146, 246) and second-die memory stack structures 55 extending through the second-die alternating stack.

In one embodiment, the first-die electrically conductive layers (146, 246) comprise word lines for the first three-dimensional memory device; the second-die electrically conductive layers (146, 246) comprise word lines for the second three-dimensional memory device; and one of the plurality of first-die laterally-shifting electrically conductive paths (684, 488, 96, 980) is electrically connected to one of the second-die electrically conductive layers (146, 246).

In one embodiment, the-support die bonding pads 788 comprise: first support-die bonding pads 788 bonded to a first row of the first-die proximal bonding pads (such as the first-row interconnect-side bonding pads 988A) selected from the multiple rows of the first-die proximal bonding pads and electrically connected to a respective one of the first-die electrically conductive layers (146, 246); and second support-die bonding pads 788 bonded to a second row of the first-die proximal bonding pads (such as the second-row interconnect-side bonding pads 988B) selected from the multiple rows of the first-die proximal bonding pads and electrically connected to a respective one of the second-die electrically conductive layers (146, 246).

In one embodiment, the bonded assembly comprises a third memory die 900C comprising a third three-dimensional memory device including a third-die alternating stack of third-die insulating layers (146, 246) and third-die electrically conductive layers (146, 246) and third-die memory stack structures 55 extending through the third-die alternating stack, wherein the-support die bonding pads 788 comprise third support-die bonding pads 788 bonded to a third row of the first-die proximal bonding pads (such as the third-row interconnect-side bonding pads 988C) selected from the multiple rows of the first-die proximal bonding pads and electrically connected to a respective one of the third-die electrically conductive layers (146, 246).

In one embodiment, each of the plurality of first-die laterally-shifting electrically conductive paths (684, 488, 96, 980) comprises at least two metal via structures (684, 488, 980) and at least one metal line structure (96, 980) that collectively extend between the respective one of the first-die proximal bonding pads and the respective one of the first-die distal bonding pads through the first memory die.

The bonded assembly can include a set of electrically floating conductive paths. An electrically floating conductive path may include a single laterally-shifting electrically conductive path (684, 488, 96, 980) located inside a single memory die (such as a third memory die 900C), and may include a series connection of at least two laterally-shifting electrically conductive path (684, 488, 96, 980) located within at least two memory dies (such as a second memory die 900B and a third memory die 900C) and connected to one another via at least one bonded pair of bonding pads (688, 988).

The various embodiments of the present disclosure may be used to form a bonded assembly including multiple memory dies 900 having an identical structure and sharing a support die bonded to one of the multiple memory dies 900. No additional processes are needed for each additional memory die. Thus, production may be significantly simplified. All memory dies 900 may have an identical layout, an identical design, and an identical manufacturing process. By sharing of a support die 700 with plural memory dies 900 without any differentiation of the memory die structure, manufacturing cost for the bonded assembly can be reduced.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded assembly comprising:
   a first memory die comprising a first three-dimensional memory device;
   a second memory die comprising a second three-dimensional memory device; and
   a support die bonded to the first memory die and comprising a peripheral circuitry configured to control the first three-dimensional memory device and the second three-dimensional memory device and comprising multiple rows of support-die bonding pads,
   wherein the first memory die comprises:
      multiple rows of first-die proximal bonding pads extending along a first direction and spaced apart along a second direction and bonded to the support die at a first bonding interface plane;
      multiple rows of first-die distal bonding pads extending along the first direction and spaced apart along the second direction and bonded to the second memory die at a second bonding interface plane; and
      a plurality of first-die laterally-shifting electrically conductive paths connecting a respective one of the first-die proximal bonding pads and a respective one of the first-die distal bonding pads that is laterally offset from the respective one of the first-die proximal bonding pads along the second direction; and
   wherein:
   the multiple rows of the first-die proximal bonding pads are spaced apart along the second direction with a uniform inter-row pitch;
   the multiple rows of the first-die distal bonding pads are spaced apart along the second direction with the uniform inter-row pitch; and
      the respective one of the first-die distal bonding pads is laterally offset from the respective one of the first-die proximal bonding pads along the second direction by the uniform inter-row pitch or integer multiples thereof for each of the plurality of first-die laterally-shifting electrically conductive paths.

2. The bonded assembly of claim 1, wherein:
   the plurality of first-die laterally-shifting electrically conductive paths comprises at least two rows of first-die electrically conductive paths;
   each row of first-die laterally-shifting electrically conductive paths is arranged along the first direction; and
   each neighboring pair of rows selected from the at least two rows is spaced apart by the uniform inter-row pitch.

3. The bonded assembly of claim 1, wherein:
   first-die proximal bonding pads within each row of the first-die proximal bonding pads are spaced apart along the first direction with a uniform intra-row pitch; and
   first-die distal bonding pads within each of the first-die distal bonding pads are spaced apart along the second direction with the uniform intra-row pitch.

4. The bonded assembly of claim 1, wherein the second memory die comprises:
   multiple rows of second-die proximal bonding pads extending along the first direction and spaced apart along the second direction with the uniform inter-row pitch and bonded to the first-die distal bonding pads at the second bonding interface plane;
   multiple rows of second-die distal bonding pads extending along the first direction and spaced apart along the second direction with the uniform inter-row pitch; and
   a plurality of second-die laterally-shifting electrically conductive paths connecting a respective one of the second-die proximal bonding pads and a respective one of the second-die distal bonding pads that is laterally offset from the respective one of the second-die proximal bonding pads along the second direction by the uniform inter-row pitch or integer multiples thereof.

5. The bonded assembly of claim 1, wherein the first memory die comprises:
   additional first-die proximal bonding pads bonded to additional support die bonding pads at the first bonding interface plane;
   additional first-die distal bonding pads bonded to the second memory die at the second bonding interface plane; and
   first-die straight electrically conductive paths connecting a respective one of the additional first-die proximal bonding pads and a respective one of the additional first-die distal bonding pads that has an areal overlap with the respective one of the additional first-die proximal bonding pads in a plan view that is perpendicular to the first bonding interface plane.

6. The bonded assembly of claim 1, wherein each pad center plane passing through geometrical centers of a respective row of first-die distal bonding pads and perpendicular to the first bonding interface plane passes through geometrical centers of a row of first-die proximal bonding pads.

7. The bonded assembly of claim 6, wherein:
a first pad center plane passing through geometrical centers in a first row of the first-die proximal bonding pads and perpendicular to the first bonding interface plane passes through geometrical centers in a first row of the first-die distal bonding pads;
a second pad center plane passing through geometrical centers in a second row of the first-side distal bonding pads and perpendicular to the first bonding interface plane passes through geometrical centers in a second row of the first-die distal bonding pads; and
the second pad center plane is laterally offset from the first pad center plane by the uniform inter-row pitch.

8. The bonded assembly of claim 1, wherein:
the first-die proximal bonding pads are arranged in a first rectangular array; and
the first-die distal bonding pads are arranged in a second rectangular array having a same inter-row pitch and a same intra-row pitch as the first-die proximal bonding pads.

9. The bonded assembly of claim 8, wherein:
each of the first-die distal bonding pads has an areal overlap with a respective one of the first-die proximal bonding pads in a plan view along a direction perpendicular to the first bonding interface plane; and
the second rectangular array comprises a lesser number of rows than a total number of rows in the first rectangular array.

10. The bonded assembly of claim 1, wherein:
the second memory die and the first memory die have an identical size, an identical layout, and an identical spatial orientation; and
each edge of the second memory die is within a respective flat plane that include a respective edge of the first memory die.

11. The bonded assembly of claim 1, wherein:
the first three-dimensional memory device comprises a first-die alternating stack of first-die insulating layers and first-die electrically conductive layers and first-die memory stack structures extending through the first-die alternating stack; and
the second three-dimensional memory device comprises a second-die alternating stack of second-die insulating layers and second-die electrically conductive layers and second-die memory stack structures extending through the second-die alternating stack.

12. The bonded assembly of claim 11, wherein:
the first-die electrically conductive layers comprise word lines for the first three-dimensional memory device;
the second-die electrically conductive layers comprise word lines for the second three-dimensional memory device; and
one of the plurality of first-die laterally-shifting electrically conductive paths is electrically connected to one of the second-die electrically conductive layers.

13. The bonded assembly of claim 11, wherein the-support die bonding pads comprise:

first support-die bonding pads bonded to a first row of the first-die proximal bonding pads selected from the multiple rows of the first-die proximal bonding pads and electrically connected to a respective one of the first-die electrically conductive layers; and
second support-die bonding pads bonded to a second row of the first-die proximal bonding pads selected from the multiple rows of the first-die proximal bonding pads and electrically connected to a respective one of the second-die electrically conductive layers.

14. The bonded assembly of claim 13, further comprising:
a third memory die comprising:
a third three-dimensional memory device comprising:
a third-die alternating stack of third-die insulating layers and third-die electrically conductive layers; and
third-die memory stack structures extending through the third-die alternating stack, wherein the-support die bonding pads comprise third support-die bonding pads bonded to a third row of the first-die proximal bonding pads selected from the multiple rows of the first-die proximal bonding pads and electrically connected to a respective one of the third-die electrically conductive layers.

15. The bonded assembly of claim 1, wherein each of the plurality of first-die laterally-shifting electrically conductive paths comprises at least two metal via structures and at least one metal line structure that collectively extend between the respective one of the first-die proximal bonding pads and the respective one of the first-die distal bonding pads through the first memory die.

16. A bonded assembly comprising:
a first memory die comprising a first three-dimensional memory device;
a second memory die comprising a second three-dimensional memory device;
a support die bonded to the first memory die and comprising a peripheral circuitry configured to control the first three-dimensional memory device and the second three-dimensional memory device and comprising multiple rows of support-die bonding pads; and
a third memory die;
wherein the first memory die comprises:
multiple rows of first-die proximal bonding pads extending along a first direction and spaced apart along a second direction and bonded to the support die at a first bonding interface plane;
multiple rows of first-die distal bonding pads extending along the first direction and spaced apart along the second direction and bonded to the second memory die at a second bonding interface plane; and
a plurality of first-die laterally-shifting electrically conductive paths connecting a respective one of the first-die proximal bonding pads and a respective one of the first-die distal bonding pads that is laterally offset from the respective one of the first-die proximal bonding pads along the second direction;
wherein:
the first three-dimensional memory device comprises a first-die alternating stack of first-die insulating layers and first-die electrically conductive layers and first-die memory stack structures extending through the first-die alternating stack;
the second three-dimensional memory device comprises a second-die alternating stack of second-die insulating layers and second-die electrically conductive layers and second-die memory stack structures extending through the second-die alternating stack;

wherein the-support die bonding pads comprise:
- first support-die bonding pads bonded to a first row of the first-die proximal bonding pads selected from the multiple rows of the first-die proximal bonding pads and electrically connected to a respective one of the first-die electrically conductive layers; and
- second support-die bonding pads bonded to a second row of the first-die proximal bonding pads selected from the multiple rows of the first-die proximal bonding pads and electrically connected to a respective one of the second-die electrically conductive layers; and wherein the third memory die comprises a third three-dimensional memory device comprising:
- a third-die alternating stack of third-die insulating layers and third-die electrically conductive layers; and
- third-die memory stack structures extending through the third-die alternating stack, wherein the-support die bonding pads comprise third support-die bonding pads bonded to a third row of the first-die proximal bonding pads selected from the multiple rows of the first-die proximal bonding pads and electrically connected to a respective one of the third-die electrically conductive layers.

\* \* \* \* \*